United States Patent
Stanley et al.

(10) Patent No.: US 11,125,255 B1
(45) Date of Patent: Sep. 21, 2021

(54) COMPLEMENTARY FLUIDIC VALVES, LOGIC GATES, AND LATCHES

(71) Applicant: Facebook Technologies, LLC, Menlo Park, CA (US)

(72) Inventors: Andrew Arthur Stanley, Seattle, WA (US); Erik Roby, Redmond, WA (US); Casey Glick, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 182 days.

(21) Appl. No.: 16/408,413

(22) Filed: May 9, 2019

(51) Int. Cl.
| | |
|---|---|
| *F15C 1/10* | (2006.01) |
| *F15C 3/00* | (2006.01) |
| *F16K 99/00* | (2006.01) |
| *H03K 19/21* | (2006.01) |
| *F16K 1/12* | (2006.01) |

(Continued)

(52) U.S. Cl.
CPC ............ *F15C 3/00* (2013.01); *F16K 99/0055* (2013.01); *F16K 1/126* (2013.01); *F16K 31/1223* (2013.01); *F16K 31/363* (2013.01); *H03K 19/21* (2013.01)

(58) Field of Classification Search
CPC .. F16K 31/1223; F16K 31/363; F16K 31/383; F16K 11/07; F16K 99/0055; F16K 99/0059; F16K 2099/0069; F16K 2099/009; F16K 1/126; F15C 3/00; G05D 7/0193; G05D 7/00
USPC .... 137/837, 488, 538, 625.2, 625.6, 625.26, 137/625.49, 627.5, 596.14, 885, 489.5, 137/565.19, 596.18, 115.07, 602, 599.03
See application file for complete search history.

(56) References Cited

U.S. PATENT DOCUMENTS

| | | | |
|---|---|---|---|
| 3,070,295 | A | 12/1962 | Glättli |
| 3,122,313 | A | 2/1964 | Glättli |

(Continued)

FOREIGN PATENT DOCUMENTS

| | | | | |
|---|---|---|---|---|
| CH | 376688 A | 4/1964 | | |
| DE | 102012013594 A1 * | 1/2014 | ............. | F16K 11/07 |

(Continued)

OTHER PUBLICATIONS

Telepneumatic, "Pneumatic Logic & Controls", URL: https://www.parker.com/literature/Literature%20Files/pneumatic/Literature/Telepneumatic/PCC-4.pdf, Jun. 30, 2017, 104 pages.

(Continued)

*Primary Examiner* — Minh Q Le
(74) *Attorney, Agent, or Firm* — FisherBroyles, LLP

(57) ABSTRACT

A fluidic device may include inlet ports, input ports, one or more output ports, fluid channels each configured to route fluid from one of the inlet ports to one of the one or more output ports, and pistons. In some examples, each piston may include (1) a restricting gate transmission element configured to block, when the piston is in a first position, and unblock, when the piston is in a second position, one of the fluid channels, (2) a controlling gate transmission element configured to interface with a first control pressure that, when applied to the controlling gate transmission element, forces the piston towards the first position, and (3) an additional controlling gate transmission element configured to interface with a second control pressure that, when applied to the additional controlling gate transmission element, forces the piston towards the second position. Various other related devices and systems are also disclosed.

20 Claims, 48 Drawing Sheets

(51) Int. Cl.
*F16K 31/363* (2006.01)
*F16K 31/122* (2006.01)

(56) References Cited

U.S. PATENT DOCUMENTS

| | | | | |
|---|---|---|---|---|
| 3,319,654 | A | * | 5/1967 | Faldi ........................ F01B 25/02 |
| | | | | 137/624.13 |
| 3,402,737 | A | * | 9/1968 | Goldstein ................. F15B 9/16 |
| | | | | 137/596.14 |
| 3,447,566 | A | | 6/1969 | Hayner et al. |
| 3,596,560 | A | | 8/1971 | Butterworth |
| 3,605,811 | A | | 9/1971 | Lovell |
| 3,805,840 | A | * | 4/1974 | Byers, Jr. ................ F16K 11/14 |
| | | | | 137/627.5 |
| 4,026,193 | A | | 5/1977 | Olmsted |
| 4,204,458 | A | | 5/1980 | Kononov et al. |
| 4,226,543 | A | | 10/1980 | Schlüter |
| 4,630,645 | A | | 12/1986 | Spa |
| 5,492,149 | A | * | 2/1996 | Loschelder ......... F16K 11/0716 |
| | | | | 137/625.4 |
| 6,237,635 | B1 | | 5/2001 | Nambu |
| 9,611,943 | B2 | * | 4/2017 | Chen ....................... F16K 11/02 |
| 2005/0012058 | A1 | | 1/2005 | Medina |
| 2007/0075286 | A1 | | 4/2007 | Tanner |
| 2019/0145542 | A1 | | 5/2019 | Rehhoff et al. |
| 2019/0249789 | A1 | | 8/2019 | John et al. |
| 2021/0010495 | A1 | | 1/2021 | Stanley et al. |

FOREIGN PATENT DOCUMENTS

| | | |
|---|---|---|
| GB | 878697 A | 10/1961 |
| GB | 1 217 496 A | 12/1970 |
| WO | 2021/007220 A1 | 1/2021 |

OTHER PUBLICATIONS

Non-Final Office Action received for U.S. Appl. No. 16/451,964 dated Nov. 16, 2020, 17 pages.
International Search Report and Written Opinion received for PCT Application Serial No. PCT/US2020/041027 dated Oct. 26, 2020, 12 pages.
Stanley et al., "Complementary Fluidic Logic and Memory Devices", U.S. Appl. No. 16/507,788, filed Jul. 10, 2019, 187 pages.
Glick et al., "Complementary Fluidic Valves and Systems", U.S. Appl. No. 16/451,964, filed Jun. 25, 2019, 139 pages.
Click et al., "Complementary Fluidic Valves and Logic Gates", U.S. Appl. No. 16/408,412, filed May 9, 2019, 118 pages.
Non-Final Office Action received for U.S. Appl. No. 16/507,788 dated Jan. 15, 2021, 42 pages.
Non-Final Office Action received for U.S. Appl. No. 16/408,412 dated Jan. 6, 2021, 42 pages.

* cited by examiner

| NOR TRUTH TABLE 800 | | |
|---|---|---|
| INPUTS | | OUTPUT |
| A | B | |
| 0 | 0 | 1 |
| 0 | 1 | 0 |
| 1 | 0 | 0 |
| 1 | 1 | 0 |

*FIG. 8*

| OR TRUTH TABLE 1100 | | |
|---|---|---|
| INPUTS | | OUTPUT |
| A | B | |
| 0 | 0 | 0 |
| 0 | 1 | 1 |
| 1 | 0 | 1 |
| 1 | 1 | 1 |

*FIG. 11*

| NAND TRUTH TABLE 1500 | | |
|---|---|---|
| INPUTS | | OUTPUT |
| A | B | |
| 0 | 0 | 1 |
| 0 | 1 | 1 |
| 1 | 0 | 1 |
| 1 | 1 | 0 |

*FIG. 15*

| AND TRUTH TABLE 1800 | | |
|---|---|---|
| INPUTS | | OUTPUT |
| A | B | |
| 0 | 0 | 0 |
| 0 | 1 | 0 |
| 1 | 0 | 0 |
| 1 | 1 | 1 |

*FIG. 18*

| TRUTH TABLE 2200 | | |
|---|---|---|
| INPUTS | | OUTPUT |
| A | B | |
| 0 | 0 | 1 |
| 0 | 1 | 1 |
| 1 | 0 | 0 |
| 1 | 1 | 1 |

*FIG. 22*

| TRUTH TABLE 2500 | | |
|---|---|---|
| INPUTS | | OUTPUT |
| A | B | |
| 0 | 0 | 0 |
| 0 | 1 | 0 |
| 1 | 0 | 1 |
| 1 | 1 | 0 |

*FIG. 25*

LATCH TRUTH TABLE 3400

| INPUTS | | OUTPUT | |
|---|---|---|---|
| A | B | QA | QB |
| 0 | 0 | HOLD | HOLD |
| 0 | 1 | 1 | 0 |
| 1 | 0 | 0 | 1 |
| 1 | 1 | 0 | 0 |

*FIG. 34*

COMPLEMENTARY FLUIDIC VALVES, LOGIC GATES, AND LATCHES

BACKGROUND

Fluidic systems are small mechanical systems that involve the flow of fluids. Fluidic systems can be used in many different fields, such as biomedical, chemical, genetic, biochemical, pharmaceutical, haptics, and other fields. Fluidic systems may be made up of various composable fluidic devices that may be coupled together to form a composite fluidic system. A fluidic valve is a basic component of fluidic systems and may be used for stopping, starting, or otherwise controlling flow of a fluid in a fluidic system. Conventional fluidic valves may be actuated via fluid pressure, with a piezoelectric material, or a spring-loaded mechanism, for example.

Fluidic devices are fluid handling devices that function analogous to electronic devices. Fluidic circuits and systems are often used to perform tasks and operations typically performed by conventional electronic circuits and systems. In some fields, fluidic systems may be replacing these electronic circuits and systems. Conventional fluidic valves may be used to perform tasks and operations similar to conventional electrical transistors such as performing control functions, performing logic operations (e.g., binary logical operations), and storing or transmitting information. Accordingly, the present disclosure recognizes a need and provides solutions for improved fluidic valves and systems and methods used for controlling fluid flows and pressures in fluidic systems.

SUMMARY

As will be described in greater detail below, the instant disclosure describes complementary fluidic valves and systems that may perform a wide range of functions and logical operations. In some examples, a fluidic device may include inlet ports, input ports, one or more output ports, fluid channels each configured to route fluid from one of the inlet ports to one of the one or more output ports, and pistons. In some examples, each piston may include (1) a restricting gate transmission element configured to block, when the piston is in a first position, and unblock, when the piston is in a second position, one of the fluid channels, (2) a first controlling gate transmission element configured to interface with a first control pressure that, when applied to the first controlling gate transmission element, forces the piston towards the first position, and (3) a second controlling gate transmission element configured to interface with a second control pressure that, when applied to the second controlling gate transmission element, forces the piston towards the second position.

In some examples, the fluidic device may be a fluidic set-reset latch. In such examples, the fluidic device may also include a first normally open valve and a second normally open valve. In addition, the inlet ports may include a first inlet port, a second inlet port, a third inlet port, and a fourth inlet port. Furthermore, the input ports may include a first input port and a second input port, and the one or more output ports may include a first output port and a second output port. The fluid channels may include a first fluid channel configured to route fluid from the first inlet port to the first output port, a second fluid channel configured to route fluid from the second inlet port to the first output port, a third fluid channel configured to route fluid from the third inlet port to the second output port, and a fourth fluid channel configured to route fluid from the fourth inlet port to the second output port. The fluidic device may also include a fifth fluid channel configured to route fluid from the first output port to the second normally open valve and a sixth fluid channel configured to route fluid from the second output port to the first normally open valve.

In this example, the pistons may include a first piston and a second piston. The first piston may include (1) a first restricting gate transmission element configured to block, when the first piston is in a first position, the first fluid channel and unblock, when the piston is in a second position, the first fluid channel, (2) a second restricting gate transmission element configured to block, when the first piston is in the second position, the second fluid channel and unblock, when the first piston is in the first position, the second fluid channel, (3) a first controlling gate transmission element configured to interface with a first fluid pressure from the first input port that, when applied to the first controlling gate transmission element, forces the first piston towards the first position, and (4) a second controlling gate transmission element configured to interface with a first preload pressure that, when applied to the second controlling gate transmission element, forces the first piston towards the second position. Similarly, the second piston may include (1) a third restricting gate transmission element configured to block, when the second piston is in a third position, the third fluid channel and unblock, when the second piston is in a fourth position, the third fluid channel, (2) a fourth restricting gate transmission element configured to block, when the second piston is in the fourth position, the fourth fluid channel and unblock, when the second piston is in the third position, the fourth fluid channel, (3) a third controlling gate transmission element configured to interface with a second preload pressure that, when applied to the third controlling gate transmission element, forces the second piston towards the third position, and (4) a fourth controlling gate transmission element configured to interface with a second fluid pressure from the second input port that, when applied to the fourth controlling gate transmission element, forces the second piston towards the fourth position.

The first normally open valve may include (1) a fifth restricting gate transmission element configured to unblock, when the first normally open valve is in a fifth position, the first fluid channel and block, when the first normally open valve is in a sixth position, the first fluid channel and (2) a fifth controlling gate transmission element configured to interface with a third fluid pressure from the sixth fluid channel that, when applied to the fifth controlling gate transmission element, forces the first normally open valve towards the sixth position. Similarly, the second normally open valve may include (1) a sixth restricting gate transmission element configured to unblock, when the second normally open valve is in a seventh position, the fourth fluid channel and block, when the second normally open valve is in an eighth position, the fourth fluid channel and (2) a sixth controlling gate transmission element configured to interface with a fourth fluid pressure from the fifth fluid channel that, when applied to the sixth controlling gate transmission element, forces the second normally open valve towards the eighth position.

In other examples, the inlet ports may include a first one or more inlet ports and a second one or more inlet ports, the input ports may include a first input port and a second input port, and the fluid channels may include (1) a first fluid channel configured to route fluid from the first one or more inlet ports to the one or more output ports, (2) a second fluid channel configured to route fluid from the second one or more inlet ports to the one or more output ports, and (3) a third fluid channel configured to route fluid from the second one or more inlet ports to the one or more output ports. In addition, the pistons may include a first piston and a second piston.

In some examples, the first piston may include (1) a first restricting gate transmission element configured to block, when the first piston is in a first position, the first fluid channel, (2) a second restricting gate transmission element configured to block, when the first piston is in a second position, the second fluid channel, (3) a first controlling gate transmission element configured to interface with a first fluid pressure that, when applied to the first controlling gate transmission element, forces the first piston towards the first position, and (4) a second controlling gate transmission element configured to interface with a second fluid pressure that, when applied to the second controlling gate transmission element, forces the first piston towards the second position. Similarly, the second piston may include (1) a third restricting gate transmission element configured to block, when the second piston is in a third position, the first fluid channel, (2) a fourth restricting gate transmission element configured to block, when the second piston is in a fourth position, the third fluid channel, (3) a third controlling gate transmission element configured to interface with a third fluid pressure that, when applied to the third controlling gate transmission element, forces the second piston towards the third position, and (4) a fourth controlling gate transmission element configured to interface with a fourth fluid pressure that, when applied to the fourth controlling gate transmission element, forces the second piston towards the fourth position.

In some examples, a surface area of the first controlling gate transmission element may be greater than a surface area of the second controlling gate transmission element, and a surface area of the third controlling gate transmission element may be greater than a surface area of the fourth controlling gate transmission element. In at least one example, the fluidic device may perform a NOR operation on a first input source connected to the first input port and a second input source connected to the second input port. In this example, the first one or more inlet ports may be one or more source ports configured to connect to a high-pressure source, the second one or more inlet ports may be one or more drain ports configured to connect to a low-pressure source, the high-pressure source may apply the second fluid pressure to the second controlling gate transmission element and the fourth fluid pressure to the fourth controlling gate transmission element, the first input source may apply the first fluid pressure to the first controlling gate transmission element, and the second input source may apply the third fluid pressure to the third controlling gate transmission element.

In other examples, the fluidic device may perform an OR operation on a first input source connected to the first input port and a second input source connected to the second input port. In this example, the first one or more inlet ports may be one or more drain ports configured to connect to a low-pressure source, the second one or more inlet ports may be one or more source ports configured to connect to a high-pressure source, the high-pressure source may apply the second fluid pressure to the second controlling gate transmission element and the fourth fluid pressure to the fourth controlling gate transmission element, the first input source may apply the first fluid pressure to the first controlling gate transmission element, and the second input source may apply the third fluid pressure to the third controlling gate transmission element.

In other examples, a surface area of the first controlling gate transmission element may be less than a surface area of the second controlling gate transmission element, and a surface area of the third controlling gate transmission element may be less than a surface area of the fourth controlling gate transmission element. In at least one example, the fluidic device may perform a NAND operation on a first input source connected to the first input port and a second input source connected to the second input port. In this example, the first one or more inlet ports may be one or more drain ports configured to connect to a low-pressure source, the second one or more inlet ports may be one or more source ports configured to connect to a high-pressure source, the high-pressure source may apply the first fluid pressure to the first controlling gate transmission element and the third fluid pressure to the third controlling gate transmission element, the first input source may apply the second fluid pressure to the second controlling gate transmission element, and the second input source may apply the fourth fluid pressure to the fourth controlling gate transmission element.

In another example, the fluidic device may perform an AND operation on a first input source connected to the first input port and a second input source connected to the second input port. In such examples, the first one or more inlet ports may be one or more source ports configured to connect to a high-pressure source, the second one or more inlet ports may be one or more drain ports configured to connect to a low-pressure source, the high-pressure source may apply the first fluid pressure to the first controlling gate transmission element and the third fluid pressure to the third controlling gate transmission element, the first input source may apply the second fluid pressure to the second controlling gate transmission element, and the second input source may apply the fourth fluid pressure to the fourth controlling gate transmission element.

In other examples, a surface area of the first controlling gate transmission element may be less than a surface area of the second controlling gate transmission element, a surface area of the fourth controlling gate transmission element may be less than a surface area of the third controlling gate transmission element, and/or the fluidic device may perform a material-implication operation on a first input source connected to the first input port and a second input source connected to the second input port. In these examples, the first one or more inlet ports may be one or more drain ports configured to connect to a low-pressure source, the second one or more inlet ports may be one or more source ports configured to connect to a high-pressure source, the high-pressure source may apply the first fluid pressure to the first controlling gate transmission element and the fourth fluid pressure to the fourth controlling gate transmission element, the first input source may apply the second fluid pressure to the second controlling gate transmission element, and the second input source may apply the third fluid pressure to the third controlling gate transmission element.

In some examples, the plurality of input ports may include a first input port and a second input port, and the fluidic device may perform a NAND operation on a first input source connected to the first input port and a second input source connected to the second input port. In these examples, the plurality of inlet ports may include a first inlet port configured to connect to a low-pressure source and a second inlet port configured to connect to a high-pressure source, and the plurality of fluid channels may include a first fluid channel configured to route fluid from the first inlet port to the one or more output ports, a second fluid channel configured to route fluid from the second inlet port to the one or more output ports, and a third fluid channel configured to route fluid from the high-pressure source to the one or more output ports. Furthermore, the plurality of pistons may include a first piston and a second piston. The first piston may include (1) a first restricting gate transmission element configured to (a) block, when the first piston is in a first blocking position, the first fluid channel and (b) unblock, when the first piston is in a second blocking position, the first fluid channel, (2) a second restricting gate transmission element configured to (a) block, when the first piston is in the second blocking position, the second fluid channel and (b) unblock, when the first piston is in the first blocking position, the second fluid channel, (3) a first controlling gate transmission element configured to interface with a first preload pressure, wherein the first preload pressure forces, when applied to the first controlling gate transmission element, the first piston towards the first blocking position, and (4) a second controlling gate transmission element configured to interface with a pressure from the second input port, wherein the pressure from the second input port, when applied to the second controlling gate transmission element, forces the first piston towards the second blocking position. The second piston may include (1) a third restricting gate transmission element configured to (a) block, when the second piston is in a third blocking position, the first and second fluid channels and (b) unblock, when the second piston is in a fourth blocking position, the first and second fluid channels, (2) a fourth restricting gate transmission element configured to (a) block, when the second piston is in the fourth blocking position, the third fluid channel and (b) unblock, when the second piston is in the third blocking position, the third fluid channel, (3) a third controlling gate transmission element configured to interface with a second preload pressure, wherein the second preload pressure, when applied to the third controlling gate transmission element, forces the second piston towards the third blocking position, and (4) a fourth controlling gate transmission element configured to interface with a pressure from the first input port, wherein the pressure from the first input port, when applied to the fourth controlling gate transmission element, forces the second piston towards the fourth blocking position.

In other examples, the plurality of input ports may include a first input port and a second input port, and the fluidic device may perform a NOR operation on a first input source connected to the first input port and a second input source connected to the second input port. In these examples, the plurality of inlet ports may include a first inlet port configured to connect to a low-pressure source and a second inlet port configured to connect to a high-pressure source, and the plurality of fluid channels may include a first fluid channel configured to route fluid from the first inlet port to the one or more output ports, a second fluid channel configured to route fluid from the second inlet port to the one or more output ports, and a third fluid channel configured to route fluid from the low-pressure source to the one or more output ports. Additionally, the plurality of pistons may include a first piston and a second piston. The first piston may include (1) a first restricting gate transmission element configured to (a) block, when the first piston is in a first blocking position, the first fluid channel and (b) unblock, when the first piston is in a second blocking position, the first fluid channel, (2) a second restricting gate transmission element configured to (a) block, when the first piston is in the second blocking position, the second fluid channel and (b) unblock, when the first piston is in the first blocking position, the second fluid channel, (3) a first controlling gate transmission element configured to interface with a first preload pressure, wherein the first preload pressure forces, when applied to the first controlling gate transmission element, the first piston towards the first blocking position, and (4) a second controlling gate transmission element configured to interface with a pressure from the second input port, wherein the pressure from the second input port, when applied to the second controlling gate transmission element, forces the first piston towards the second blocking position. The second piston may include (1) a third restricting gate transmission element configured to (a) block, when the second piston is in a third blocking position, the third fluid channel and (b) unblock, when the second piston is in a fourth blocking position, the third fluid channel, (2) a fourth restricting gate transmission element configured to (a) block, when the second piston is in the fourth blocking position, the first and second fluid channels and (b) unblock, when the second piston is in the third blocking position, the first and second fluid channels, (3) a third controlling gate transmission element configured to interface with a second preload pressure, wherein the second preload pressure, when applied to the third controlling gate transmission element, forces the second piston towards the third blocking position, and (4) a fourth controlling gate transmission element configured to interface with a pressure from the first input port, wherein the pressure from the first input port, when applied to the fourth controlling gate transmission element, forces the second piston towards the fourth blocking position.

A corresponding fluidic logic-gate system may include inlet ports, a first input port and a second input port, an output port, a high-pressure source, a low-pressure source, a first input source connected to the first input port, a second input source connected to the second input port, fluid channels each configured to route fluid from one of the inlet ports to the output port, and two pistons. Each of the two pistons may include (1) opposing restricting gate transmission elements each configured to block a different one of the fluid channels, (2) a first controlling gate transmission element configured to interface with a first control pressure that, when applied to the first controlling gate transmission element, forces the piston towards a first position, and (3) a second controlling gate transmission element configured to interface with a second control pressure that, when applied to the second controlling gate transmission element, forces the piston towards a second position. In various examples, the two pistons, the high-pressure source, and the low-pressure source may be configured to perform a NOR operation, an OR operation, a NAND operation, an AND operation, a material-implication operation, or a converse-implication operation.

A corresponding fluidic latch system may include four inlet ports, a first input port and a second input port, two output ports, a high-pressure source, a low-pressure source, a first input source connected to the first input port, a second input source connected to the second input port, four fluid channels each configured to route fluid from one of the four inlet ports to one of the two output ports, two normally open valves, and two pistons. The two pistons may each include (1) opposing restricting gate transmission elements each configured to block a different one of the four fluid channels, (2) a first controlling gate transmission element configured to interface with a first control pressure that, when applied to the first controlling gate transmission element, forces the piston towards a first position, and (3) a second controlling gate transmission element configured to interface with a second control pressure that, when applied to the second controlling gate transmission element, forces the piston towards a second position.

In some examples, the four inlet ports may include a first inlet port, a second inlet port, a third inlet port, and a fourth inlet port, the two output ports may include a first output port and a second output port, and the four fluid channels may include (1) a first fluid channel configured to route fluid from the first inlet port to the first output port, (2) a second fluid channel configured to route fluid from the second inlet port to the first output port, (3) a third fluid channel configured to route fluid from the third inlet port to the second output port, and (4) a fourth fluid channel configured to route fluid from the fourth inlet port to the second output port. In some examples, the two normally open valves may include a first normally open valve and a second normally open valve, and the fluidic latch system may further include a fifth fluid channel configured to route fluid from the first output port to the second normally open valve and a sixth fluid channel configured to route fluid from the second output port to the first normally open valve.

In some examples, the two pistons may include a first piston and a second piston. The first piston may include (1) a first restricting gate transmission element configured to block, when the first piston is in a first position, the first fluid channel and unblock, when the piston is in a second position, the first fluid channel, (2) a second restricting gate transmission element configured to block, when the first piston is in the second position, the second fluid channel and unblock, when the first piston is in the first position, the second fluid channel, (3) a first controlling gate transmission element configured to interface with a first fluid pressure from the first input port that, when applied to the first controlling gate transmission element, forces the first piston towards the first position, and (4) a second controlling gate transmission element configured to interface with a preload pressure from the high-pressure source that, when applied to the second controlling gate transmission element, forces the first piston towards the second position. Similarly, the second piston may include (1) a third restricting gate transmission element configured to block, when the second piston is in a third position, the third fluid channel and unblock, when the second piston is in a fourth position, the third fluid channel, (2) a fourth restricting gate transmission element configured to block, when the second piston is in the fourth position, the fourth fluid channel and unblock, when the second piston is in the third position, the fourth fluid channel, (3) a third controlling gate transmission element configured to interface with the preload pressure that, when applied to the third controlling gate transmission element, forces the second piston towards the third position, and (4) a fourth controlling gate transmission element configured to interface with a second fluid pressure from the second input port that, when applied to the fourth controlling gate transmission element, forces the second piston towards the fourth position.

In some examples, the first normally open valve may include (1) a fifth restricting gate transmission element configured to unblock, when the first normally open valve is in a fifth position, the first fluid channel and block, when the first normally open valve is in a sixth position, the first fluid channel and (2) a fifth controlling gate transmission element configured to interface with a third fluid pressure from the sixth fluid channel that, when applied to the fifth controlling gate transmission element, forces the first normally open valve towards the sixth position. Similarly, the second normally open valve may include (1) a sixth restricting gate transmission element configured to unblock, when the second normally open valve is in a seventh position, the fourth fluid channel and block, when the second normally open valve is in an eighth position, the fourth fluid channel and (2) a sixth controlling gate transmission element configured to interface with a fourth fluid pressure from the fifth fluid channel that, when applied to the sixth controlling gate transmission element, forces the second normally open valve towards the eighth position.

Features from any of the embodiments described herein may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 8 is a diagram of a truth table of the exemplary fluidic logic gate of FIG. 6, according to some embodiments.

FIG. 11 is a diagram of a truth table of the exemplary fluidic logic gate of FIG. 9, according to some embodiments.

FIG. 15 is a diagram of a truth table of the exemplary fluidic logic gate of FIG. 13, according to some embodiments.

FIG. 18 is a diagram of a truth table of the exemplary fluidic logic gate of FIG. 16, according to some embodiments.

FIG. 22 is a diagram of a truth table of the exemplary fluidic logic gate of FIG. 20, according to some embodiments.

FIG. 25 is a diagram of a truth table of the exemplary fluidic logic gate of FIG. 23, according to some embodiments.

FIG. 34 is a diagram of a truth table of the exemplary fluidic set-reset latch of FIG. 27, according to some embodiments.

Figure 1:
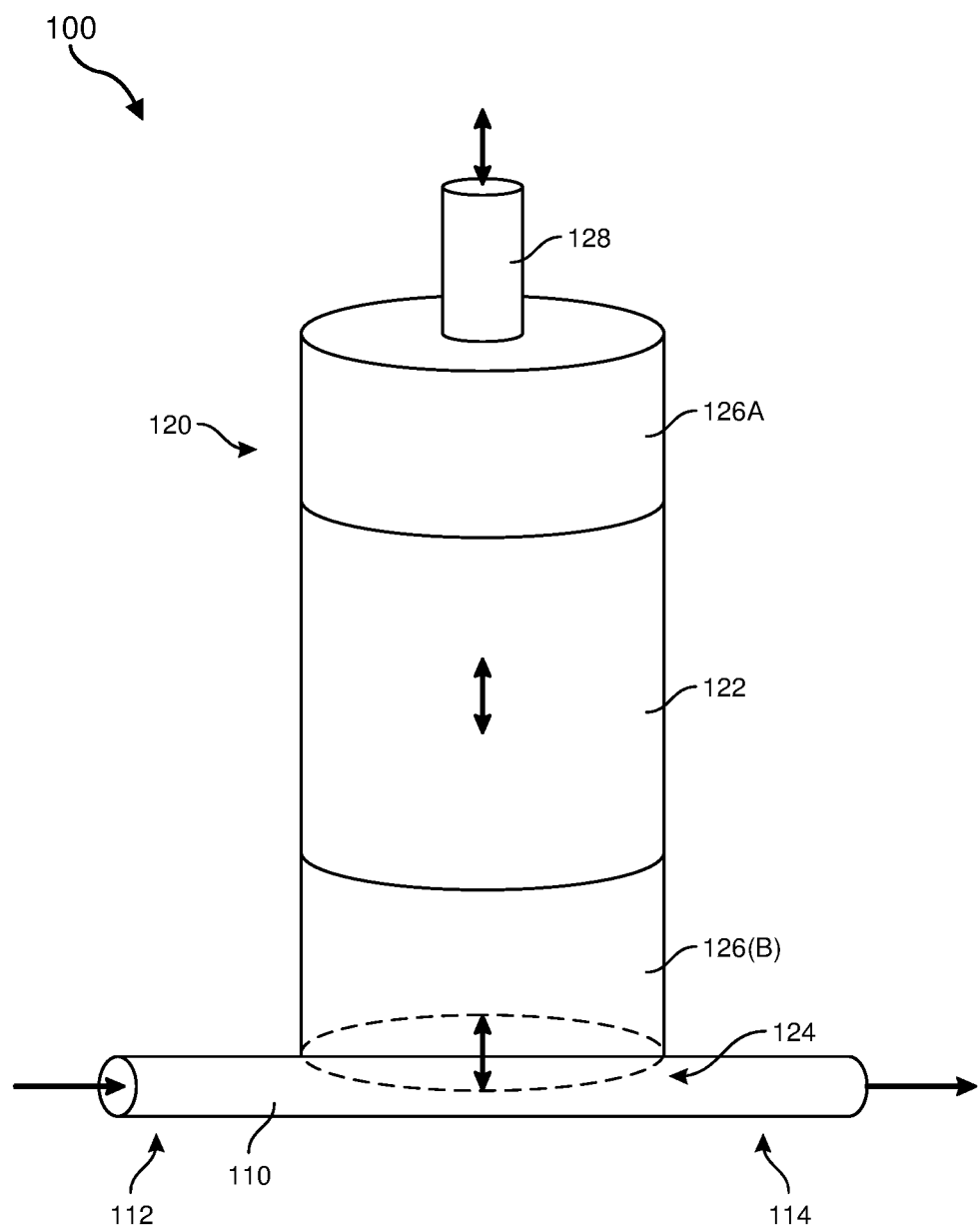
FIG. 1 is an illustration of an exemplary fluidic control system that may be used in connection with embodiments of this disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to complementary fluidic valves and systems that may be used in various fluidic circuits or systems to perform a wide range of functions and logical operations. For example, as will be explained in greater detail below, embodiments of the instant disclosure may be configured as latches and/or logic gates capable of performing fourteen out of the sixteen typical binary Boolean operations. Embodiments of the instant disclosure may use a single rigid or mostly rigid piston that has at least two upper gate transmission elements (an upper restricting gate transmission element and an upper controlling gate transmission element) and at least two lower gate transmission elements (a lower restricting gate transmission element and a lower controlling gate transmission element). The upper restricting gate transmission element may be configured to restrict fluid flow in an upper fluid channel when the rigid piston is in an upward position and allow fluid flow in the upper fluid channel when the rigid piston is in a downward position. Similarly, the lower restricting gate transmission element may be configured to restrict fluid flow in a lower fluid channel when the rigid piston is in the downward position and allow fluid flow in the lower fluid channel when the rigid piston is in the upward position. Embodiments of the instant disclosure may provide various features and advantages over traditional fluidic valves and systems. For example, embodiments of the instant disclosure may provide, using only a single component or design, various logic and latch functions with low-leakage control of outlet pressures.

The present disclosure may include fluidic systems that involve the control (e.g., stopping, starting, restricting, increasing, etc.) of fluid flows through fluid channels. The control of fluid flow may be accomplished with a fluidic valve. FIG. 1 shows a schematic diagram of a fluidic valve 100 for controlling flow through a fluid channel 110, according to at least one embodiment of the present disclosure. Fluid from a fluid source (e.g., a pressurized fluid source, a fluid pump, etc.) may flow through the fluid channel 110 from an inlet port 112 to an outlet port 114, which may be operably coupled to, for example, a fluid-driven mechanism, another fluid channel, or a fluid reservoir.

Fluidic valve 100 may include a gate 120 for controlling the fluid flow through fluid channel 110. Gate 120 may include a gate transmission element 122, which may be a movable component that is configured to transmit an input force, pressure, or displacement to a restricting region 124 to restrict or stop flow through the fluid channel 110. Conversely, in some examples, application of a force, pressure, or displacement to gate transmission element 122 may result in opening restricting region 124 to allow or increase flow through the fluid channel 110. The force, pressure, or displacement applied to gate transmission element 122 may be referred to as a gate force, gate pressure, or gate displacement. Gate transmission element 122 may be a flexible element (e.g., an elastomeric membrane, a diaphragm, etc.), a rigid element (e.g., a movable piston, a lever, etc.), or a combination thereof (e.g., a movable piston or a lever coupled to an elastomeric membrane or diaphragm).

As illustrated in FIG. 1, gate 120 of fluidic valve 100 may include one or more gate terminals, such as an input gate terminal 126A and an output gate terminal 126B (collectively referred to herein as "gate terminals 126") on opposing sides of gate transmission element 122. Gate terminals 126 may be elements for applying a force (e.g., pressure) to gate transmission element 122. By way of example, gate terminals 126 may each be or include a fluid chamber adjacent to gate transmission element 122. Alternatively or additionally, one or more of gate terminals 126 may include a solid component, such as a spring, a lever, screw, or piston, that is configured to apply a force to gate transmission element 122.

In some examples, a gate port 128 may be in fluid communication with input gate terminal 126A for applying a positive or negative fluid pressure within the input gate terminal 126A. A control fluid source (e.g., a pressurized fluid source, a fluid pump, etc.) may be in fluid communication with gate port 128 to selectively pressurize and/or depressurize input gate terminal 126A. In additional embodiments, a force or pressure may be applied at the input gate terminal 126A in other ways, such as with a piezoelectric element or an electromechanical actuator, etc.

In the embodiment illustrated in FIG. 1, pressurization of the input gate terminal 126A may cause the gate transmission element 122 to be displaced toward restricting region 124, resulting in a corresponding pressurization of output gate terminal 126B. Pressurization of output gate terminal 126B may, in turn, cause restricting region 124 to partially or fully restrict to reduce or stop fluid flow through the fluid channel 110. Depressurization of input gate terminal 126A may cause gate transmission element 122 to be displaced away from restricting region 124, resulting in a corresponding depressurization of the output gate terminal 126B. Depressurization of output gate terminal 126B may, in turn, cause restricting region 124 to partially or fully expand to allow or increase fluid flow through fluid channel 110. Thus, gate 120 of fluidic valve 100 may be used to control fluid flow from inlet port 112 to outlet port 114 of fluid channel 110.

Figure 2:
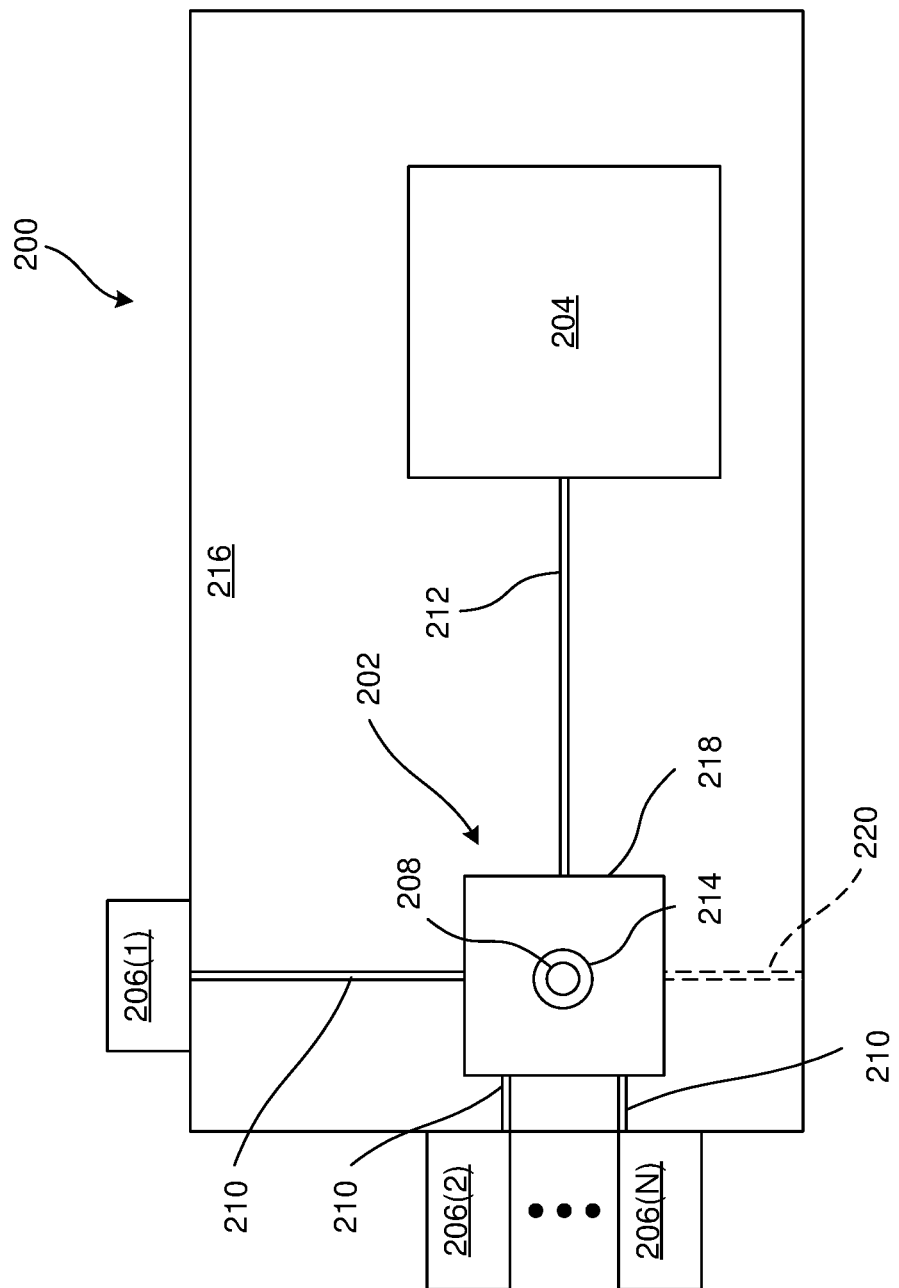
FIG. 2 is a block diagram of an exemplary fluidic system, according to at least one embodiment of the present disclosure.

FIG. 2 is a schematic view of a fluidic system 200 that includes a fluidic valve 202, a fluid-driven mechanism 204 configured to be activated, controlled, or fed by fluidic valve 202, and one or more fluid sources 206(1)-(N) for controlling and/or being controlled by fluidic valve 202. In some examples, the flow of a fluid from one of fluid sources 206(1)-(N) may be controlled by a piston 208 of fluidic valve 202. A port 210 (e.g., an inlet port or a control port) may provide fluid communication between each of fluid sources 206(1)-(N) and fluidic valve 202. An outlet port 212 may provide fluid communication between fluidic valve 202 and fluid-driven mechanism 204. As shown, fluidic valve 202 may include piston 208 that may be movable within a cavity 214 to open and close fluidic valve 202 for controlling flow of the fluid.

Fluidic system 200 may include a substrate 216, within which or on which at least some of the components of fluidic system 200 are disposed. For example, at least a portion of substrate 216 may define one or more of a valve body 218 of fluidic valve 202, fluid sources 206, ports 210, outlet port 212, cavity 214, and/or fluid-driven mechanism 204. In some embodiments, substrate 216 may include a stack of materials, such as a drive body portion, at least one flexible material (e.g., an elastic material), a gate body portion, and/or a fluid channel body portion. In some examples, the term "flexible" may mean capable of flexing and/or returning to an original state without permanent damage. A flexible material may also be stretchable. In some examples, substrate 216 may include at least one of silicon, silicon dioxide, a glass, and/or a rigid polymer (e.g., a polycarbonate material, an acrylic material, a urethane material, a fluorinated elastomer material, a polysiloxane material, etc.).

Fluid-driven mechanism 204 may be any fluid load or mechanism that may be driven or controlled by flowing and/or pressurization of fluid. By way of example and not limitation, fluid-driven mechanism 204 may include at least one of a microelectromechanical device (e.g., a so-called "MEMS" device), an expansible cavity, a piston system, and/or a haptic feedback device. Each of fluid sources 206 may be any source or mechanism that can provide a pressurized fluid (e.g., gas (e.g., air, nitrogen, etc.) or liquid (e.g., water, oil, etc.)) to fluidic valve 202. By way of example and not limitation, fluid sources 206 may each be or include a pressurized reservoir, a fan, a pump, or a piston system, etc. In some examples, one or more of fluid sources 206 may be capable of providing a pressurized fluid at a high pressure and/or a low pressure. In general, a "high pressure" may be any pressure of a fluid that falls within a high or maximum pressure range, and a "low pressure" may be any pressure of a fluid that falls within a low or minimum pressure range. In some situations, a pressure falling within a high pressure range may be considered to represent one state (e.g., "1") of a bit or binary digit, and a pressure falling within a low pressure range may be considered to represent the other state (e.g., "0") of a bit or binary digit. In some examples, one or more fluid sources 206 may be a source of fluid pressures or a drain of fluid pressures.

Optionally, in some embodiments, an interstitial-pressure outlet 220 (shown in FIG. 2 in dashed lines) may be in fluid communication with fluidic valve 202. Interstitial-pressure outlet 220 may enable one or more chambers within fluidic valve 202 to expand and/or contract as piston 208 is moved back and forth to open or close fluidic valve 202, as will be explained in further detail below.

In some embodiments, fluidic system 200 may be incorporated in a pneumatic control system and/or may be used for industrial pneumatic controls. Additionally or alternatively, fluidic system 200 may be incorporated in a haptic feedback device, such as for use with an artificial reality (e.g., virtual reality, augmented reality, mixed reality, or hybrid reality) system. Fluidic system 200 may be positioned on or in a wearable device (e.g., a headband, a head-mounted display, a glove, an armband, etc.) that is configured to provide haptic feedback (e.g., vibration, pressure, etc.) to a user. For example, fluid-driven mechanism 204 of fluidic system 200 may be an expansible cavity configured to fill and expand with the fluid upon opening of fluidic valve 202. The expanding cavity may press against the user, and the user may sense the pressure from the expanding cavity, such as resulting from an action taken by the user in the artificial reality. By way of example, fluidic system 200 may be incorporated in a finger of a glove, and the user may use his or her finger in space to make a selection in an artificial reality environment. The expansible cavity of fluidic system 200 may be filled and expanded with the fluid to provide a pressure point on the user's finger to confirm the selection made by the user. The pressure point may provide a sensation that the user is touching a real object. Alternatively, fluid-driven mechanism 204 may include an eccentric rotating element that may be rotated by the flowing fluid when fluidic valve 202 is in an open state, resulting in a vibrating sensation as haptic feedback for the user.

Figure 3A:
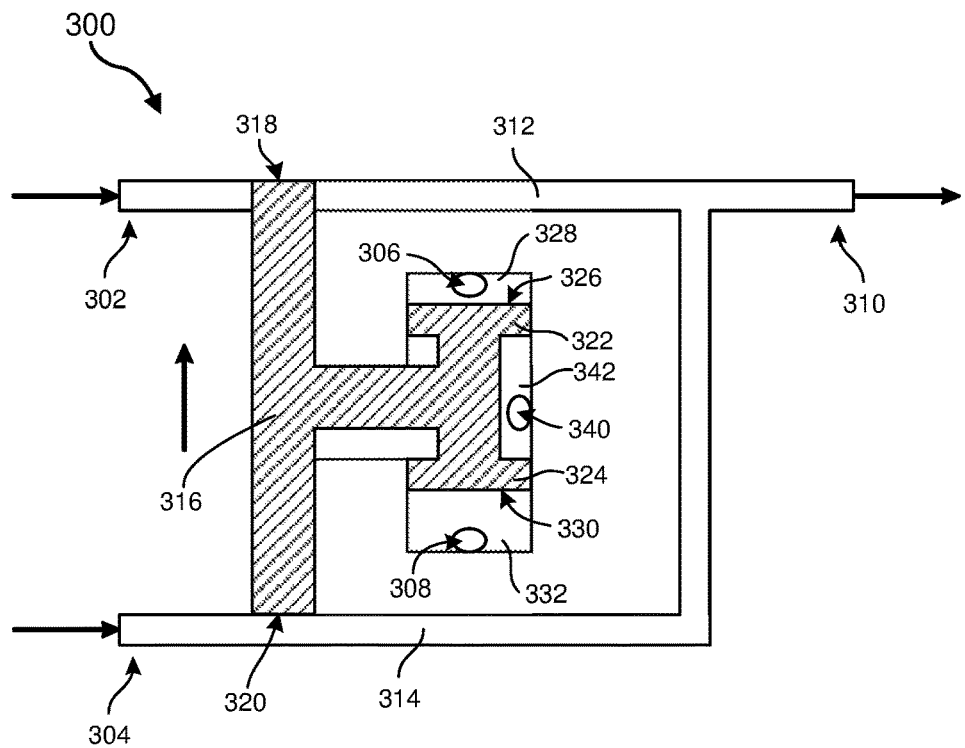
FIGS. 3A and 3B are schematic diagrams of an exemplary complementary fluidic valve, according to at least one embodiment of the present disclosure.
Figure 3B:
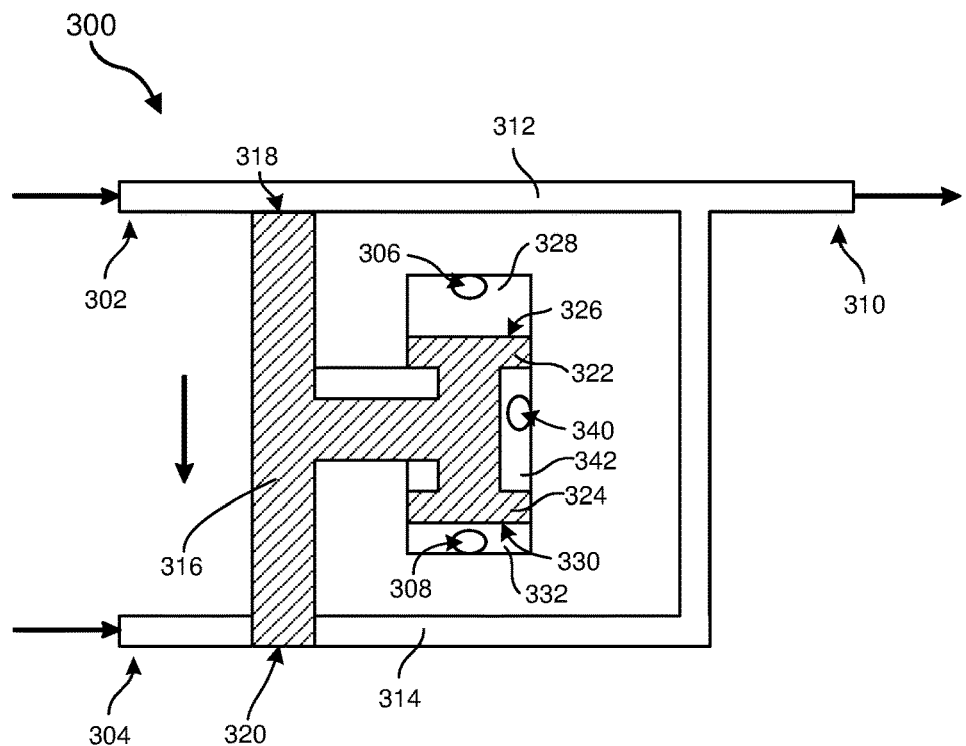

Fluidic valve 202 in FIG. 2 may have various forms and configurations and may be incorporated into various fluidic systems. FIGS. 3A and 3B are schematic diagrams illustrating two positions of an exemplary fluidic valve 300. As shown, fluidic valve 300 may include an inlet port 302, an inlet port 304, a control port 306, a control port 308, an outlet port 310, a fluid channel 312 configured to convey fluid from inlet port 302 to outlet port 310, a fluid channel 314 configured to convey fluid from inlet port 304 to outlet port 310, and a piston 316. In some examples, piston 316 may be formed from a single piece of a substantially rigid material (e.g., a rigid plastic, metal, or glass). Alternatively, piston 316 may be formed from a substantially rigid composite part. Piston 316 may include a restricting gate transmission element 318 configured to block or restrict fluid channel 312 when piston 316 is in the position illustrated in FIG. 3A and unblock fluid channel 312 when piston 316 is in the position illustrated in FIG. 3B. Piston 316 may also include a restricting gate transmission element 320 configured to block or restrict fluid channel 314 when piston 316 is in the position illustrated in FIG. 3B and unblock fluid channel 314 when piston 316 is in the position illustrated in FIG. 3A. Because of the complementary positions of restricting gate transmission elements 318 and 320, fluid flow may not tend to flow directly from inlet port 302 to inlet port 304. Piston 316 may include complementary or opposing piston heads 322 and 324. Piston head 322 may have a controlling gate transmission element 326 configured to interface with a control pressure 328 from control port 306 that, when applied to controlling gate transmission element 326 forces piston 316 towards the position illustrated in FIG. 3B. Similarly, piston head 324 may have a controlling gate transmission element 330 configured to interface with a control pressure 332 from control port 308 that, when applied to controlling gate transmission element 330 forces piston 316 towards the position illustrated in FIG. 3A. In at least one example, control port 306 or control port 308 may be permanently closed or absent and control pressure 328 or control pressure 332 may be generated by a mechanical preload force.

In some embodiments, fluidic valve 300 may include an interstitial-pressure outlet/inlet 340 that may direct fluid pressures from/to interstitial region 342. In some examples, interstitial-pressure outlet/inlet 340 may connect interstitial region 342 to an outside atmosphere or an additional control fluid source. In some embodiments, the additional control fluid source may modulate fluid pressures within interstitial region 342 to actuate piston 316 or modulate the level of control pressures 328 and/or 332 at which piston 316 actuates.

As shown in FIGS. 3A and 3B, controlling gate transmission elements 326 and 330 may have substantially the same surface areas. As such, movement of piston 316 from the position illustrated in FIG. 3A to the position illustrated in FIG. 3B may require a greater fluid pressure at control port 306 than at control port 308. Similarly, movement of piston 316 from the position illustrated in FIG. 3B to the position illustrated in FIG. 3A may require a greater fluid pressure at control port 308 than at control port 306. In some examples, restricting gate transmission elements 318 and 320 may have substantially the same surface areas, which may be substantially less than the surface areas of controlling gate transmission elements 326 and 330. As such, movement of piston 316 may be mostly caused by the fluid pressures applied to control port 306 and 308 rather than any fluid pressures applied to inlet ports 302 and 304.

Figure 4A:
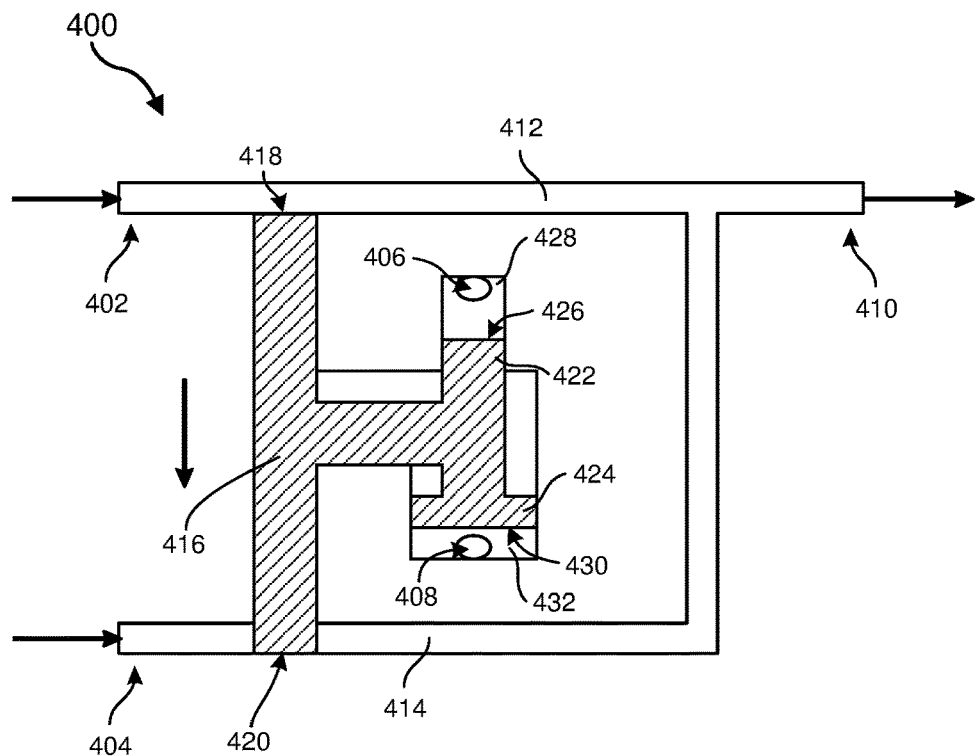
FIGS. 4A and 4B are schematic diagrams of another exemplary complementary fluidic valve, according to at least one embodiment of the present disclosure.
Figure 4B:
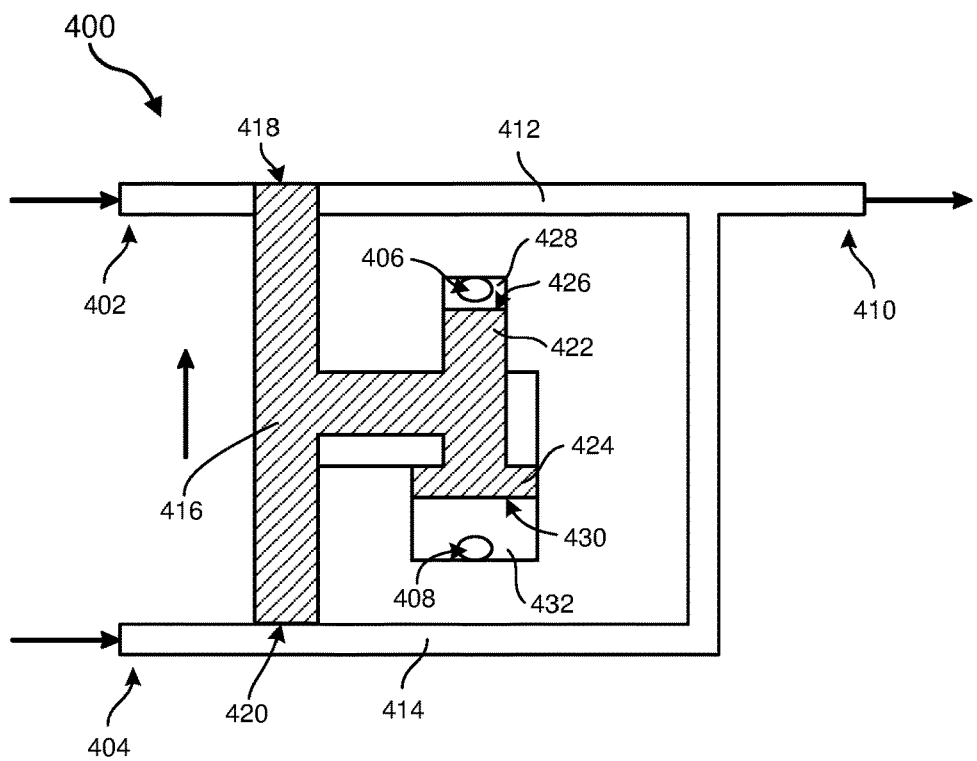

In some examples, the fluidic valves described herein may have controlling gate transmission elements with different surface areas. FIGS. 4A and 4B are schematic diagrams illustrating two positions of an exemplary fluidic valve 400 having controlling gate transmission elements with different surface areas. As shown, fluidic valve 400 may include an inlet port 402, an inlet port 404, a control port 406, a control port 408, an outlet port 410, a fluid channel 412 configured to convey fluid from inlet port 402 to outlet port 410, a fluid channel 414 configured to convey fluid from inlet port 404 to outlet port 410, and a piston 416. Although not shown, in some embodiments, control port 406 may be absent, and another source of force (e.g., a spring or another element providing a mechanical preload force) may be used to apply a force to controlling gate transmission element 426. In some examples, piston 416 may be formed from a single piece of a substantially rigid material (e.g., a rigid plastic, metal, or glass). Alternatively, piston 416 may be formed from a substantially rigid composite part. Piston 416 may include a restricting gate transmission element 418 configured to block or restrict fluid channel 412 when piston 416 is in the position illustrated in FIG. 4B and unblock fluid channel 412 when piston 416 is in the position illustrated in FIG. 4A. Piston 416 may also include a restricting gate transmission element 420 configured to block or restrict fluid channel 414 when piston 416 is in the position illustrated in FIG. 4A and unblock fluid channel 414 when piston 416 is in the position illustrated in FIG. 4B. Piston 416 may include complementary or opposing piston heads 422 and 424. Piston head 422 may have a controlling gate transmission element 426 configured to interface with a control pressure 428 from control port 406 that, when applied to controlling gate transmission element 426 forces piston 416 towards the position illustrated in FIG. 4A. Similarly, piston head 424 may have a controlling gate transmission element 430 configured to interface with a control pressure 432 from control port 408 that, when applied to controlling gate transmission element 430 forces piston 416 towards the position illustrated in FIG. 4B.

As shown in FIGS. 4A and 4B, controlling gate transmission elements 426 and 430 may have different surface areas (e.g., the surface area of controlling gate transmission element 430 may be substantially larger than the surface area of controlling gate transmission element 426). As such, movement of piston 416 from the position illustrated in FIG. 4A to the position illustrated in FIG. 4B may require a fluid pressure at control port 408 that is less than that at control port 406. In some examples, the relative surface areas of controlling gate transmission elements 426 and 430 may be configured such that specific pressure differences between the pressures applied to control ports 406 and 408 trigger movement of piston 416 between the positions illustrated in FIGS. 4A and 4B. For example, the surface area of controlling gate transmission element 430 may be configured to have a surface area that is two times greater than the surface area of controlling gate transmission element 426 in order to trigger movement of piston 416 from the position illustrated in FIG. 4A to the position illustrated in FIG. 4B when the pressure applied to control port 408 is greater than one half the pressure applied to control port 406. In some examples, restricting gate transmission elements 418 and 420 may have substantially the same surface areas, which may be substantially less than the surface areas of controlling gate transmission elements 426 and 430. As such, movements of piston 416 may be mostly caused by the fluid pressures applied to control port 406 and 408 rather than any fluid pressures applied to inlet ports 402 and 404.

Figure 5:
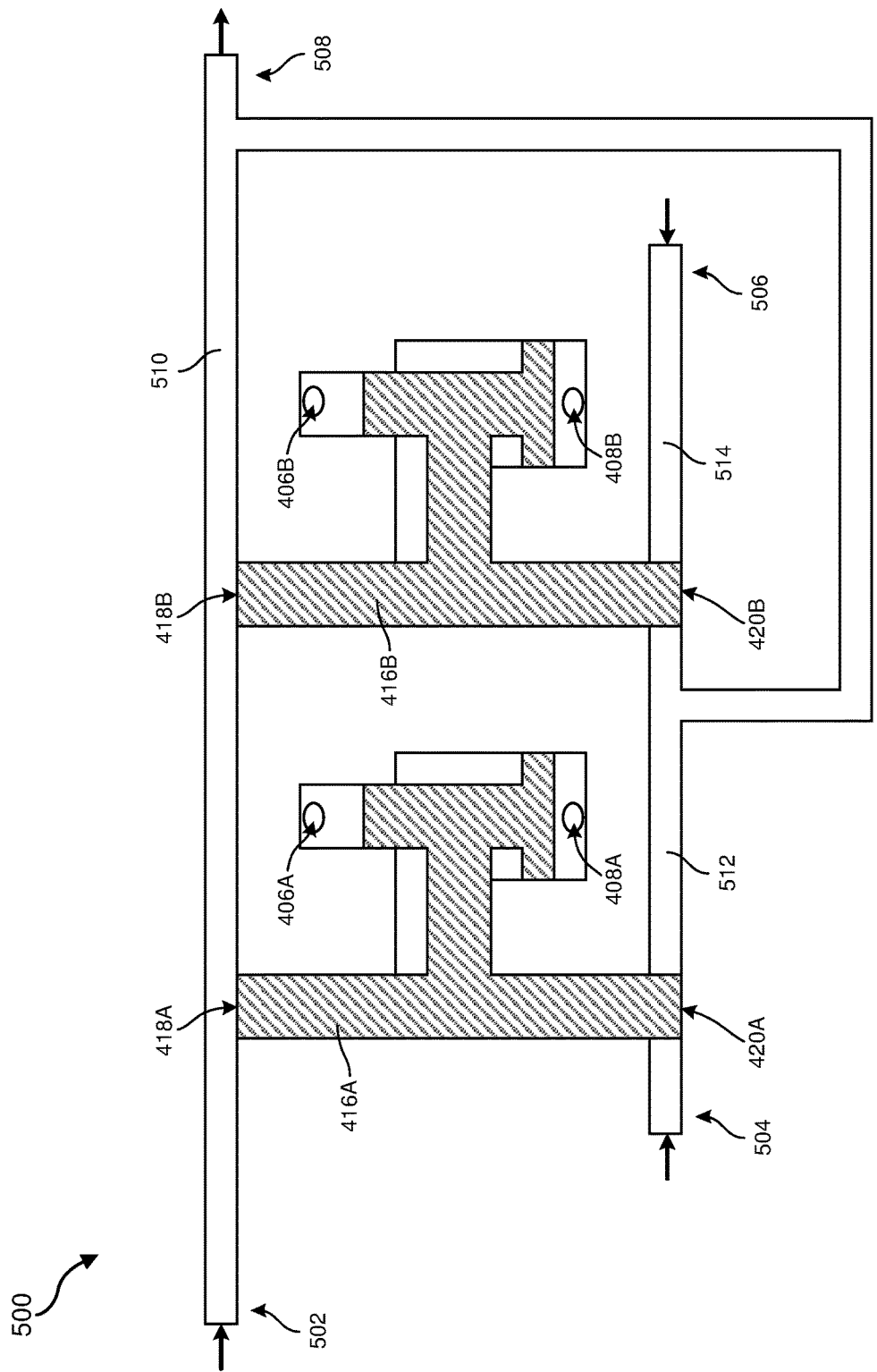
FIG. 5 is a schematic diagram of an exemplary fluidic logic gate, according to at least one embodiment of the present disclosure.

Some or all of the components of fluidic valve 300 in FIGS. 3A and 3B or fluidic valve 400 in FIGS. 4A and 4B may be configured or modified to perform various functions and/or operations as part of a larger composite fluidic system. For example, as shown in FIG. 5, a fluidic logic gate 500 may be configured using pistons 416A and 416B. As shown, fluidic logic gate 500 may include an inlet port 502, an inlet port 504, an inlet port 506, an outlet port 508, a fluid channel 510 configured to convey fluid from inlet port 502 to outlet port 508, a fluid channel 512 configured to convey fluid from inlet port 504 to outlet port 508, a fluid channel 514 configured to convey fluid from inlet port 506 to outlet port 508, and pistons 416A-B.

Piston 416A may include a restricting gate transmission element 418A configured to unblock fluid channel 510 when piston 416A is in the position illustrated in FIG. 5 and block or restrict fluid channel 510 when a sufficient pressure is applied to control port 408A to overcome any pressure applied to control port 406A and force piston 416A upward. Similarly, piston 416B may include a restricting gate transmission element 418B configured to unblock fluid channel 510 when piston 416B is in the position illustrated in FIG. 5 and block or restrict fluid channel 510 when enough pressure is applied to control port 408B to overcome any pressure applied to control port 406B and force piston 416B upward. Piston 416A may also include a restricting gate transmission element 420A configured to block or restrict fluid channel 512 when piston 416A is in the position illustrated in FIG. 5 and unblock fluid channel 512 when enough pressure is applied to control port 408A to overcome any pressure applied to control port 406A and force piston 416A upward. Similarly, piston 416B may include a restricting gate transmission element 420B configured to block or restrict fluid channel 514 when piston 416B is in the position illustrated in FIG. 5 and unblock fluid channel 514 when enough pressure is applied to control port 408B to overcome any pressure applied to control port 406B and force piston 416B upward. In some examples, pistons 416A-B may be part of a single fluidic device within which fluid channels 510, 512, and/or 514 are integrated. Alternatively, pistons 416A-B may be part of separate fluidic devices, and portions of fluid channels 510, 512, and/or 514 may be external fluid connections between the separate fluidic devices.

Figure 6:
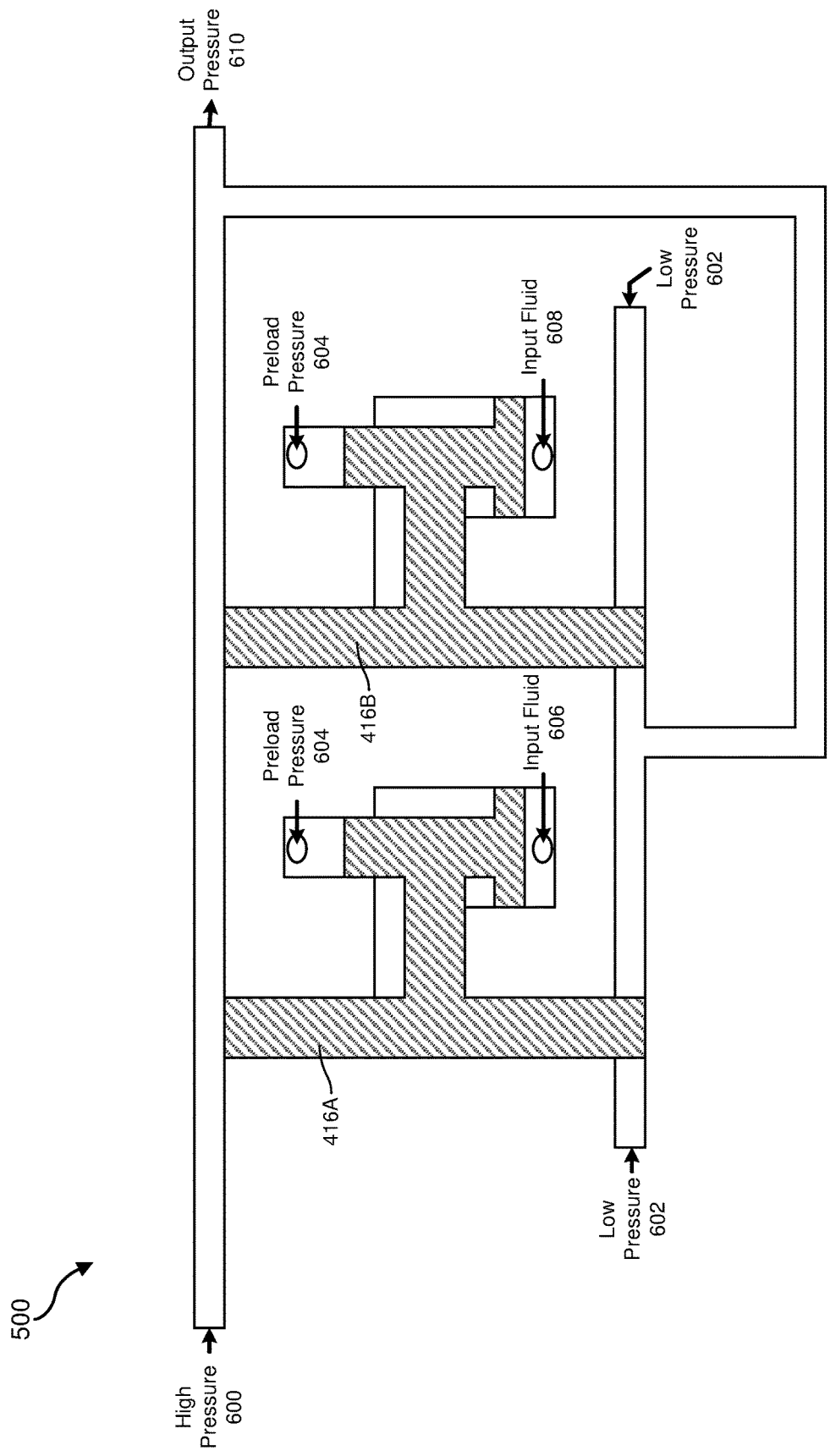
FIG. 6 is a schematic diagram of the exemplary fluidic logic gate of FIG. 5 configured to perform a NOR operation, according to at least one embodiment of the present disclosure.
Figure 7A:
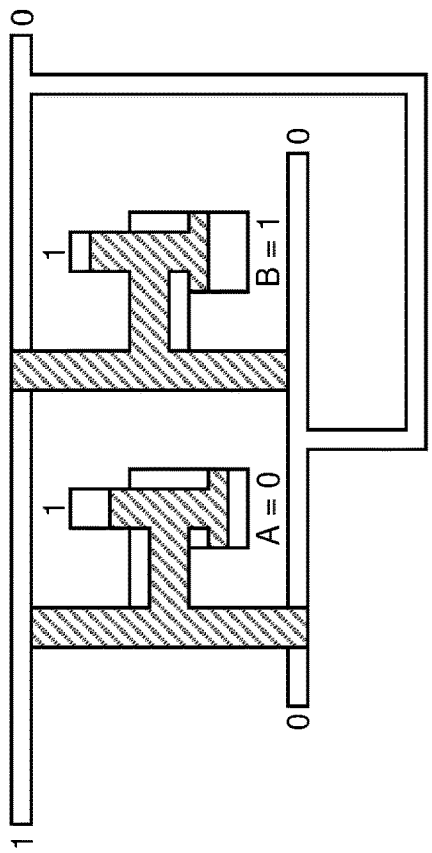
FIGS. 7A-7D are state diagrams of the exemplary fluidic logic gate of FIG. 6, according to at least one embodiment of the present disclosure.
Figure 7B:
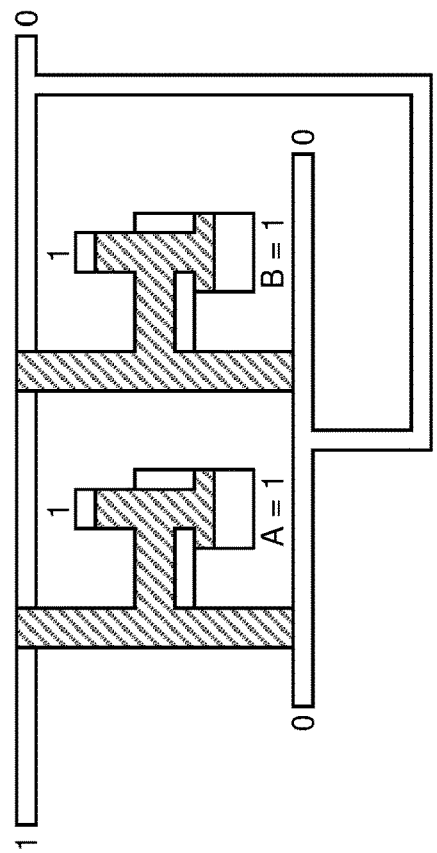
Figure 7C:
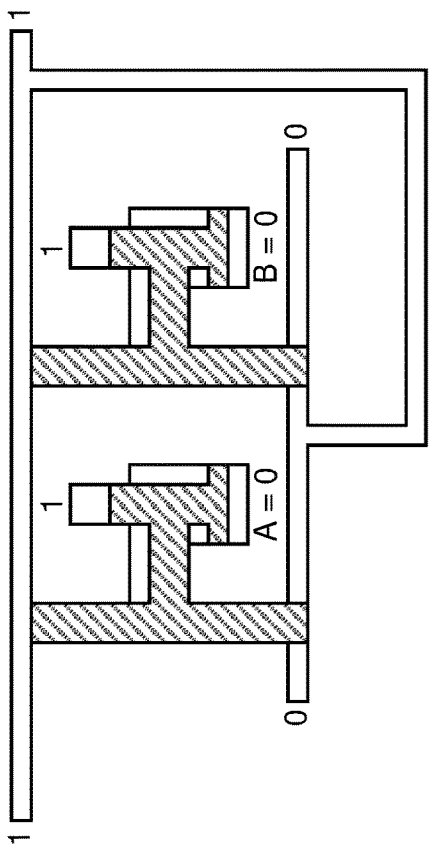
Figure 7D:
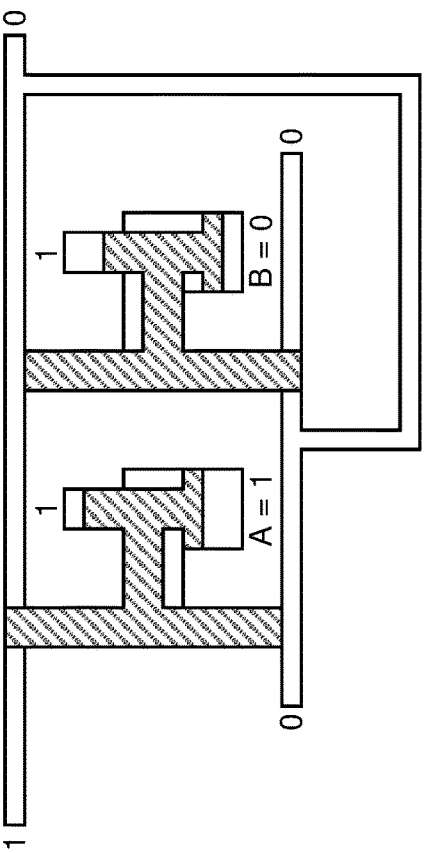

As shown in FIG. 6, in some examples, fluidic logic gate 500 may be configured to perform a NOR operation by applying (1) a high pressure 600 to inlet port 502, (2) a low pressure 602 to inlet ports 504 and 506, (3) a preload pressure 604 (e.g., high pressure 600) to control ports 406A-B, (4) an input fluid 606 (e.g., an input A) to control port 408A, and (5) an input fluid 608 (e.g., an input B) to control port 408B. In this example, a result of the NOR operation may be seen as output pressure 610 at outlet port 508. As shown in FIG. 7A, if input fluid 606 and input fluid 608 both have a low pressure (e.g., a pressure lower than that of preload pressure 604), then pistons 416A-B may be in the positions shown and high pressure 600 may be routed from inlet port 502 through fluid channel 510 to outlet port 508. As shown in FIG. 7B, if input fluid 606 has a low pressure (e.g., a pressure lower than that of preload pressure 604) and input fluid 608 has a sufficiently high pressure (e.g., a pressure equal to preload pressure 604), then pistons 416A-B may be in the positions shown and low pressure 602 may be routed from inlet port 506 through fluid channel 514 to outlet port 508. As shown in FIG. 7C, if input fluid 606 has a sufficiently high pressure (e.g., a pressure equal to preload pressure 604) and input fluid 608 has a low pressure (e.g., a pressure lower than that of preload pressure 604), then pistons 416A-B may be in the positions shown and low pressure 602 may be routed from inlet port 504 through fluid channel 512 to outlet port 508. As shown in FIG. 7D, if input fluid 606 and input fluid 608 both have a sufficiently high pressure (e.g., a pressure equal to preload pressure 604), then pistons 416A-B may be in the positions shown and low pressure 602 may be routed from inlet port 504 or inlet port 506 through fluid channel 512 or fluid channel 514 to outlet port 508. FIG. 8 illustrates a NOR truth table 800 that may represent the functionality of fluidic logic gate 500 when configured as shown in FIG. 6.

Figure 9:
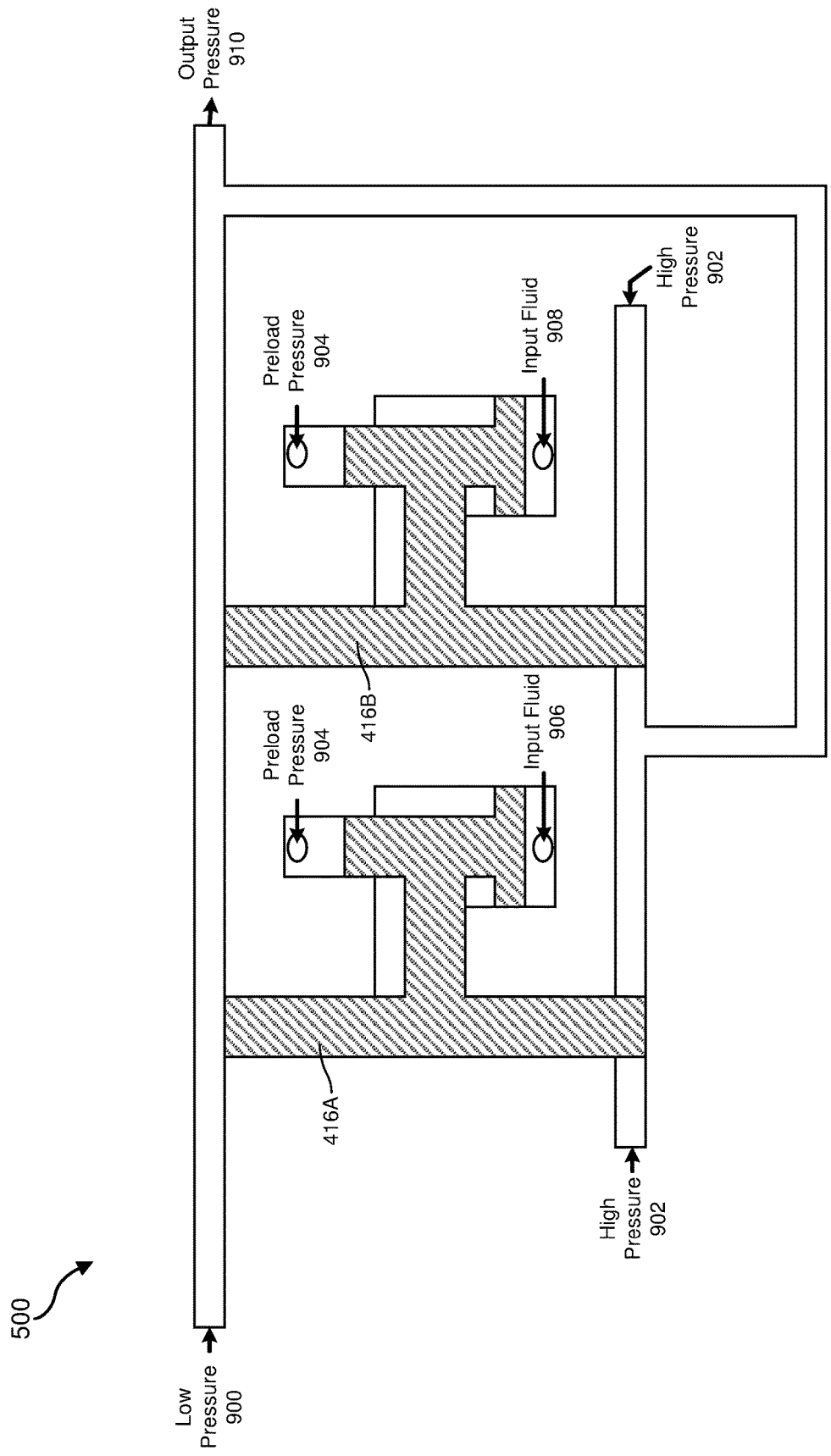
FIG. 9 is a schematic diagram of the exemplary fluidic logic gate of FIG. 5 configured to perform an OR operation, according to at least one embodiment of the present disclosure.
Figure 10A:
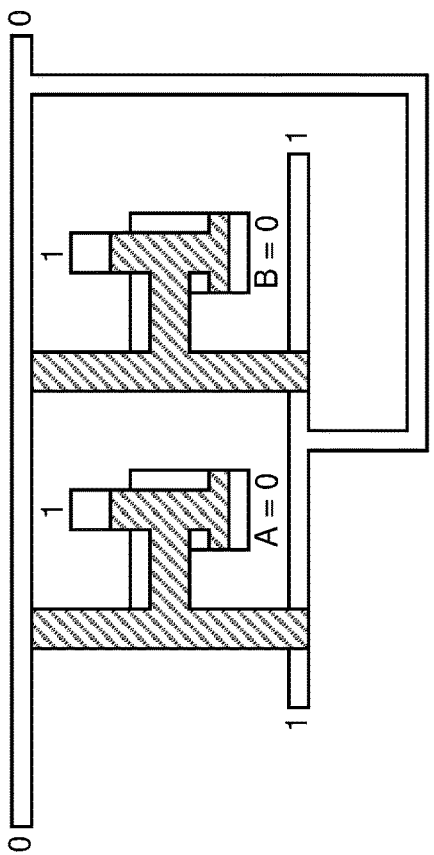
FIGS. 10A-10D are state diagrams of the exemplary fluidic logic gate of FIG. 9, according to at least one embodiment of the present disclosure.
Figure 10B:
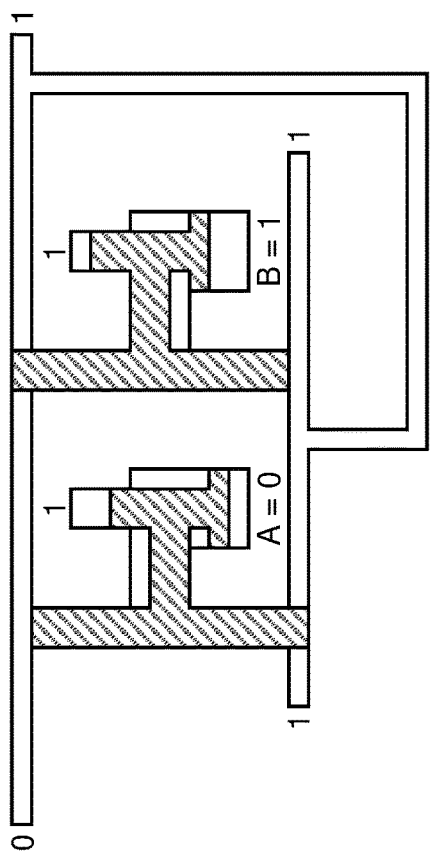
Figure 10C:
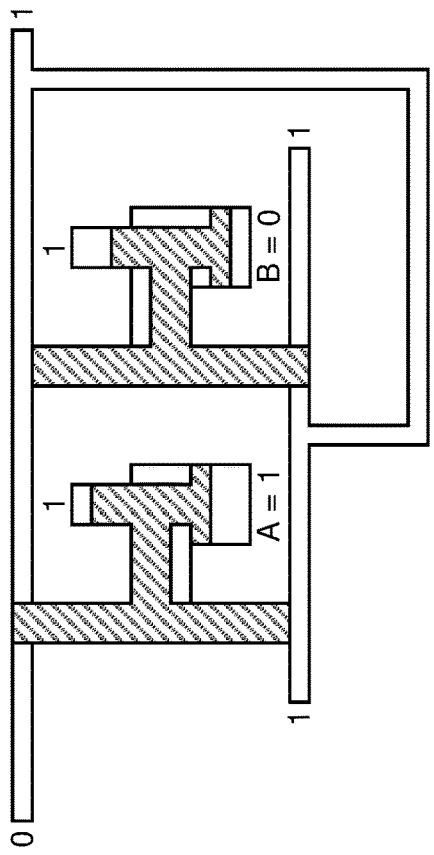
Figure 10D:
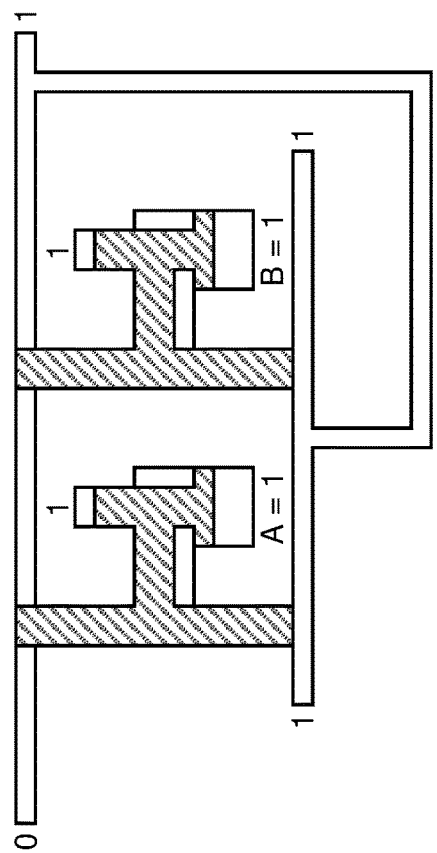

As shown in FIG. 9, in some examples, fluidic logic gate 500 may be configured to perform an OR operation by applying (1) a low pressure 900 to inlet port 502, (2) a high pressure 902 to inlet ports 504 and 506, (3) a preload pressure 904 (e.g., high pressure 902) to control ports 406A-B, (4) an input fluid 906 (e.g., an input A) to control port 408A, and (5) an input fluid 908 (e.g., an input B) to control port 408B. In this example, a result of the OR operation may be seen as output pressure 910 at outlet port 508. As shown in FIG. 10A, if input fluid 906 and input fluid 908 both have a low pressure (e.g., a pressure lower than that of preload pressure 904), then pistons 416A-B may be in the positions shown and low pressure 900 may be routed from inlet port 502 through fluid channel 510 to outlet port 508. As shown in FIG. 10B, if input fluid 906 has a low pressure (e.g., a pressure lower than that of preload pressure 904) and input fluid 908 has a sufficiently high pressure (e.g., a pressure equal to preload pressure 904), then pistons 416A-B may be in the positions shown and high pressure 902 may be routed from inlet port 506 through fluid channel 514 to outlet port 508. As shown in FIG. 10C, if input fluid 906 has a sufficiently high pressure (e.g., a pressure equal to preload pressure 904) and input fluid 908 has a low pressure (e.g., a pressure lower than that of preload pressure 904), then pistons 416A-B may be in the positions shown and high pressure 902 may be routed from inlet port 504 through fluid channel 512 to outlet port 508. As shown in FIG. 10D, if input fluid 906 and input fluid 908 both have a sufficiently high pressure (e.g., a pressure equal to preload pressure 904), then pistons 416A-B may be in the positions shown and high pressure 902 may be routed from inlet port 504 or inlet port 506 through fluid channel 512 or fluid channel 514 to outlet port 508. FIG. 11 illustrates an OR truth table 1100 that may represent the functionality of fluidic logic gate 500 when configured as shown in FIG. 9.

Figure 12:
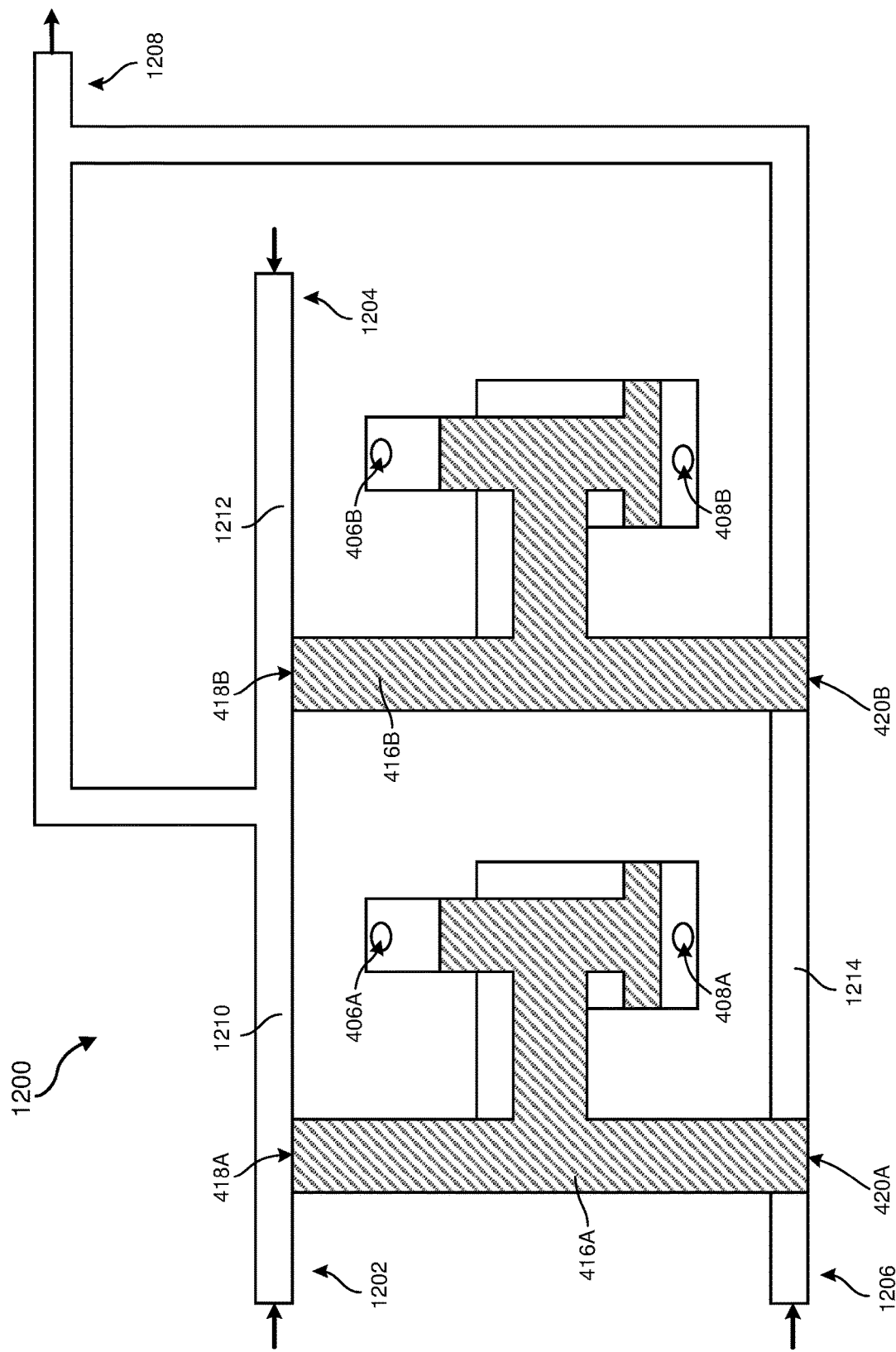
FIG. 12 is a schematic diagram of an exemplary fluidic logic gate, according to at least one embodiment of the present disclosure.

FIG. 12 illustrates a fluidic logic gate 1200 that may be configured to perform a NAND operation or an AND operation. As shown in FIG. 12, fluidic logic gate 1200 may be configured using pistons 416A and 416B. As shown, fluidic logic gate 1200 may include an inlet port 1202, an inlet port 1204, an inlet port 1206, an outlet port 1208, a fluid channel 1210 configured to convey fluid from inlet port 1202 to outlet port 1208, a fluid channel 1212 configured to convey fluid from inlet port 1204 to outlet port 1208, a fluid channel 1214 configured to convey fluid from inlet port 1206 to outlet port 1208, and pistons 416A-B. Piston 416A may include a restricting gate transmission element 418A configured to unblock fluid channel 1210 when piston 416A is in the position illustrated in FIG. 12 and block or restrict fluid channel 1210 when a sufficient pressure is applied to control port 408A to overcome any pressure applied to control port 406A and force piston 416A upward. Piston 416B may include a restricting gate transmission element 418B configured to unblock fluid channel 1212 when piston 416B is in the position illustrated in FIG. 12 and block or restrict fluid channel 1212 when enough pressure is applied to control port 408B to overcome any pressure applied to control port 406B and force piston 416B upward. Piston 416A may also include a restricting gate transmission element 420A configured to block or restrict fluid channel 1214 when piston 416A is in the position illustrated in FIG. 12 and unblock fluid channel 1214 when enough pressure is applied to control port 408A to overcome any pressure applied to control port 406A and force piston 416A upward. Similarly, piston 416B may include a restricting gate transmission element 420B configured to block or restrict fluid channel 1214 when piston 416B is in the position illustrated in FIG. 12 and unblock fluid channel 1214 when enough pressure is applied to control port 408B to overcome any pressure applied to control port 406B and force piston 416B upward. In some examples, pistons 416A-B may be part of a single fluidic device within which fluid channels 1210, 1212, and/or 1214 are integrated. Alternatively, pistons 416A-B may be part of separate fluidic devices, and portions of fluid channels 1210, 1212, and/or 1214 may be external fluid connections between the separate fluidic devices.

Figure 13:
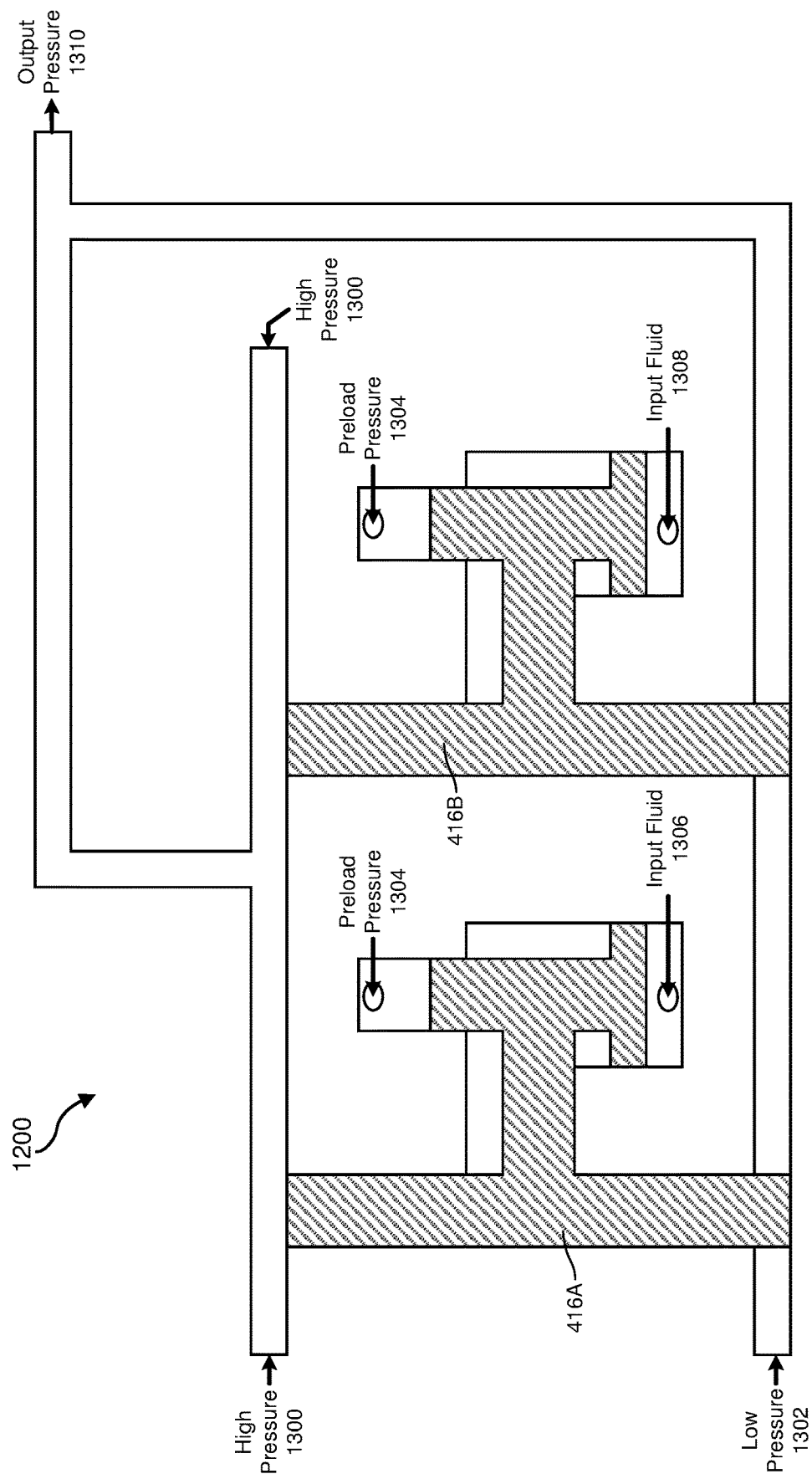
FIG. 13 is a schematic diagram of the exemplary fluidic logic gate of FIG. 12 configured to perform a NAND operation, according to at least one embodiment of the present disclosure.
Figure 14A:
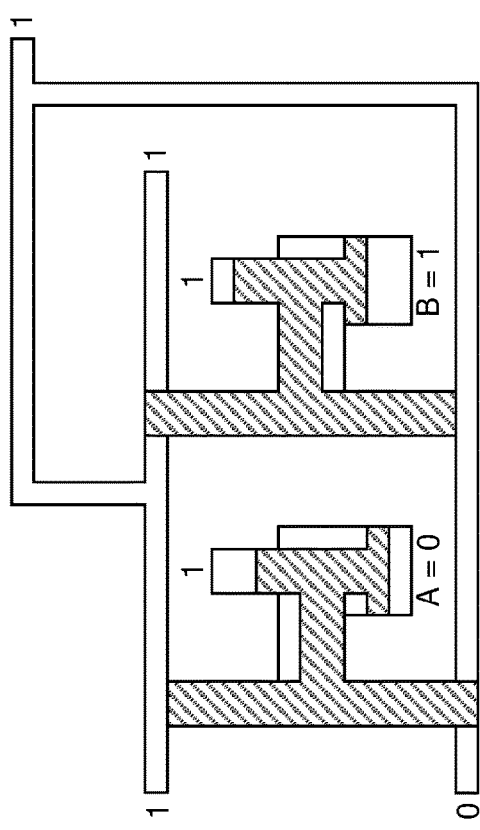
FIGS. 14A-14D are state diagrams of the exemplary fluidic logic gate of FIG. 13, according to at least one embodiment of the present disclosure.
Figure 14B:
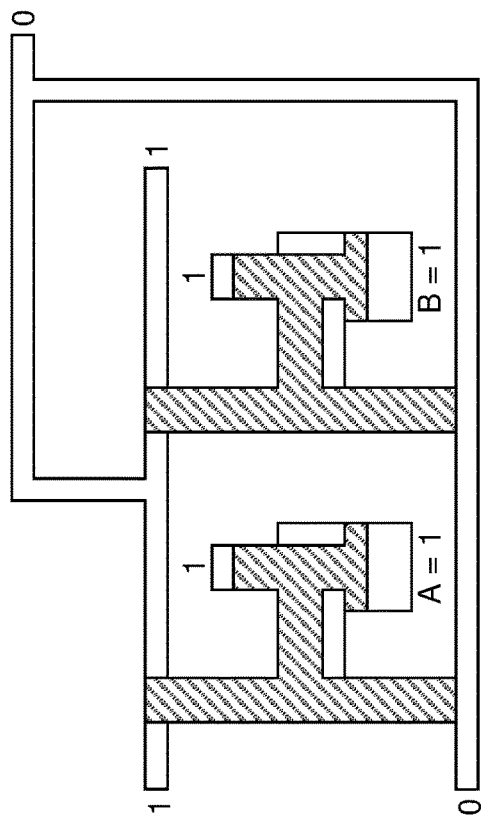
Figure 14C:
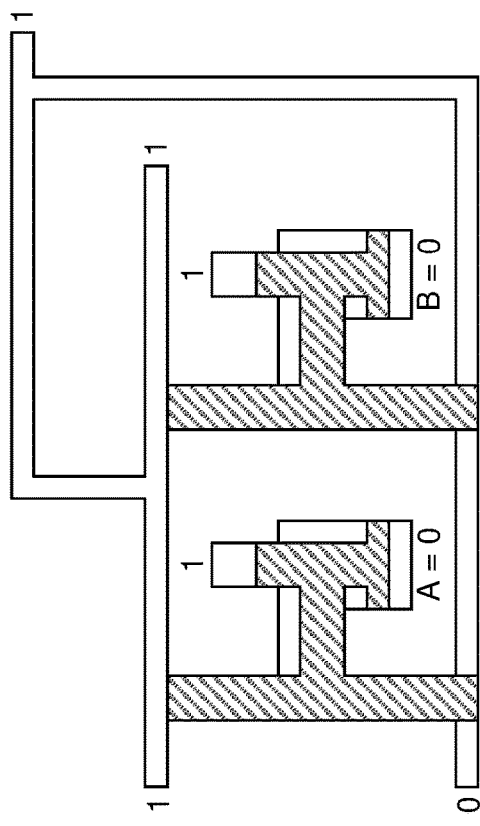
Figure 14D:
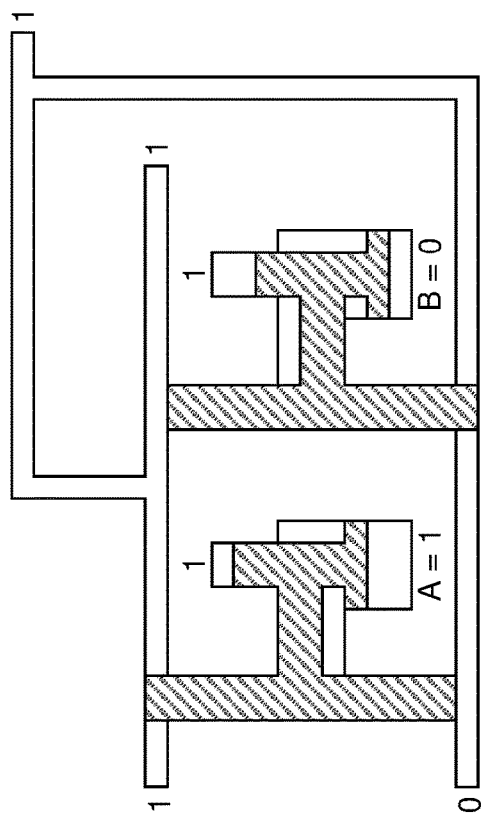

As shown in FIG. 13, in some examples, fluidic logic gate 1200 may be configured to perform a NAND operation by applying (1) a high pressure 1300 to inlet ports 1202 and 1204, (2) a low pressure 1302 to inlet port 1206, (3) a preload pressure 1304 (e.g., high pressure 1300) to control ports 406A-B, (4) an input fluid 1306 (e.g., an input A) to control port 408A, and (5) an input fluid 1308 (e.g., an input B) to control port 408B. In this example, a result of the NAND operation may be seen as output pressure 1310 at outlet port 1208. As shown in FIG. 14A, if input fluid 1306 and input fluid 1308 both have a low pressure (e.g., a pressure lower than that of preload pressure 1304), then pistons 416A-B may be in the positions shown and high pressure 1300 may be routed from inlet port 1202 or inlet port 1204 through fluid channel 1210 or fluid channel 1212 to outlet port 1208. As shown in FIG. 14B, if input fluid 1306 has a low pressure (e.g., a pressure lower than that of preload pressure 1304) and input fluid 1308 has a sufficiently high pressure (e.g., a pressure equal to preload pressure 1304), then pistons 416A-B may be in the positions shown and high pressure 1300 may be routed from inlet port 1202 through fluid channel 1210 to outlet port 1208. As shown in FIG. 14C, if input fluid 1306 has a sufficiently high pressure (e.g., a pressure equal to preload pressure 1304) and input fluid 1308 has a low pressure (e.g., a pressure lower than that of preload pressure 1304), then pistons 416A-B may be in the positions shown and high pressure 1300 may be routed from inlet port 1204 through fluid channel 1212 to outlet port 1208. As shown in FIG. 14D, if input fluid 1306 and input fluid 1308 both have a sufficiently high pressure (e.g., a pressure equal to preload pressure 1304), then pistons 416A-B may be in the positions shown and low pressure 1302 may be routed from inlet port 1206 through fluid channel 1214 to outlet port 1208. FIG. 15 illustrates a NAND truth table 1500 that may represent the functionality of fluidic logic gate 1200 when configured as shown in FIG. 13.

Figure 16:
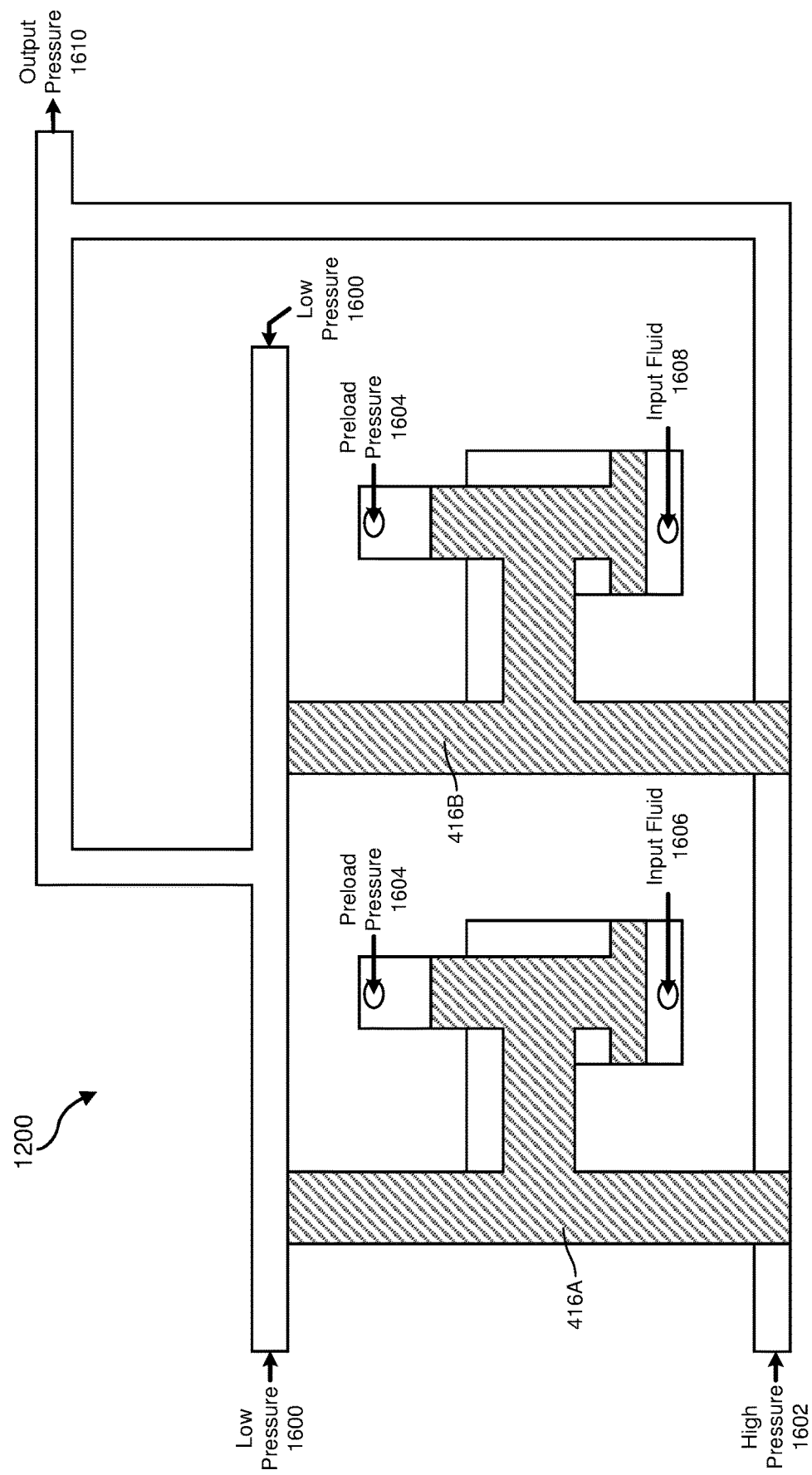
FIG. 16 is a schematic diagram of the exemplary fluidic logic gate of FIG. 12 configured to perform an AND operation, according to at least one embodiment of the present disclosure.
Figure 17A:
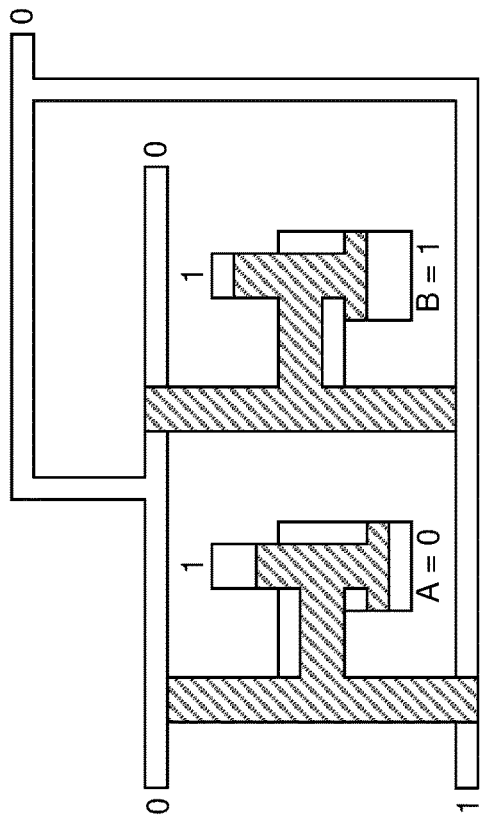
FIGS. 17A-17D are state diagrams of the exemplary fluidic logic gate of FIG. 16, according to at least one embodiment of the present disclosure.
Figure 17B:
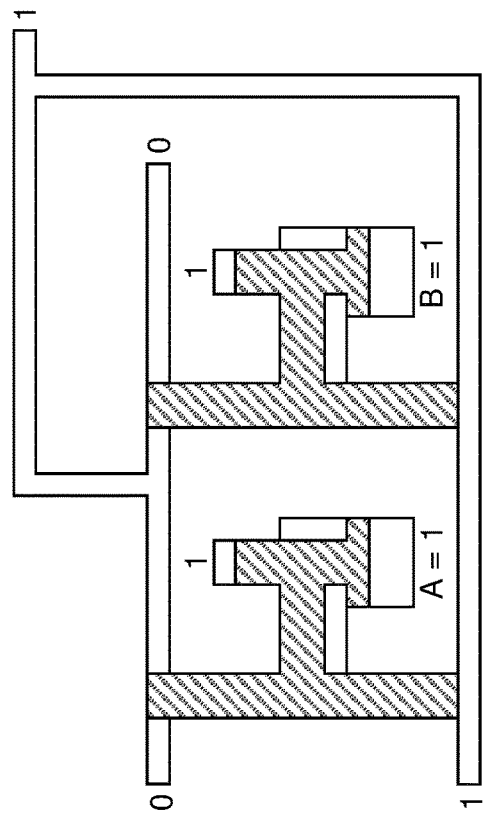
Figure 17C:
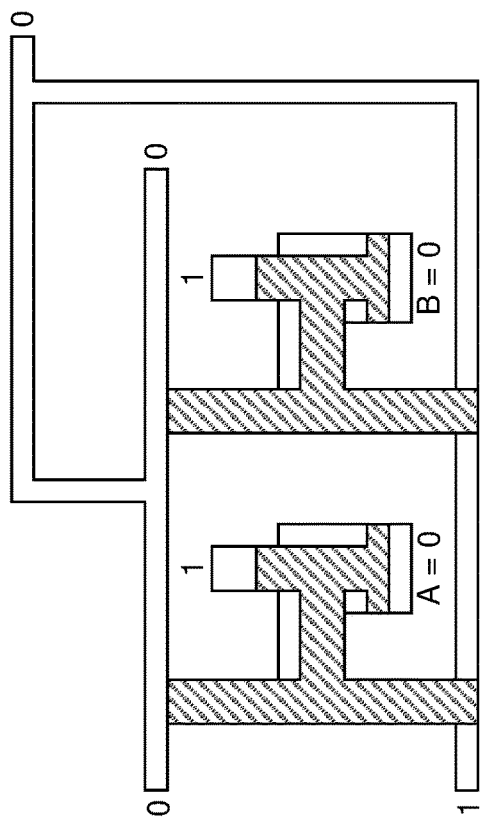
Figure 17D:
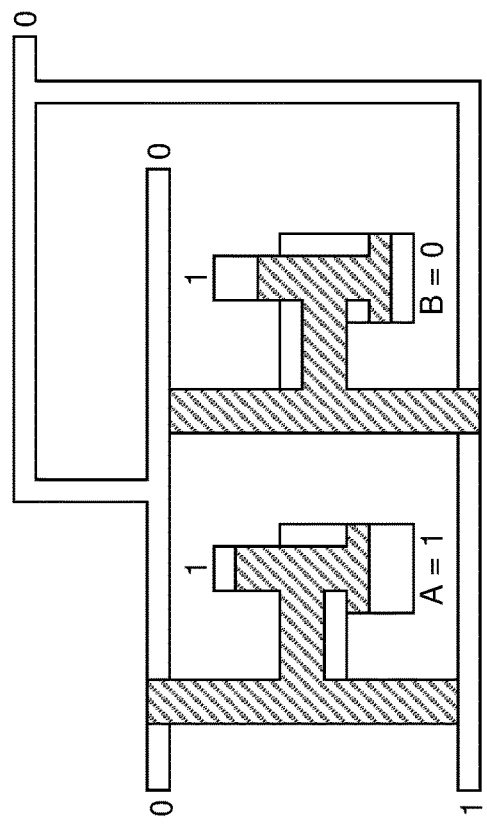

As shown in FIG. 16, in some examples, fluidic logic gate 1200 may be configured to perform an AND operation by applying (1) a low pressure 1600 to inlet ports 1202 and 1204, (2) a high pressure 1602 to inlet port 1206, (3) a preload pressure 1604 (e.g., high pressure 1602) to control ports 406A-B, (4) an input fluid 1606 (e.g., an input A) to control port 408A, and (5) an input fluid 1608 (e.g., an input B) to control port 408B. In this example, a result of the AND operation may be seen as output pressure 1610 at outlet port 1208. As shown in FIG. 17A, if input fluid 1606 and input fluid 1608 both have a low pressure (e.g., a pressure lower than that of preload pressure 1604), then pistons 416A-B may be in the positions shown and low pressure 1600 may be routed from inlet port 1202 or inlet port 1204 through fluid channel 1210 or fluid channel 1212 to outlet port 1208. As shown in FIG. 17B, if input fluid 1606 has a low pressure (e.g., a pressure lower than that of preload pressure 1604) and input fluid 1608 has a sufficiently high pressure (e.g., a pressure equal to preload pressure 1604), then pistons 416A-B may be in the positions shown and low pressure 1600 may be routed from inlet port 1202 through fluid channel 1210 to outlet port 1208. As shown in FIG. 17C, if input fluid 1606 has a sufficiently high pressure (e.g., a pressure equal to preload pressure 1604) and input fluid 1608 has a low pressure (e.g., a pressure lower than that of preload pressure 1604), then pistons 416A-B may be in the positions shown and low pressure 1600 may be routed from inlet port 1204 through fluid channel 1212 to outlet port 1208. As shown in FIG. 17D, if input fluid 1606 and input fluid 1608 both have a sufficiently high pressure (e.g., a pressure equal to preload pressure 1604), then pistons 416A-B may be in the positions shown and high pressure 1602 may be routed from inlet port 1206 through fluid channel 1214 to outlet port 1208. FIG. 18 illustrates an AND truth table 1800 that may represent the functionality of fluidic logic gate 1200 when configured as shown in FIG. 16.

Figure 19:
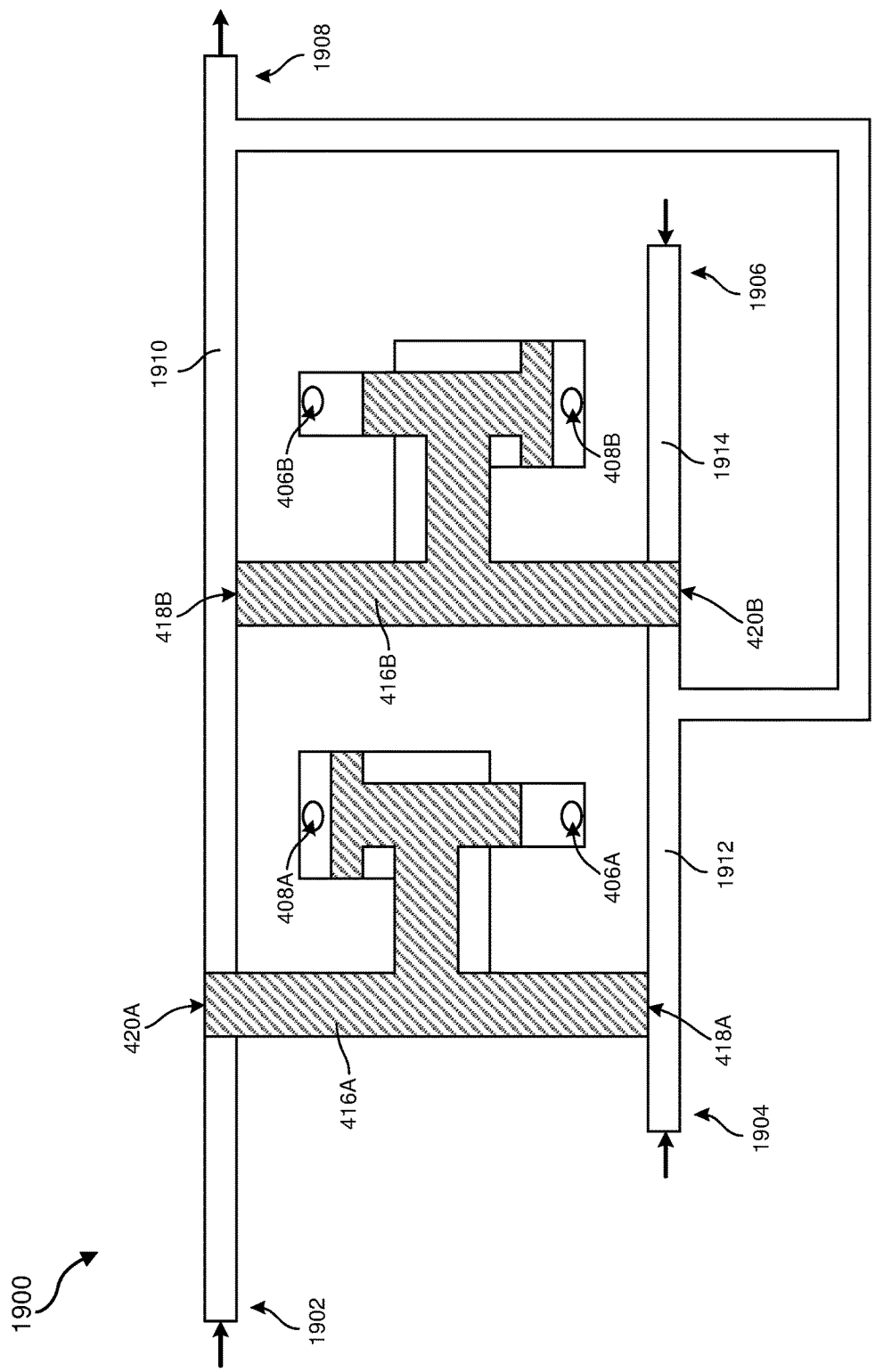
FIG. 19 is a schematic diagram of an exemplary fluidic logic gate, according to at least one embodiment of the present disclosure.

FIG. 19 illustrates a fluidic logic gate 1900 that may be configured to perform a material-implication (i.e., material-conditional) operation or a material-nonimplication operation. As shown in FIG. 19, fluidic logic gate 1900 may be configured using pistons 416A and 416B. As shown, fluidic logic gate 1900 may include an inlet port 1902, an inlet port 1904, an inlet port 1906, an outlet port 1908, a fluid channel 1910 configured to convey fluid from inlet port 1902 to outlet port 1908, a fluid channel 1912 configured to convey fluid from inlet port 1904 to outlet port 1908, a fluid channel 1914 configured to convey fluid from inlet port 1906 to outlet port 1908, and pistons 416A-B.

Piston 416A may include a restricting gate transmission element 418A configured to unblock fluid channel 1912 when piston 416A is in the position illustrated in FIG. 19 and block or restrict fluid channel 1912 when a sufficient pressure is applied to control port 408A to overcome any pressure applied to control port 406A and force piston 416A downward. Similarly, piston 416B may include a restricting gate transmission element 418B configured to unblock fluid channel 1910 when piston 416B is in the position illustrated in FIG. 19 and block or restrict fluid channel 1910 when enough pressure is applied to control port 408B to overcome any pressure applied to control port 406B and force piston 416B upward. Piston 416A may also include a restricting gate transmission element 420A configured to block or restrict fluid channel 1910 when piston 416A is in the position illustrated in FIG. 19 and unblock fluid channel 1910 when enough pressure is applied to control port 408A to overcome any pressure applied to control port 406A and force piston 416A downward. Similarly, piston 416B may include a restricting gate transmission element 420B configured to block or restrict fluid channel 1914 when piston 416B is in the position illustrated in FIG. 19 and unblock fluid channel 1914 when enough pressure is applied to control port 408B to overcome any pressure applied to control port 406B and force piston 416B upward. In some examples, pistons 416A-B may be part of a single fluidic device within which fluid channels 1910, 1912, and/or 1914 are integrated. Alternatively, pistons 416A-B may be part of separate fluidic devices, and portions of fluid channels 1910, 1912, and/or 1914 may be external fluid connections between the separate fluidic devices.

Figure 20:
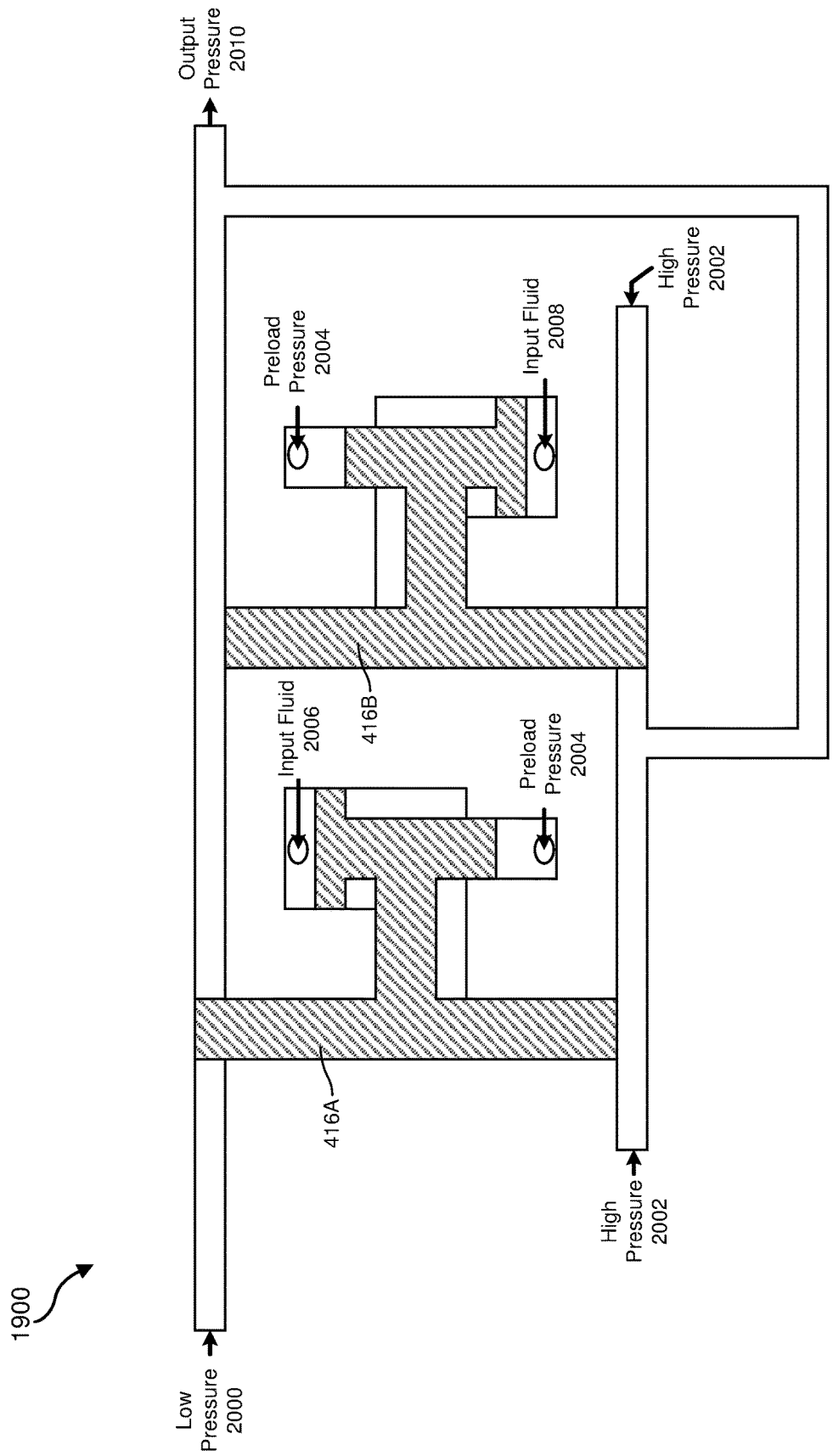
FIG. 20 is a schematic diagram of the exemplary fluidic logic gate of FIG. 19 configured to perform a material implication operation, according to at least one embodiment of the present disclosure.
Figure 21A:
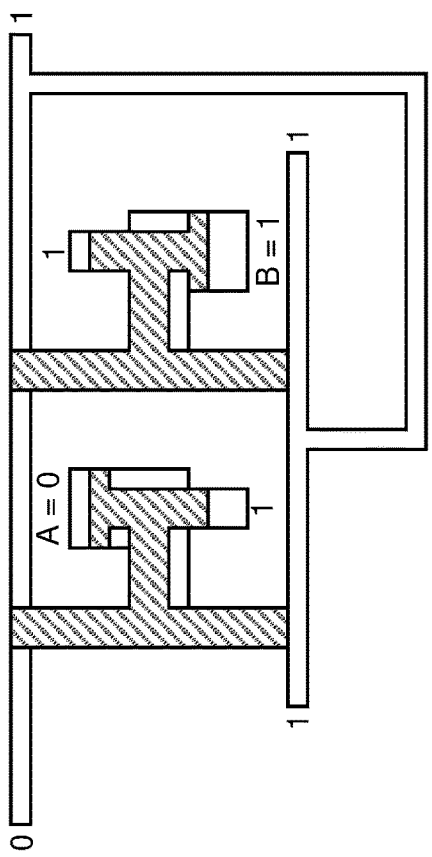
FIGS. 21A-21D are state diagrams of the exemplary fluidic logic gate of FIG. 20, according to at least one embodiment of the present disclosure.
Figure 21B:
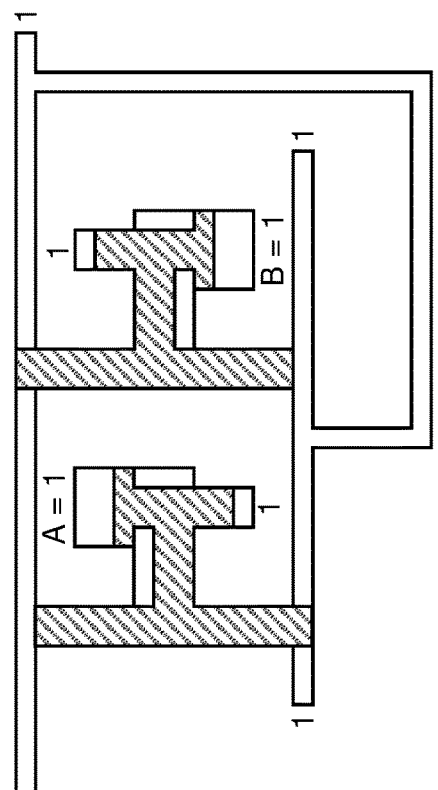
Figure 21C:
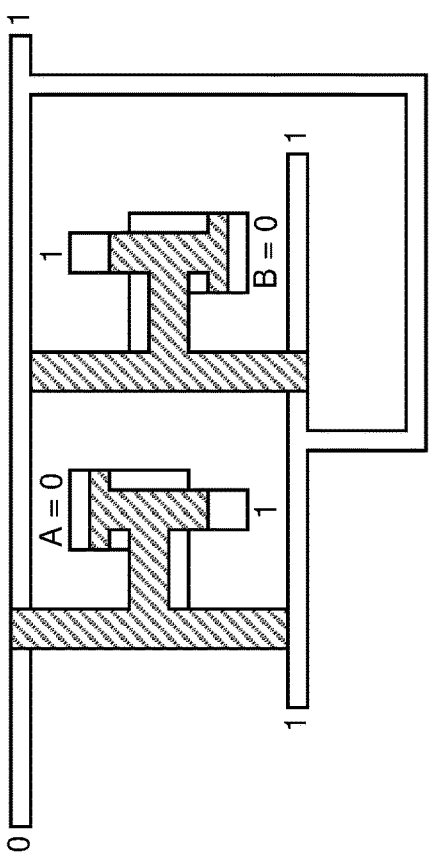
Figure 21D:
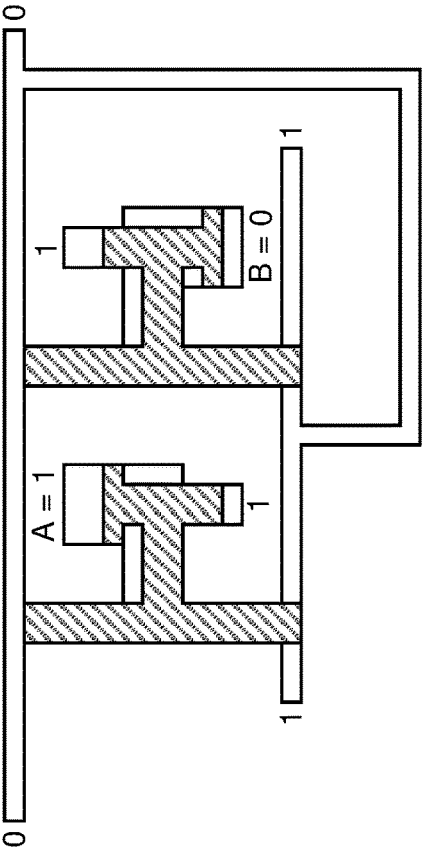

As shown in FIG. 20, in some examples, fluidic logic gate 1900 may be configured to perform a material-implication operation by applying (1) a low pressure 2000 to inlet port 1902, (2) a high pressure 2002 to inlet ports 1904 and 1906, (3) a preload pressure 2004 (e.g., high pressure 2002) to control ports 406A-B, (4) an input fluid 2006 (e.g., an input A) to control port 408A, and (5) an input fluid 2008 (e.g., an input B) to control port 408B. In this example, a result of the material-implication operation may be seen as output pressure 2010 at outlet port 1908. As shown in FIG. 21A, if input fluid 2006 and input fluid 2008 both have a low pressure (e.g., a pressure lower than that of preload pressure 2004), then pistons 416A-B may be in the positions shown and high pressure 2002 may be routed from inlet port 1904 through fluid channel 1912 to outlet port 1908. As shown in FIG. 21B, if input fluid 2006 has a low pressure (e.g., a pressure lower than that of preload pressure 2004) and input fluid 2008 has a sufficiently high pressure (e.g., a pressure equal to preload pressure 2004), then pistons 416A-B may be in the positions shown and high pressure 2002 may be routed from inlet port 1904 or inlet port 1906 through fluid channel 1912 or fluid channel 1914 to outlet port 1908. As shown in FIG. 21C, if input fluid 2006 has a sufficiently high pressure (e.g., a pressure equal to preload pressure 2004) and input fluid 2008 has a low pressure (e.g., a pressure lower than that of preload pressure 2004), then pistons 416A-B may be in the positions shown and low pressure 2000 may be routed from inlet port 1902 through fluid channel 1910 to outlet port 1908. As shown in FIG. 21D, if input fluid 2006 and input fluid 2008 both have a sufficiently high pressure (e.g., a pressure equal to preload pressure 2004), then pistons 416A-B may be in the positions shown and high pressure 2002 may be routed from inlet port 1906 through fluid channel 1914 to outlet port 1908. FIG. 22 illustrates a material-implication truth table 2200 that may represent the functionality of fluidic logic gate 1900 when configured as shown in FIG. 20.

Figure 23:
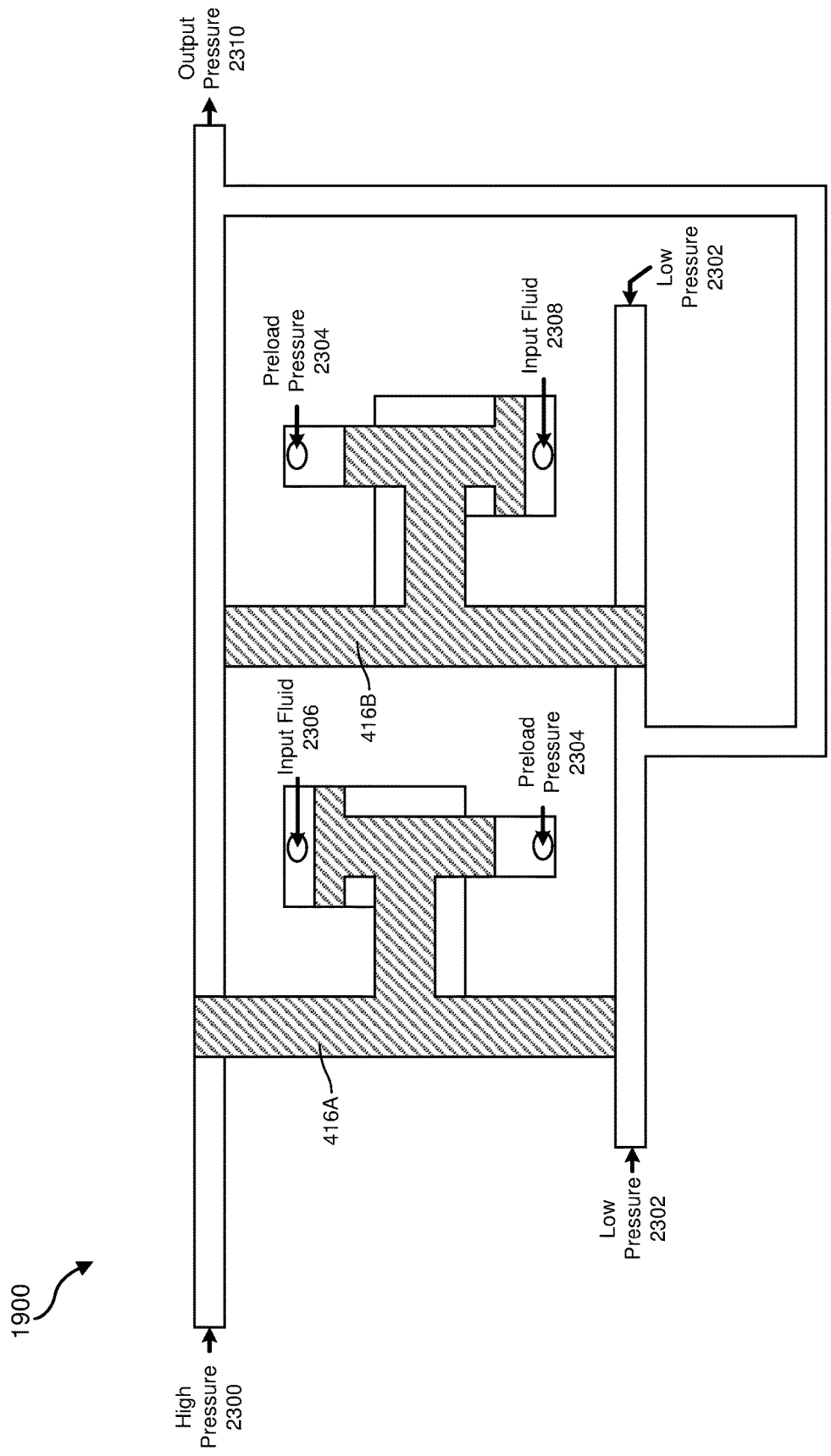
FIG. 23 is a schematic diagram of the exemplary fluidic logic gate of FIG. 19 configured to perform a material nonimplication operation, according to at least one embodiment of the present disclosure.
Figure 24A:
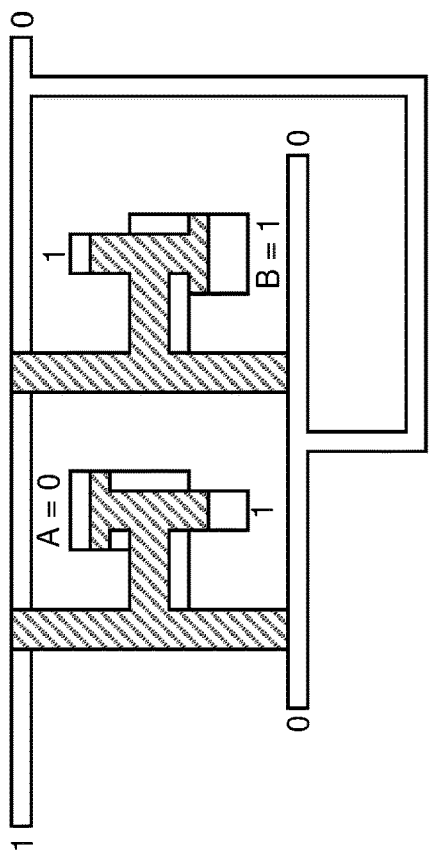
FIGS. 24A-24D are state diagrams of the exemplary fluidic logic gate of FIG. 23, according to at least one embodiment of the present disclosure.
Figure 24B:
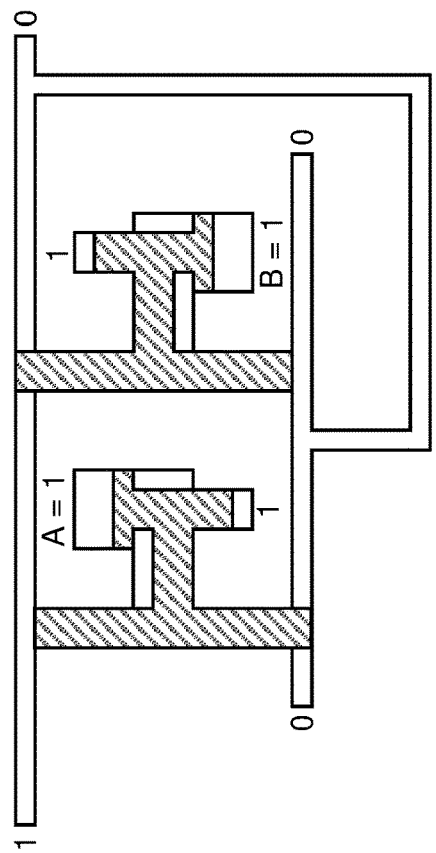
Figure 24C:
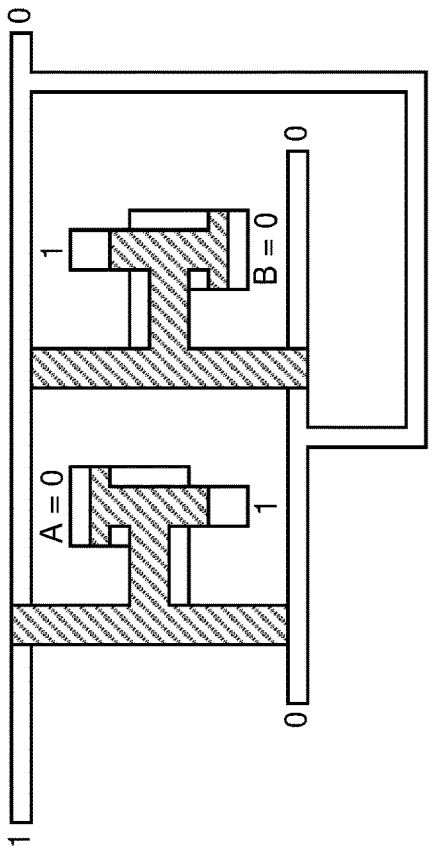
Figure 24D:
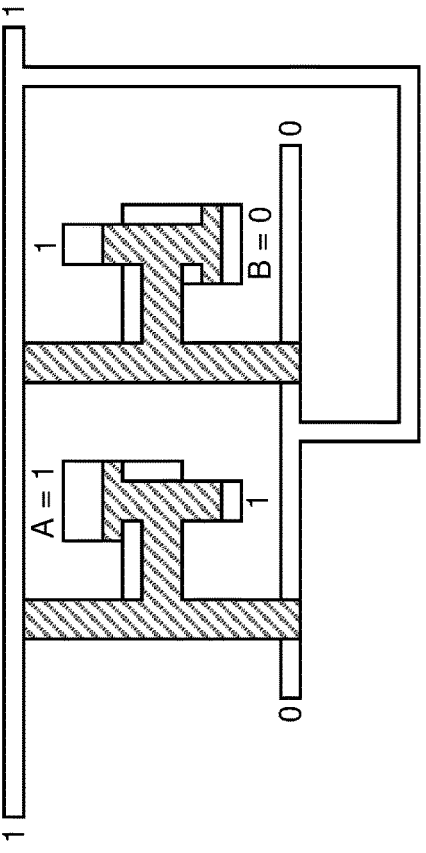

As shown in FIG. 23, in some examples, fluidic logic gate 1900 may be configured to perform a material-nonimplication operation by applying (1) a high pressure 2300 to inlet port 1902, (2) a low pressure 2302 to inlet ports 1904 and 1906, (3) a preload pressure 2304 (e.g., high pressure 2300) to control ports 406A-B, (4) an input fluid 2306 (e.g., an input A) to control port 408A, and (5) an input fluid 2308 (e.g., an input B) to control port 408B. In this example, a result of the material-nonimplication operation may be seen as output pressure 2310 at outlet port 1908. As shown in FIG. 24A, if input fluid 2306 and input fluid 2308 both have a low pressure (e.g., a pressure lower than that of preload pressure 2304), then pistons 416A-B may be in the positions shown and low pressure 2302 may be routed from inlet port 1904 through fluid channel 1912 to outlet port 1908. As shown in FIG. 24B, if input fluid 2306 has a low pressure (e.g., a pressure lower than that of preload pressure 2304) and input fluid 2308 has a sufficiently high pressure (e.g., a pressure equal to preload pressure 2304), then pistons 416A-B may be in the positions shown and low pressure 2302 may be routed from inlet port 1904 or inlet port 1906 through fluid channel 1912 or fluid channel 1914 to outlet port 1908. As shown in FIG. 24C, if input fluid 2306 has a sufficiently high pressure (e.g., a pressure equal to preload pressure 2304) and input fluid 2308 has a low pressure (e.g., a pressure lower than that of preload pressure 2304), then pistons 416A-B may be in the positions shown and high pressure 2300 may be routed from inlet port 1902 through fluid channel 1910 to outlet port 1908. As shown in FIG. 24D, if input fluid 2306 and input fluid 2308 both have a sufficiently high pressure (e.g., a pressure equal to preload pressure 2304), then pistons 416A-B may be in the positions shown and low pressure 2302 may be routed from inlet port 1906 through fluid channel 1914 to outlet port 1908. FIG. 25 illustrates a material-implication truth table 2500 that may represent the functionality of fluidic logic gate 1900 when configured as shown in FIG. 23.

Figure 26:
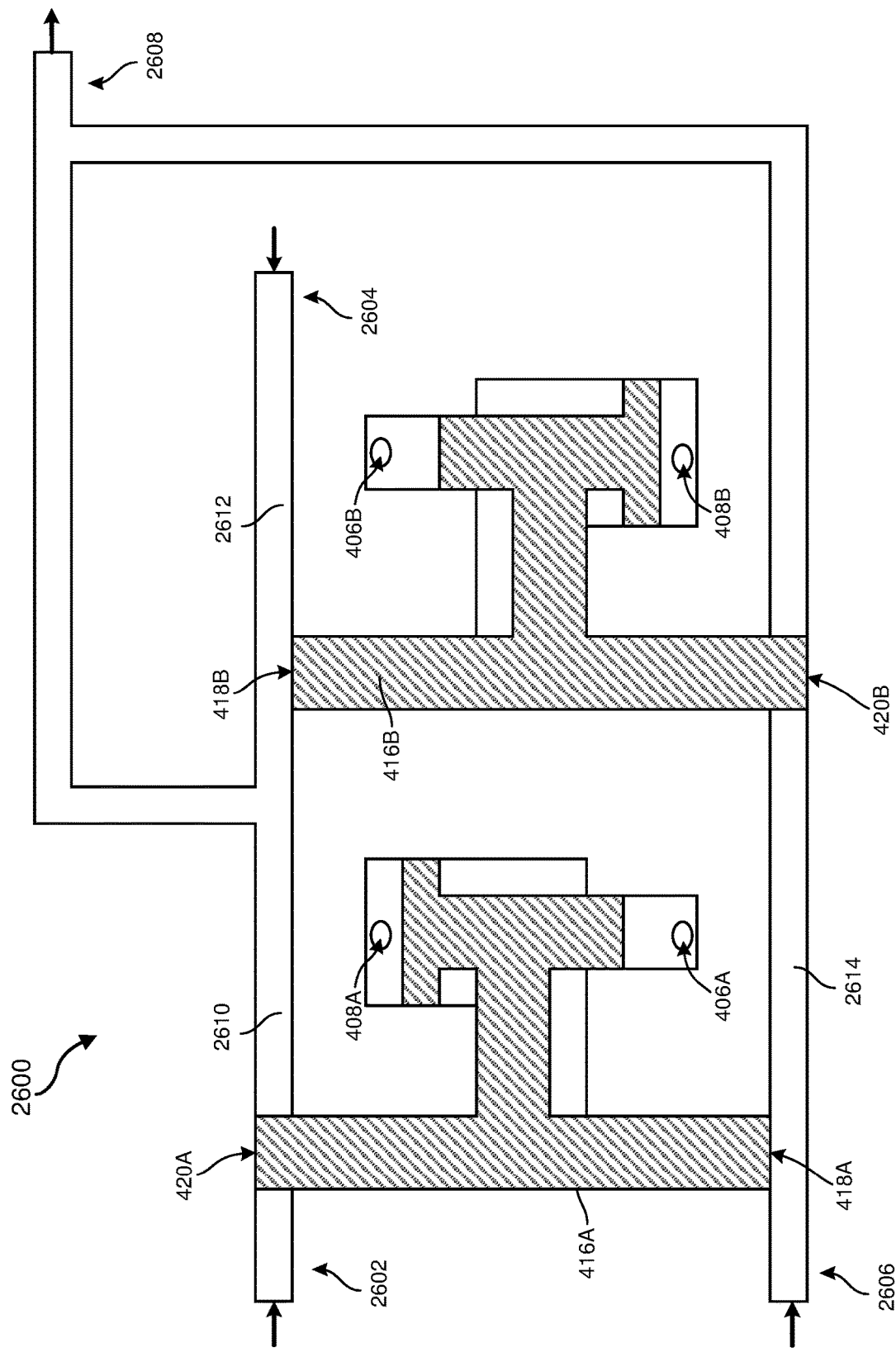
FIG. 26 is a schematic diagram of an exemplary fluidic logic gate, according to at least one embodiment of the present disclosure.

FIG. 26 illustrates a fluidic logic gate 2600 that may be configured to perform a converse-implication operation or a converse-nonimplication operation. As shown in FIG. 26, fluidic logic gate 2600 may be configured using pistons 416A and 416B. As shown, fluidic logic gate 2600 may include an inlet port 2602, an inlet port 2604, an inlet port 2606, an outlet port 2608, a fluid channel 2610 configured to convey fluid from inlet port 2602 to outlet port 2608, a fluid channel 2612 configured to convey fluid from inlet port 2604 to outlet port 2608, a fluid channel 2614 configured to convey fluid from inlet port 2606 to outlet port 2608, and pistons 416A-B.

Piston 416A may include a restricting gate transmission element 418A configured to unblock fluid channel 2614 when piston 416A is in the position illustrated in FIG. 26 and block or restrict fluid channel 2614 when a sufficient pressure is applied to control port 408A to overcome any pressure applied to control port 406A and force piston 416A downward. Similarly, piston 416B may include a restricting gate transmission element 418B configured to unblock fluid channel 2612 when piston 416B is in the position illustrated in FIG. 26 and block or restrict fluid channel 2612 when enough pressure is applied to control port 408B to overcome any pressure applied to control port 406B and force piston 416B upward. Piston 416A may also include a restricting gate transmission element 420A configured to block or restrict fluid channel 2610 when piston 416A is in the position illustrated in FIG. 26 and unblock fluid channel 2610 when enough pressure is applied to control port 408A to overcome any pressure applied to control port 406A and force piston 416A downward. Similarly, piston 416B may include a restricting gate transmission element 420B configured to block or restrict fluid channel 2614 when piston 416B is in the position illustrated in FIG. 26 and unblock fluid channel 2614 when enough pressure is applied to control port 408B to overcome any pressure applied to control port 406B and force piston 416B upward. In some examples, pistons 416A-B may be part of a single fluidic device within which fluid channels 2610, 2612, and/or 2614 are integrated. Alternatively, pistons 416A-B may be part of separate fluidic devices, and portions of fluid channels 2610, 2612, and/or 2614 may be external fluid connections between the separate fluidic devices.

In some examples, fluidic logic gate 2600 may be configured to perform a converse-implication operation by applying (1) a high pressure to inlet ports 2602 and 2604, (2) a low pressure to inlet port 2606, (3) a preload pressure (e.g., a high pressure) to control ports 406A-B, (4) an input fluid (e.g., an input A) to control port 408A, and (5) an additional input fluid (e.g., an input B) to control port 408B. Alternatively, fluidic logic gate 2600 may be configured to perform a converse-nonimplication operation by applying (1) a low pressure to inlet ports 2602 and 2604, (2) a high pressure to inlet port 2606, (3) a preload pressure (e.g., a high pressure) to control ports 406A-B, (4) an input fluid (e.g., an input A) to control port 408A, and (5) an additional input fluid (e.g., an input B) to control port 408B.

Figure 27:
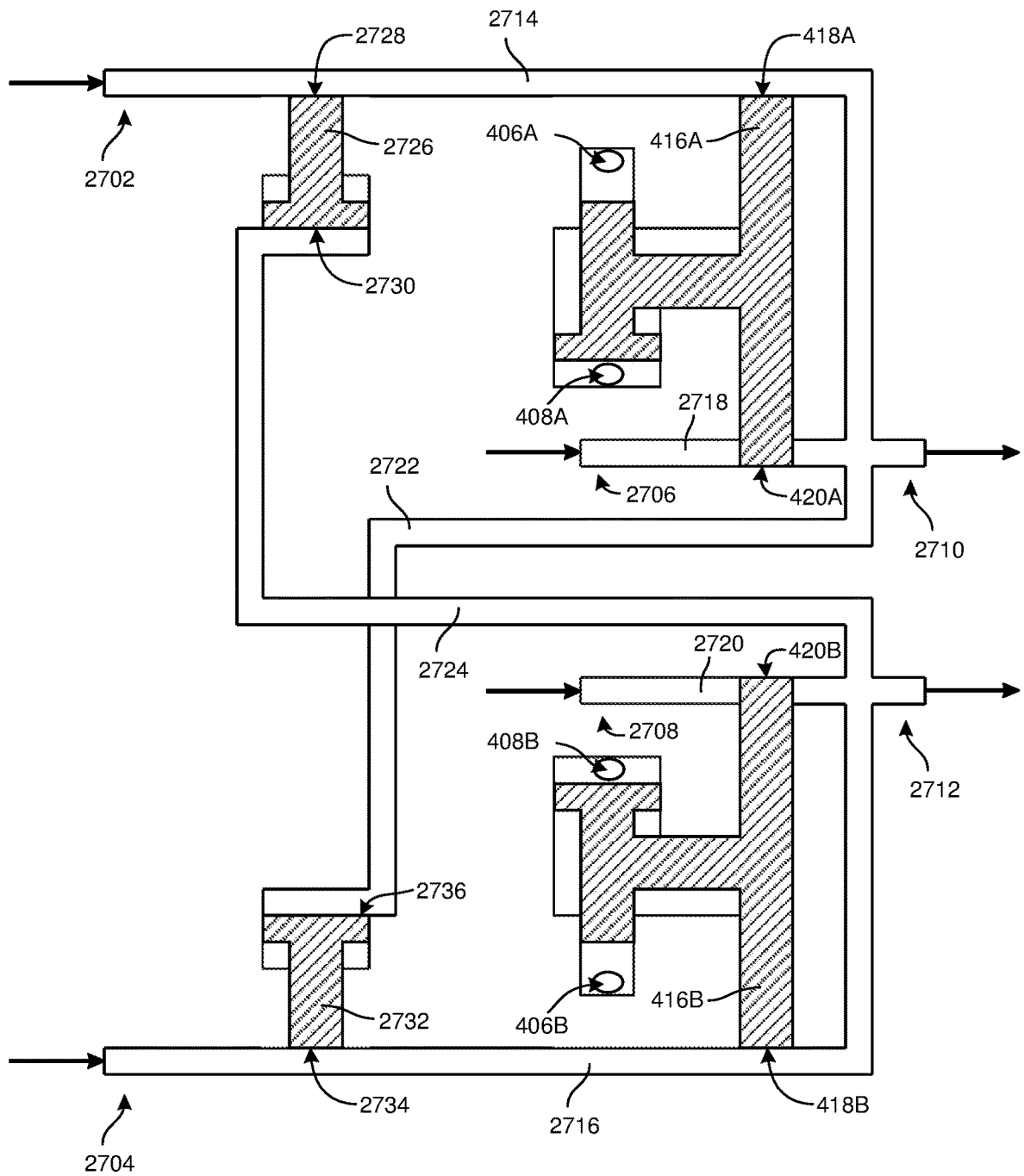
FIG. 27 is a schematic diagram of an exemplary fluidic set-reset latch, according to at least one embodiment of the present disclosure.

FIG. 27 illustrates a fluidic set-reset latch 2700 that may be configured to hold state and/or store information. As shown, fluidic set-reset latch 2700 may include pistons 416A-B and two normally open valves 2726 and 2732 (e.g., valves that are open when a control pressure is low and closed when the control pressure is high). Fluidic set-reset latch 2700 may include an inlet port 2702, an inlet port 2704, an inlet port 2706, an inlet port 2708, an outlet port 2710, and an outlet port 2712. Fluidic set-reset latch 2700 may also include a fluid channel 2714 configured to convey fluid from inlet port 2702 to outlet port 2710, a fluid channel 2716 configured to convey fluid from inlet port 2704 to outlet port 2712, a fluid channel 2718 configured to convey fluid from inlet port 2706 to outlet port 2710, a fluid channel 2720 configured to convey fluid from inlet port 2708 to outlet port 2712, a fluid channel 2722 configured to convey fluid from outlet port 2710 to normally open valve 2732, and a fluid channel 2724 configured to convey fluid from outlet port 2712 to normally open valve 2726. In some examples, normally open valves 2726 and 2732 and pistons 416A-B may be part of a single fluidic device within which fluid channels 2714-2724 are integrated. Alternatively, normally open valves 2726 and 2732 and pistons 416A-B may be part of separate fluidic devices, and portions of fluid channels 2714-2724 may be external fluid connections between the separate fluidic devices.

As shown in FIG. 27, piston 416A may include a restricting gate transmission element 418A configured to unblock fluid channel 2714 when piston 416A is in the position illustrated in FIG. 27 and block or restrict fluid channel 2714 when a sufficient pressure is applied to control port 408A to overcome any pressure applied to control port 406A and force piston 416A upward. Similarly, piston 416B may include a restricting gate transmission element 418B configured to unblock fluid channel 2716 when piston 416B is in the position illustrated in FIG. 27 and block or restrict fluid channel 2716 when enough pressure is applied to control port 408B to overcome any pressure applied to control port 406B and force piston 416B downward. Piston 416A may also include a restricting gate transmission element 420A configured to block or restrict fluid channel 2718 when piston 416A is in the position illustrated in FIG. 27 and unblock fluid channel 2718 when enough pressure is applied to control port 408A to overcome any pressure applied to control port 406A and force piston 416A upward. Similarly, piston 416B may include a restricting gate transmission element 420B configured to block or restrict fluid channel 2720 when piston 416B is in the position illustrated in FIG. 27 and unblock fluid channel 2720 when enough pressure is applied to control port 408B to overcome any pressure applied to control port 406B and force piston 416B downward. Normally open valve 2726 may include a restricting gate transmission element 2728 configured to unblock fluid channel 2714 when normally open valve 2726 is in the position illustrated in FIG. 27 and block or restrict fluid channel 2714 when a sufficient pressure is applied to a controlling gate transmission element 2730 to overcome any opposing forces and force normally open valve 2726 upward. Similarly, normally open valve 2732 may include a restricting gate transmission element 2734 configured to unblock fluid channel 2716 when normally open valve 2726 is in the position illustrated in FIG. 27 and block or restrict fluid channel 2716 when a sufficient pressure is applied to a controlling gate transmission element 2736 to overcome any opposing forces and force normally open valve 2726 downward.

Figure 28:
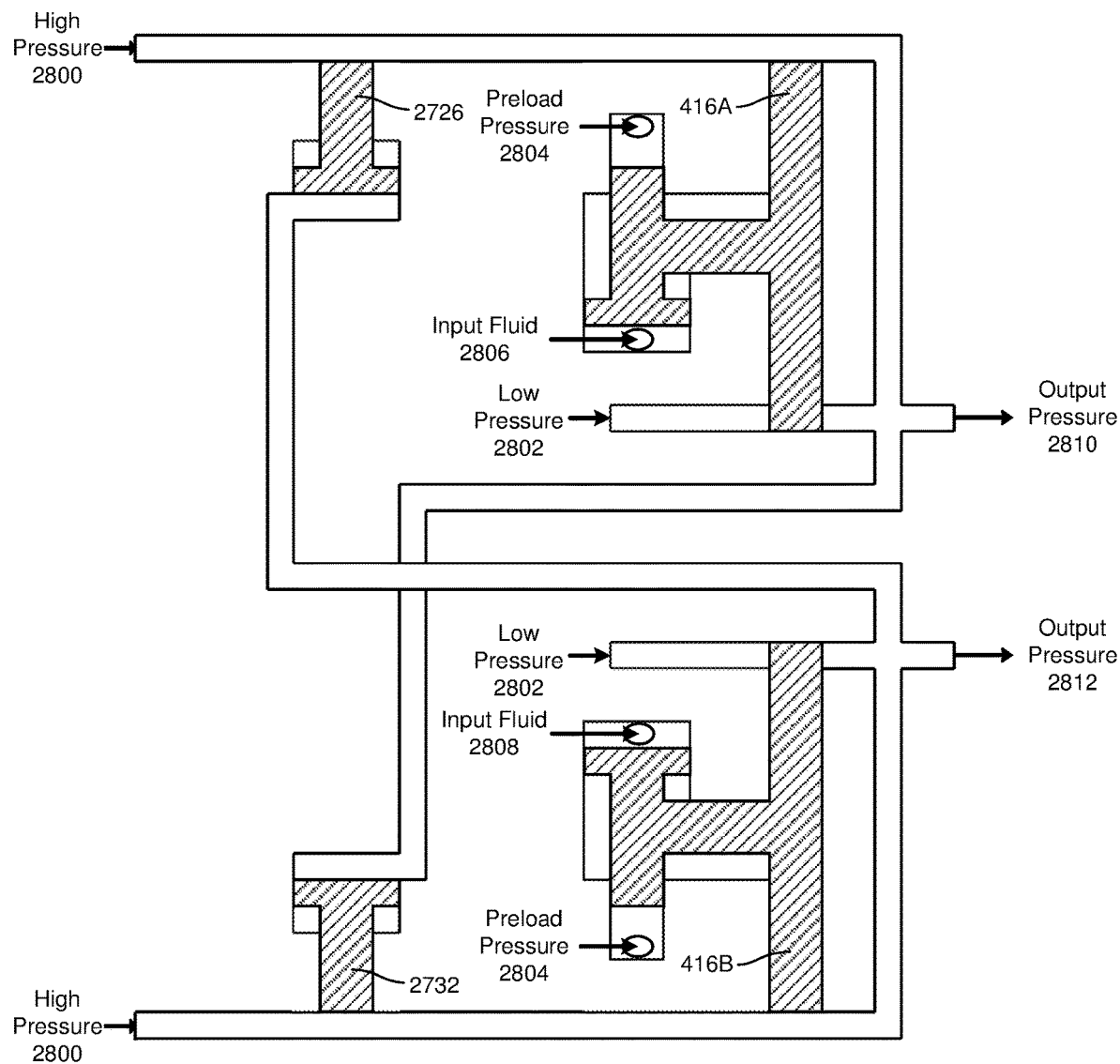
FIG. 28 is another schematic diagram of the exemplary fluidic set-reset latch of FIG. 27, according to at least one embodiment of the present disclosure.

As shown in FIG. 28, in some examples, fluidic set-reset latch 2700 may be configured to act as a fluidic set-reset latch by applying (1) a high pressure 2800 to inlet ports 2702 and 2704, (2) a low pressure 2802 to inlet ports 2706 and 2708, (3) a preload pressure 2804 (e.g., high pressure 2800) to control ports 406A-B, (4) an input fluid 2806 (e.g., an input A, which may act as a reset-command input) to control port 408A, and (5) an input fluid 2808 (e.g., an input B, which may act as a set-command input) to control port 408B. In this example, a stored state of fluidic set-reset latch 2700 may be seen as output pressures 2810 or 2812.

Figure 29:
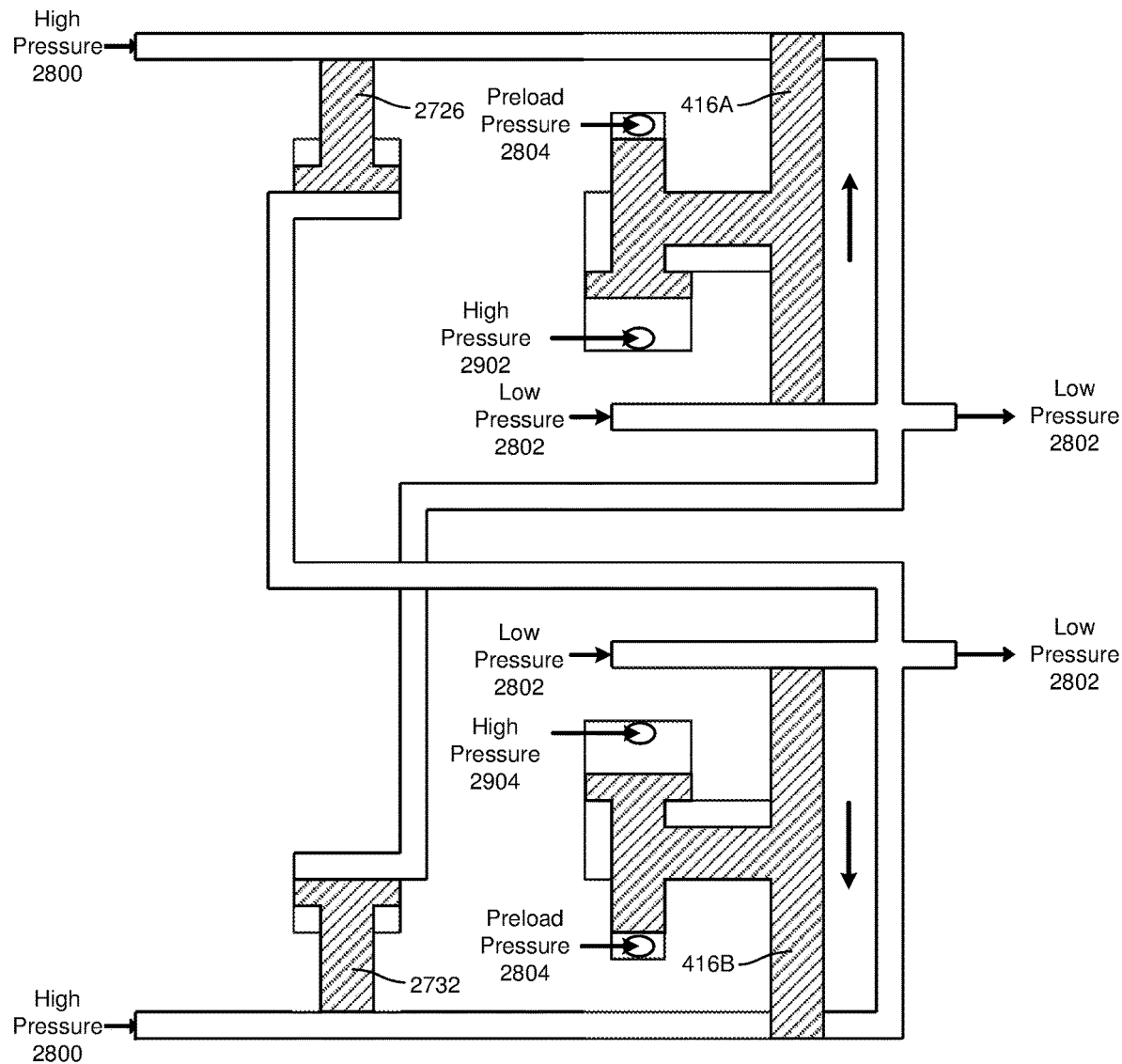
FIGS. 29-33 are state diagrams of the exemplary fluidic set-reset latch of FIG. 27, according to at least one embodiment of the present disclosure.

FIGS. 29-34 illustrate various possible states and state transitions of fluidic set-reset latch 2700. As shown in FIG. 29, if input fluid 2806 and input fluid 2808 respectively have sufficiently high pressure 2902 and high pressure 2904 (e.g., a pressure equal to preload pressure 2804), then pistons 416A-B may be in the positions shown. In this state, restricting gate transmission element 418A of piston 416A may block fluid channel 2714, and restricting gate transmission element 418B of piston 416B may block fluid channel 2716. As shown, low pressure 2802 may be routed from inlet port 2706 through fluid channel 2718 to outlet port 2710 and from outlet port 2710 through fluid channel 2722 to normally open valve 2732, which may remain open as a result. Low pressure 2802 may also be routed from inlet port 2708 through fluid channel 2720 to outlet port 2712 and from outlet port 2712 through fluid channel 2724 to normally open valve 2726, which may remain open as a result. In some embodiments, the state illustrated in FIG. 29 may represent a forbidden state of fluidic set-reset latch 2700.

Figure 30:
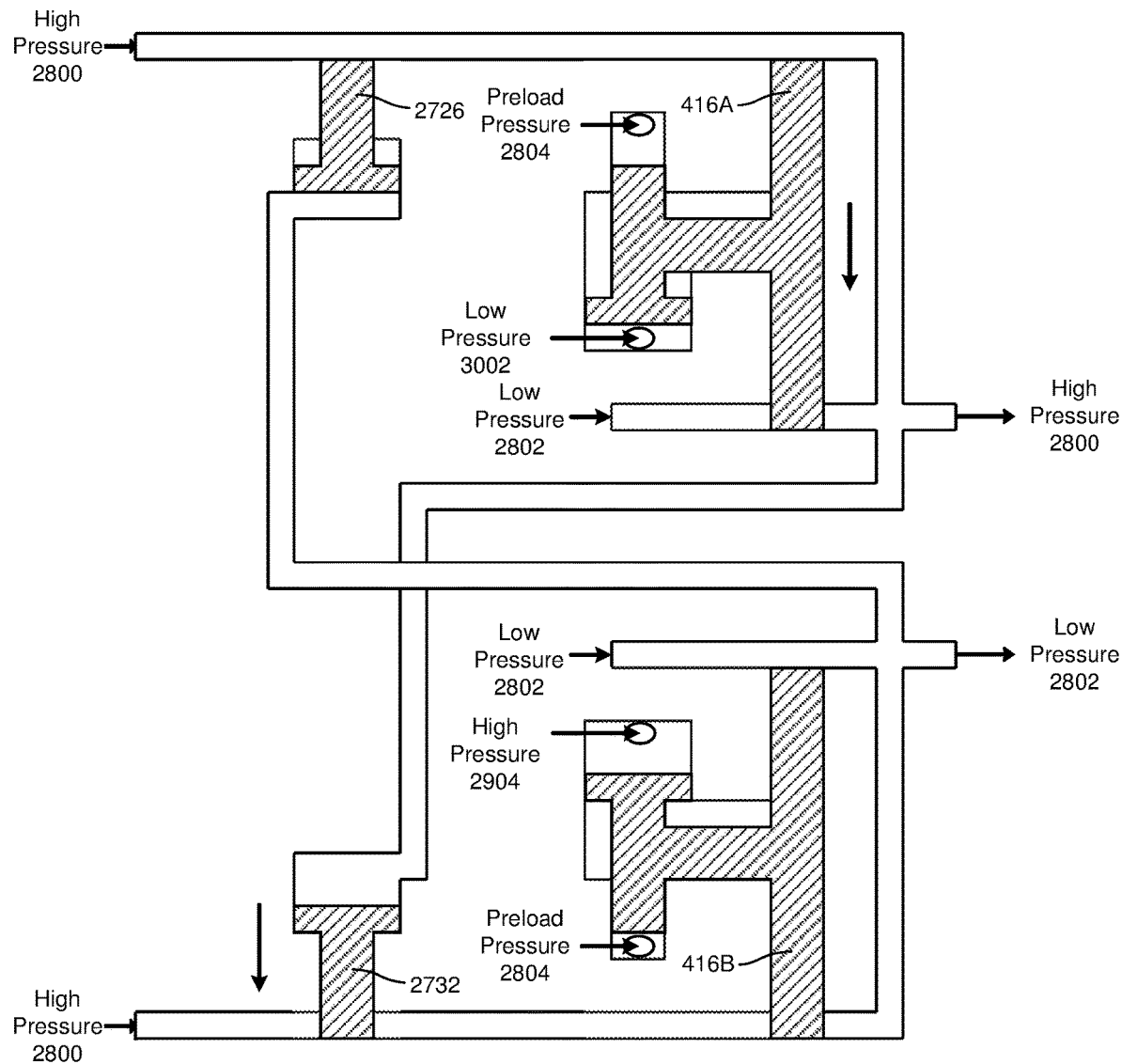

As shown in FIG. 30, if input fluid 2806 transitions from high pressure 2902 to low pressure 3002 and input fluid 2808 maintains high pressure 2904 or input fluid 2806 is at low pressure 3002 and input fluid 2808 is at high pressure 2904, then pistons 416A-B may be in the positions shown. In this state, restricting gate transmission element 418A of piston 416A may unblock fluid channel 2714, and restricting gate transmission element 418B of piston 416B may still block fluid channel 2716. As a result, high pressure 2800 may be routed from inlet port 2702 through fluid channel 2714 to outlet port 2710 and from outlet port 2710 through fluid channel 2722 to normally open valve 2732, which may close as a result and block fluid channel 2716. Low pressure 2802 may still be routed from inlet port 2708 through fluid channel 2720 to outlet port 2712 and from outlet port 2712 through fluid channel 2724 to normally open valve 2726, which may remain open as a result. In some embodiments, the state illustrated in FIG. 30 may represent a set state of fluidic set-reset latch 2700.

Figure 31:
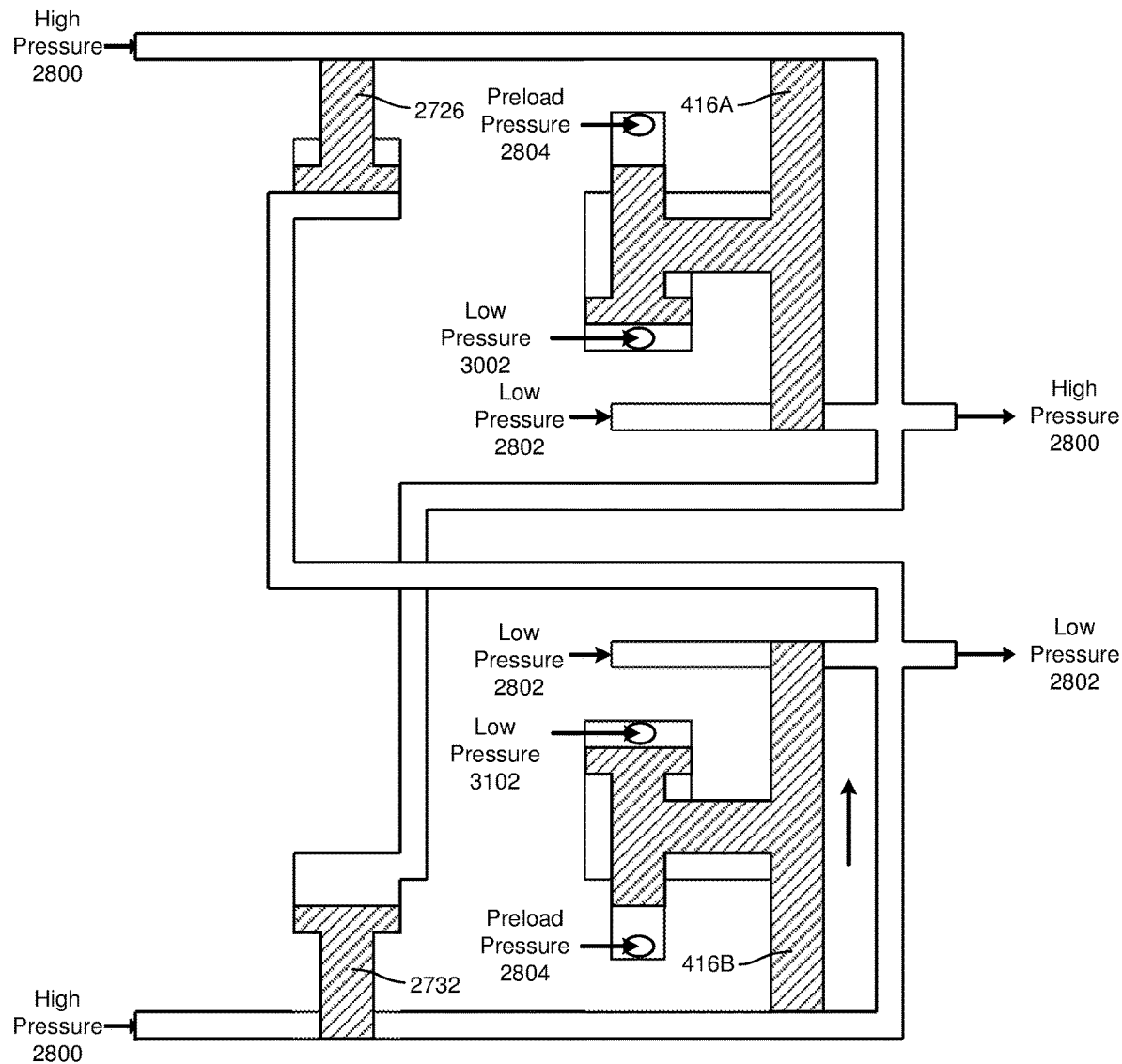

As shown in FIG. 31, if input fluid 2808 transitions from high pressure 2904 to low pressure 3102 and input fluid 2806 maintains low pressure 3002, then pistons 416A-B may transition to the positions shown. In this state, restricting gate transmission element 418B of piston 416B may unblock fluid channel 2716, and restricting gate transmission element 418A of piston 416A may still unblock fluid channel 2714. As a result, high pressure 2800 may be still be routed from inlet port 2702 through fluid channel 2714 to outlet port 2710 and from outlet port 2710 through fluid channel 2722 to normally open valve 2732, which may remain closed as a result and remain blocking fluid channel 2716. While restricting gate transmission element 420B may block fluid channel 2720, low pressure 2802 may still be routed from outlet port 2712 through fluid channel 2724 to normally open valve 2726, which may remain open as a result. In some embodiments, the state illustrated in FIG. 30 may represent a hold state of fluidic set-reset latch 2700.

Figure 32:
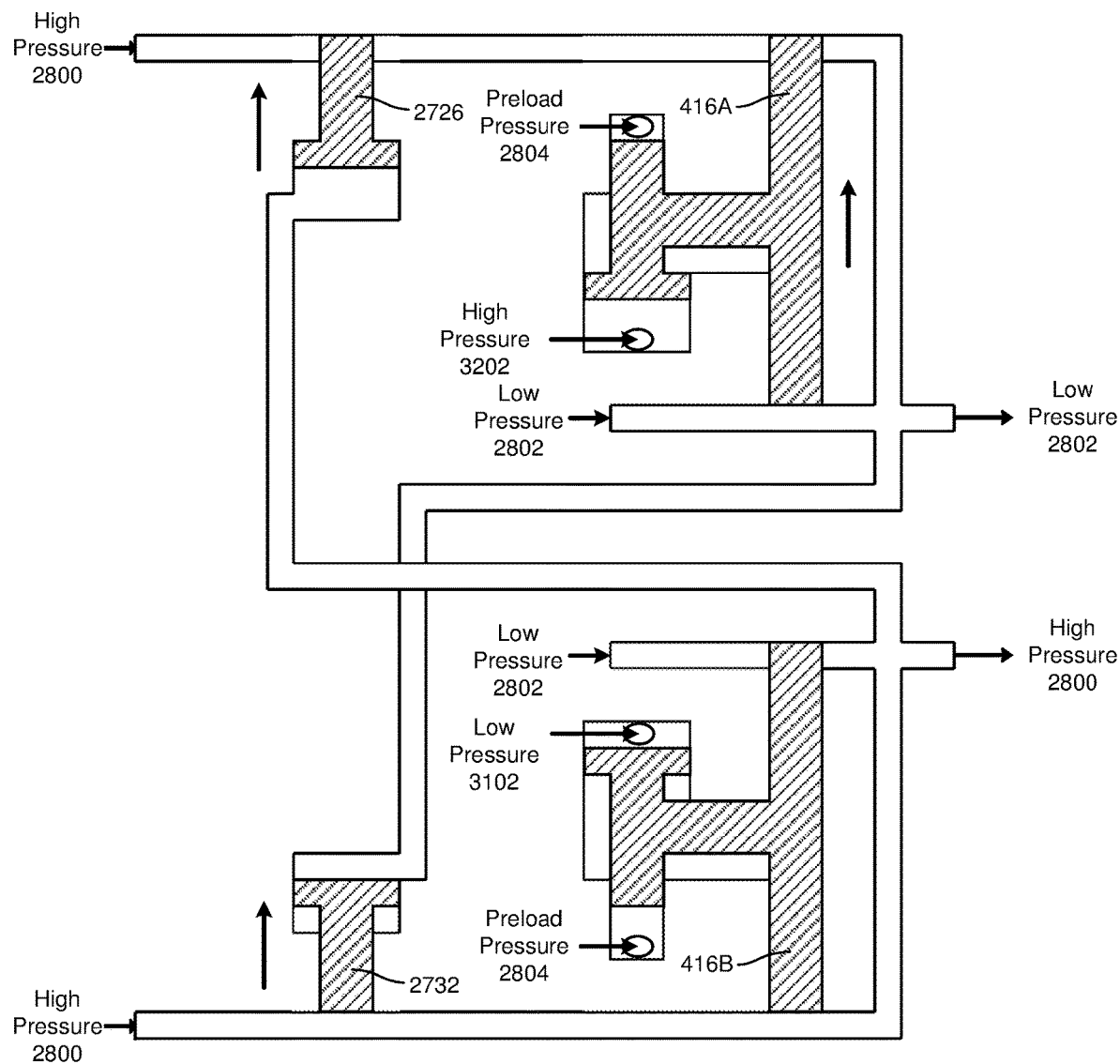

As shown in FIG. 32, if input fluid 2806 transitions from low pressure 3002 to high pressure 3202 and input fluid 2808 maintains low pressure 3102, then pistons 416A-B may transition to the positions shown. In this state, restricting gate transmission element 420A of piston 416A may unblock fluid channel 2718. As a result, low pressure 2802 may be routed from inlet port 2706 through fluid channel 2718 to outlet port 2710 and from outlet port 2710 through fluid channel 2722 to normally open valve 2732, which may open as a result. Since restricting gate transmission element 418A of piston 416B does not block fluid channel 2716, high pressure 2800 may be routed from inlet port 2704 to outlet port 2712 through fluid channel 2716 and from outlet port 2712 to normally open valve 2726 through fluid channel 2724, which may close as a result. In some embodiments, the state illustrated in FIG. 32 may represent a reset state of fluidic set-reset latch 2700.

Figure 33:
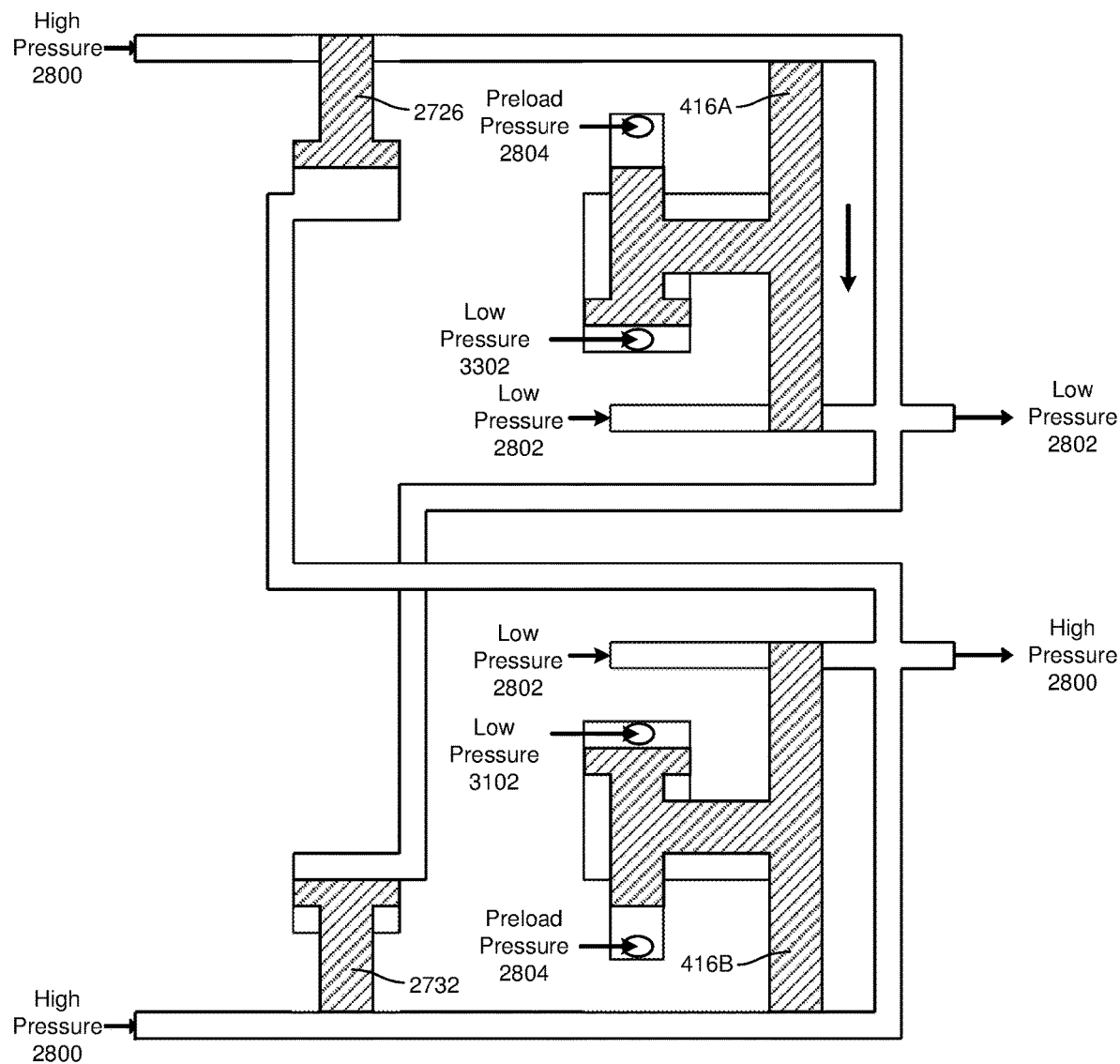

As shown in FIG. 33, if input fluid 2806 transitions from high pressure 3202 to low pressure 3302 and input fluid 2806 maintains low pressure 3102, then pistons 416A-B may transition to the positions shown. In this state, restricting gate transmission element 418A of piston 416A may unblock fluid channel 2714, and restricting gate transmission element 418B of piston 416B may still unblock fluid channel 2716. As a result, high pressure 2800 may be still be routed from inlet port 2704 through fluid channel 2716 to outlet port 2712 and from outlet port 2712 through fluid channel 2724 to normally open valve 2726, which may remain closed as a result and remain blocking fluid channel 2714. While restricting gate transmission element 420A may block fluid channel 2718, low pressure 2802 may still be routed from outlet port 2710 through fluid channel 2722 to normally open valve 2732, which may remain open as a result. In some embodiments, the state illustrated in FIG. 33 may represent a hold state of fluidic set-reset latch 2700. FIG. 34 illustrates a latch truth table 3400 that may represent the functionality of fluidic set-reset latch 2700 when configured as shown in FIG. 28.

Figure 35:
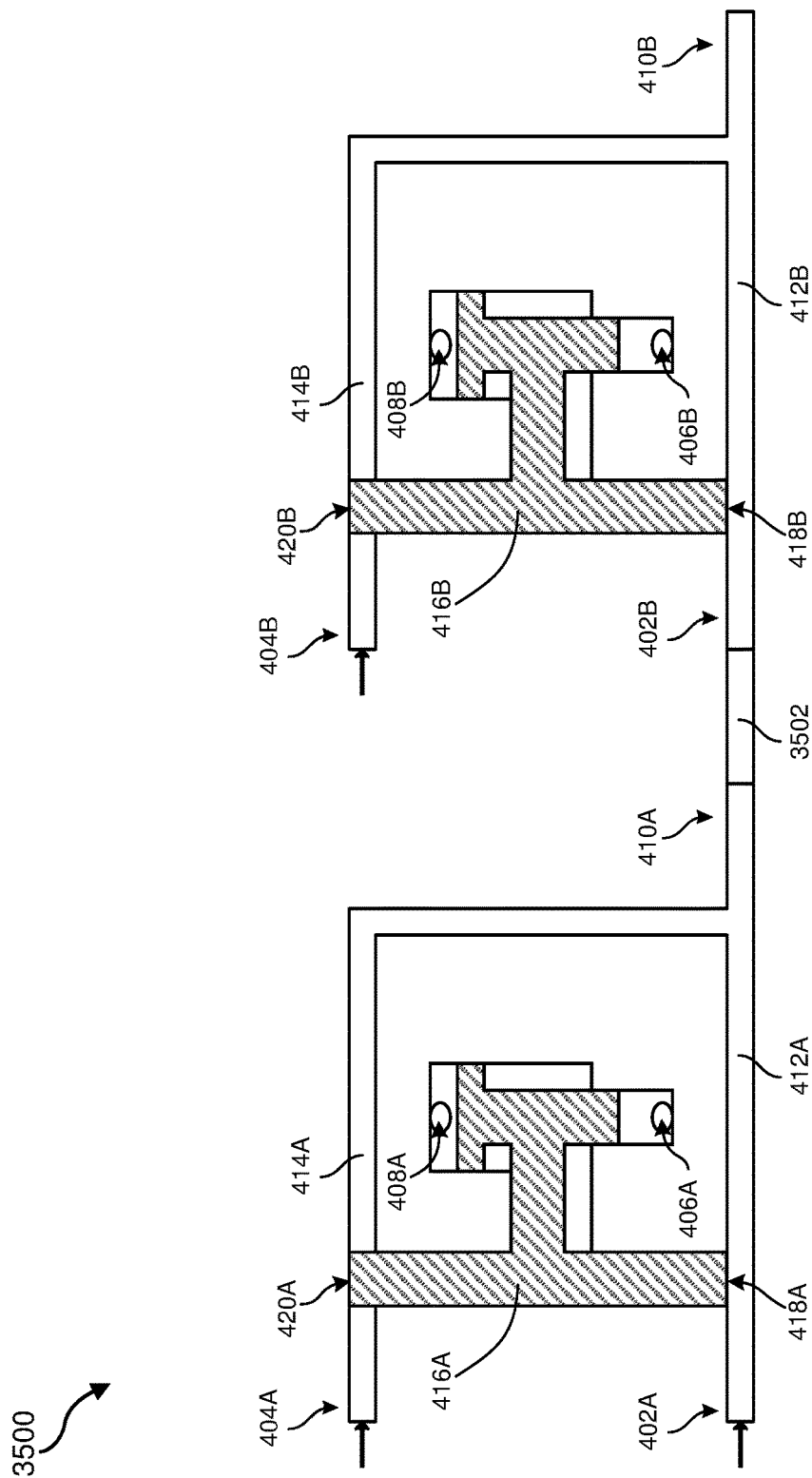
FIG. 35 is a schematic diagram of an exemplary fluidic logic gate, according to at least one embodiment of the present disclosure.

Some or all of the components of fluidic valve 400 in FIGS. 4A and 4B may be configured or modified to perform various functions and/or operations as part of a larger composite fluidic system. For example, as shown in FIG. 35, a fluidic logic gate 3500 may be configured using a fluidic valve 400A and a fluidic valve 400B in a pass-through configuration. As shown, outlet port 410A of fluidic valve 400A may be connected to inlet port 402B of fluidic valve 400B by a fluid channel 3502. In some examples, pistons 416A and 416B may be part of separate fluidic devices, and fluid channel 3502 may be an external fluid connection between the separate fluidic devices. Alternatively, the elements shown in FIG. 35 may be part of a single fluidic device within which fluid channels 412A, 414A, 412B, 414B, and 3502 are integrated. In the configurations shown, fluid channels 412A, 3502, and 412B may act as a single fluid channel connecting inlet port 402A to outlet port 410B. Likewise, fluid channels 414A, 3502, and 412B may act as another single fluid channel connecting inlet port 404A to outlet port 410B.

Figure 36:
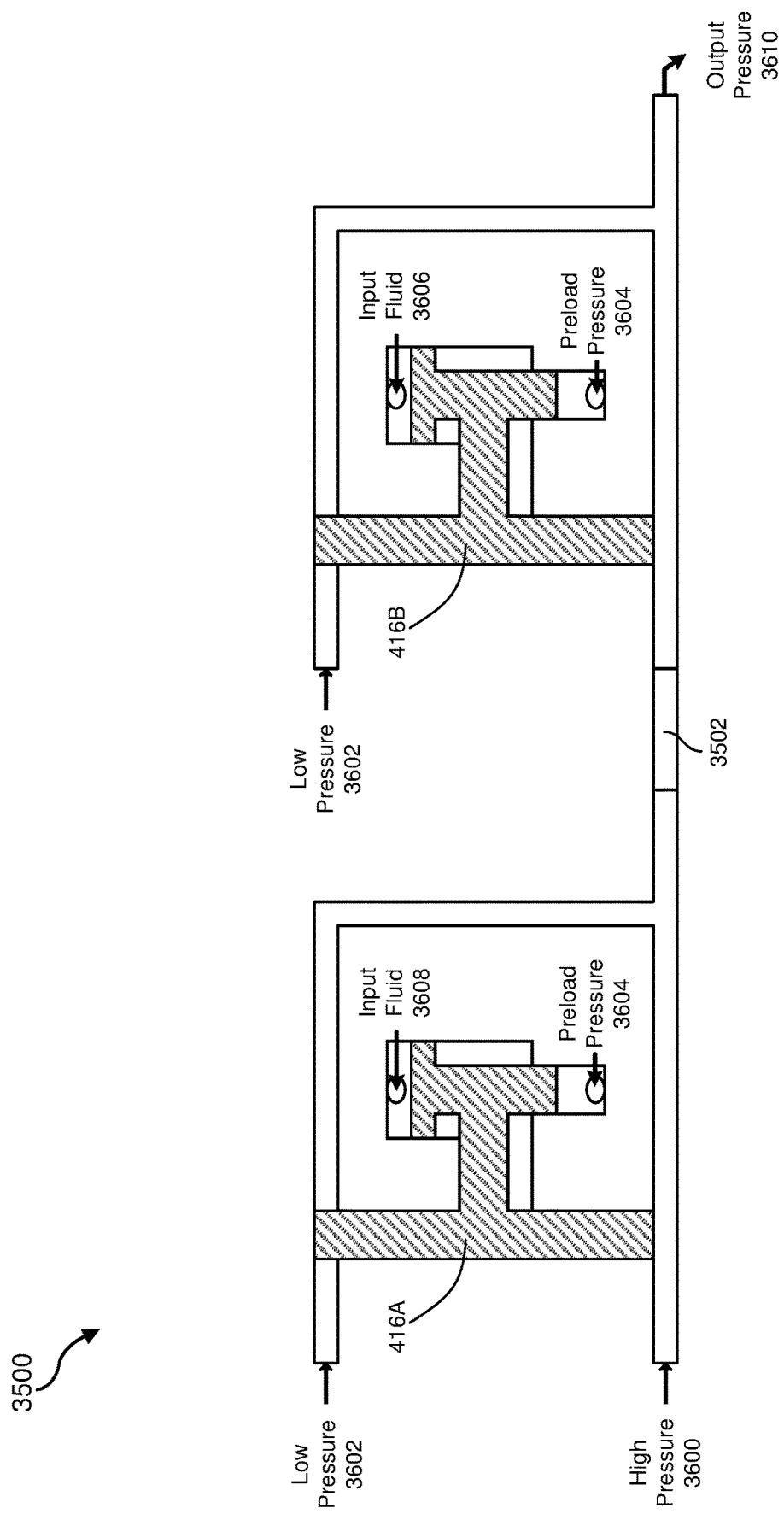
FIG. 36 is a schematic diagram of the exemplary fluidic logic gate of FIG. 35 configured to perform a NOR operation, according to at least one embodiment of the present disclosure.
Figure 37A:
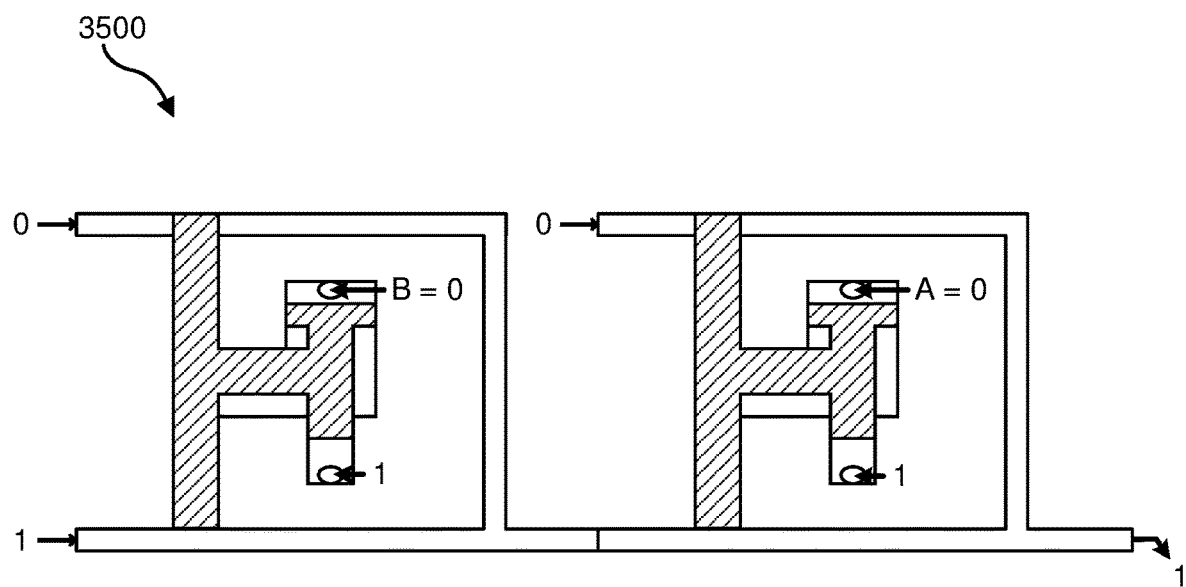
FIGS. 37A-38B are state diagrams of the exemplary fluidic logic gate of FIG. 36, according to at least one embodiment of the present disclosure.
Figure 37B:
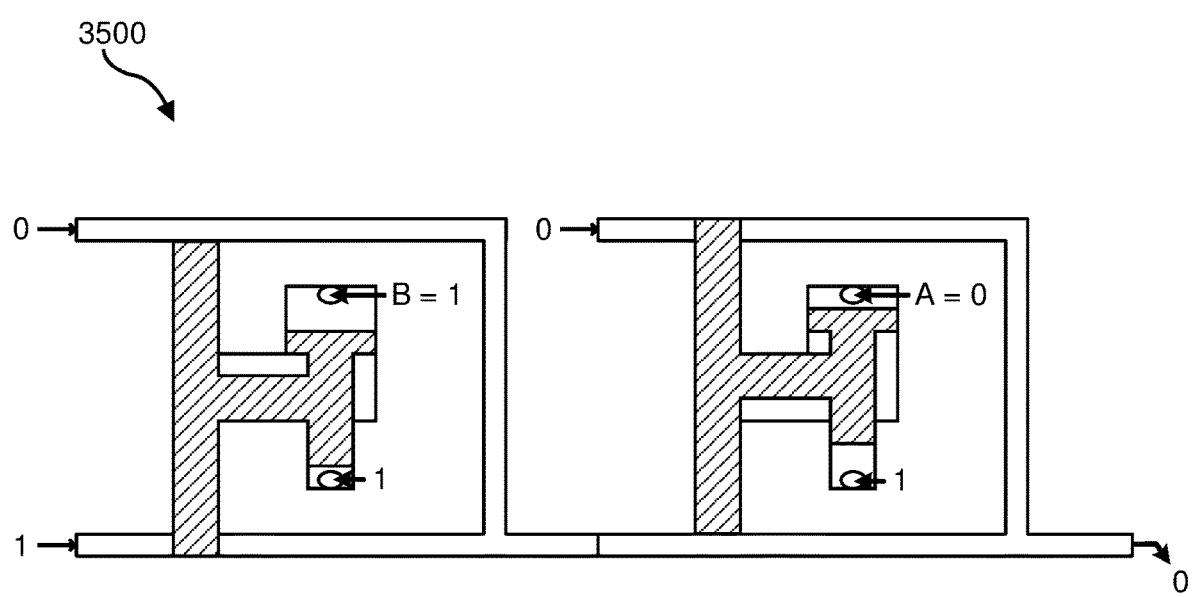
Figure 38A:
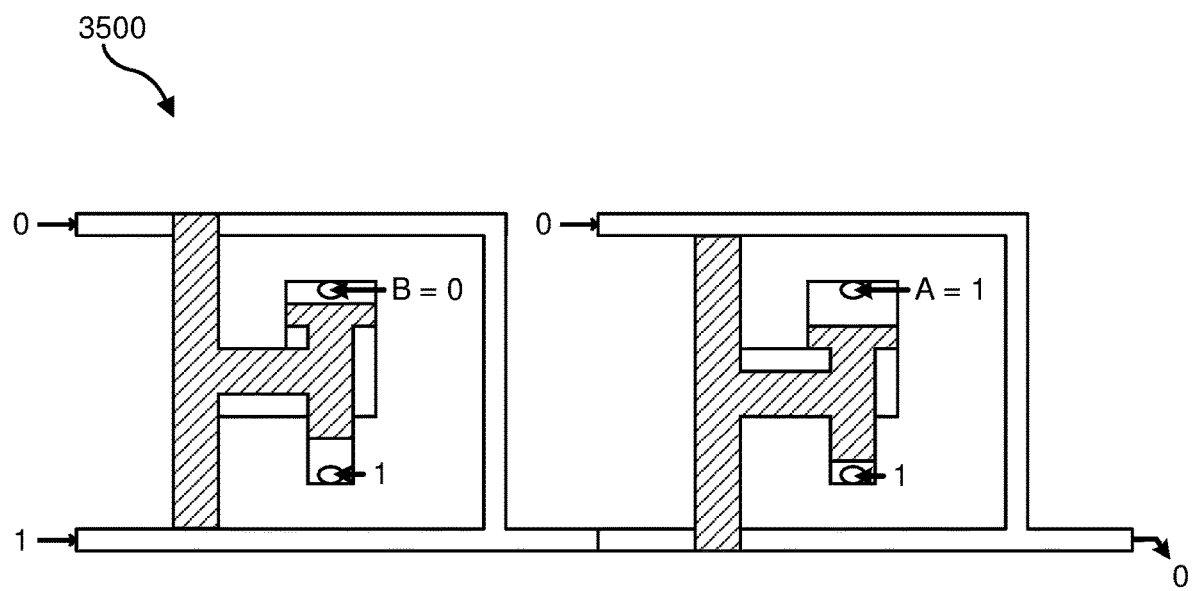
Figure 38B:
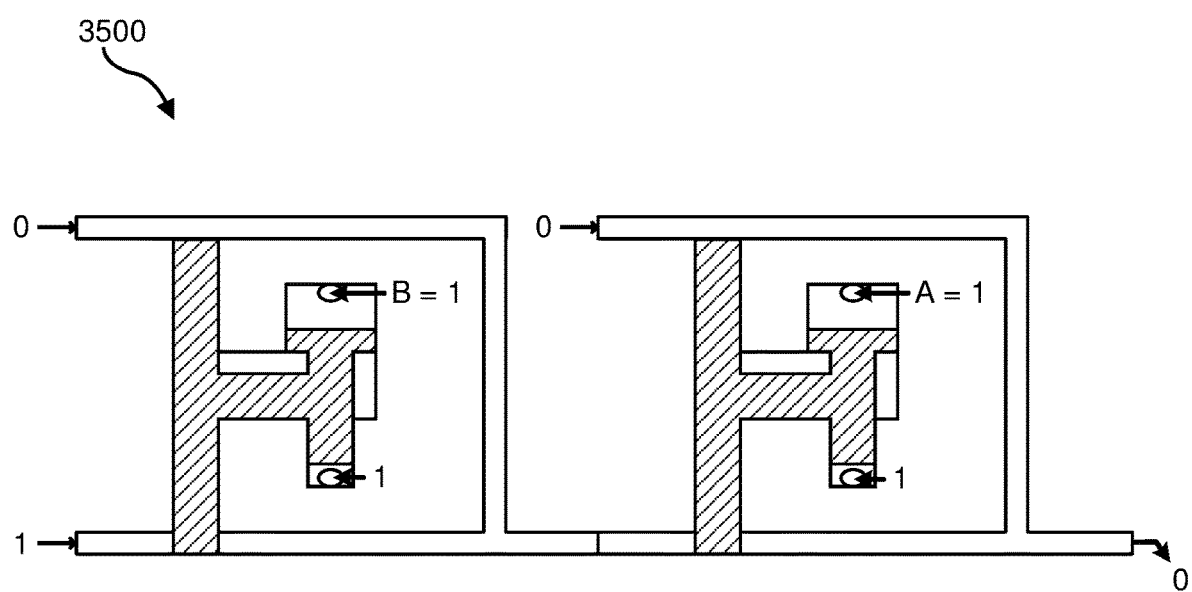

As shown in FIG. 36, in some examples, fluidic logic gate 3500 may be configured to perform a NOR operation by applying (1) a high pressure 3600 to inlet port 402A, (2) a low pressure 3602 to inlet port 404A and inlet port 404B, (3) a preload pressure 3604 (e.g., high pressure 3600) to control ports 406A and 406B, (4) an input fluid 3606 (e.g., an input A) to control port 408B, and (5) an input fluid 3608 (e.g., an input B) to control port 408A. In this example, a result of the NOR operation may be seen as output pressure 3610 at outlet port 410B. In this configuration, fluidic valve 400A may perform a NOT operation on input fluid 3608, which is then routed from outlet port 410A to inlet port 402B. As shown in FIG. 37A, if input fluid 3606 and input fluid 3608 both have a low pressure (e.g., a pressure lower than that of preload pressure 3604), then pistons 416A and 416B may be in the positions shown and high pressure 3600 may be routed from inlet port 402A through fluid channels 412A, 3502, and 412B to outlet port 410B. As shown in FIG. 37B, if input fluid 3606 has a low pressure (e.g., a pressure lower than that of preload pressure 3604) and input fluid 3608 has a sufficiently high pressure (e.g., a pressure equal to preload pressure 3604), then pistons 416A and 416B may be in the positions shown and low pressure 3602 may be routed from inlet port 404A through fluid channels 414A, 3502, and 412A to outlet port 410B. As shown in FIG. 38A, if input fluid 3606 has a sufficiently high pressure (e.g., a pressure equal to preload pressure 3604) and input fluid 3608 has a low pressure (e.g., a pressure lower than that of preload pressure 3604), then pistons 416A and 416B may be in the positions shown and low pressure 3602 may be routed from inlet port 404B through fluid channel 414B to outlet port 410B. As shown in FIG. 38B, if input fluid 3606 and input fluid 3608 both have a sufficiently high pressure (e.g., a pressure equal to preload pressure 3604), then pistons 416A and 416B may be in the positions shown and low pressure 3602 may be routed from inlet port 404B through fluid channel 414B to outlet port 410B. FIG. 8 illustrates a NOR truth table 800 that may represent the functionality of fluidic logic gate 3500 when configured as shown in FIG. 36.

Figure 39:
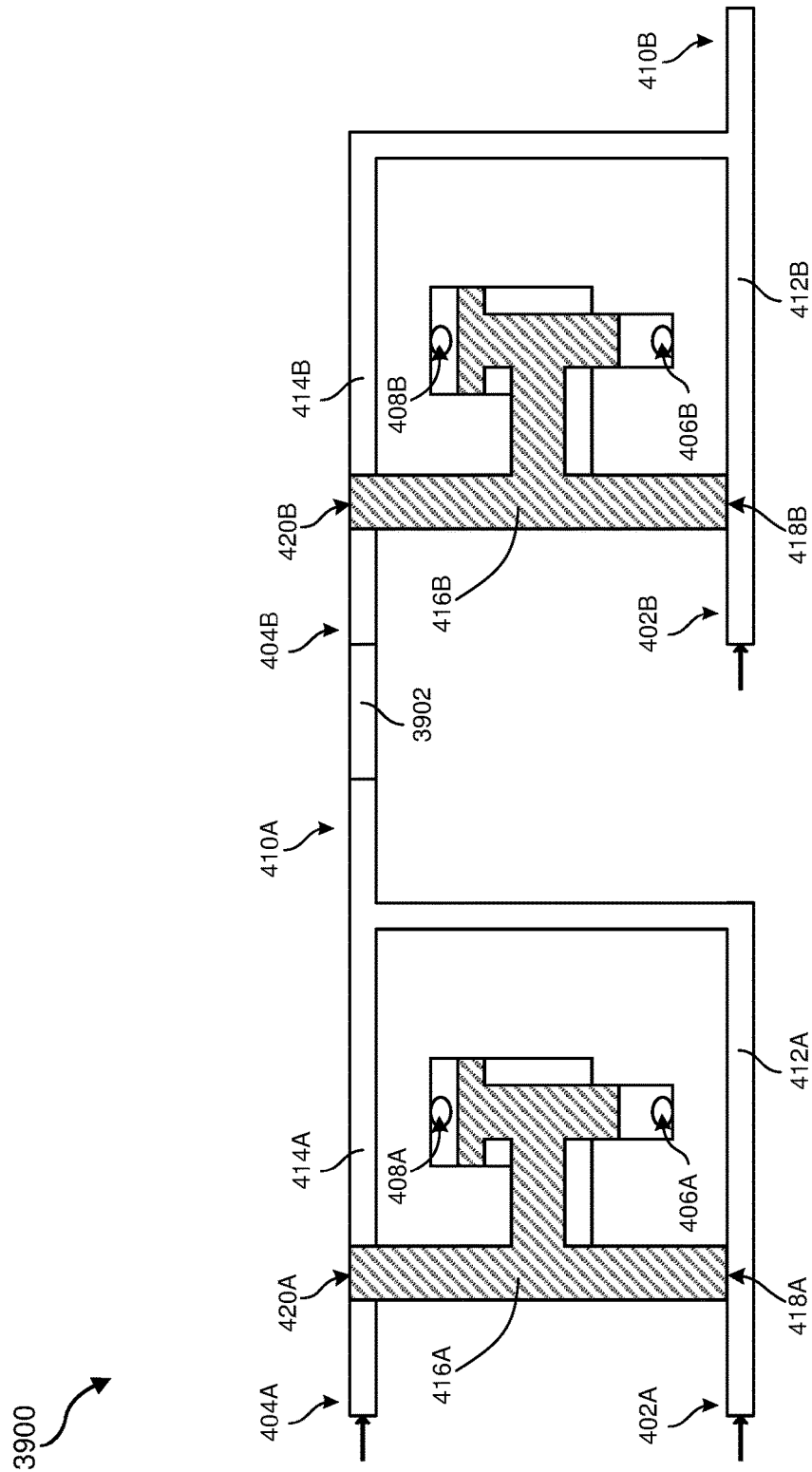
FIG. 39 is a schematic diagram of an exemplary fluidic logic gate, according to at least one embodiment of the present disclosure.

Other pass-through configurations of fluidic valve 400 may be configured or modified to perform various other functions and/or operations. For example, as shown in FIG. 39, a fluidic logic gate 3900 may be configured using a fluidic valve 400A and a fluidic valve 400B in another pass-through configuration. As shown, outlet port 410A of fluidic valve 400A may be connected to inlet port 404B of fluidic valve 400B by a fluid channel 3902. In some examples, pistons 416A and 416B may be part of separate fluidic devices, and fluid channel 3902 may be an external fluid connection between the separate fluidic devices. Alternatively, the elements shown in FIG. 39 may be part of a single fluidic device within which fluid channels 412A, 414A, 412B, 414B, and 3902 are integrated. In the configurations shown, fluid channels 412A, 3502, and 414B may act as a single fluid channel connecting inlet port 402A to outlet port 410B. Likewise, fluid channels 414A, 3502, and 414B may act as another single fluid channel connecting inlet port 404A to outlet port 410B.

Figure 40:
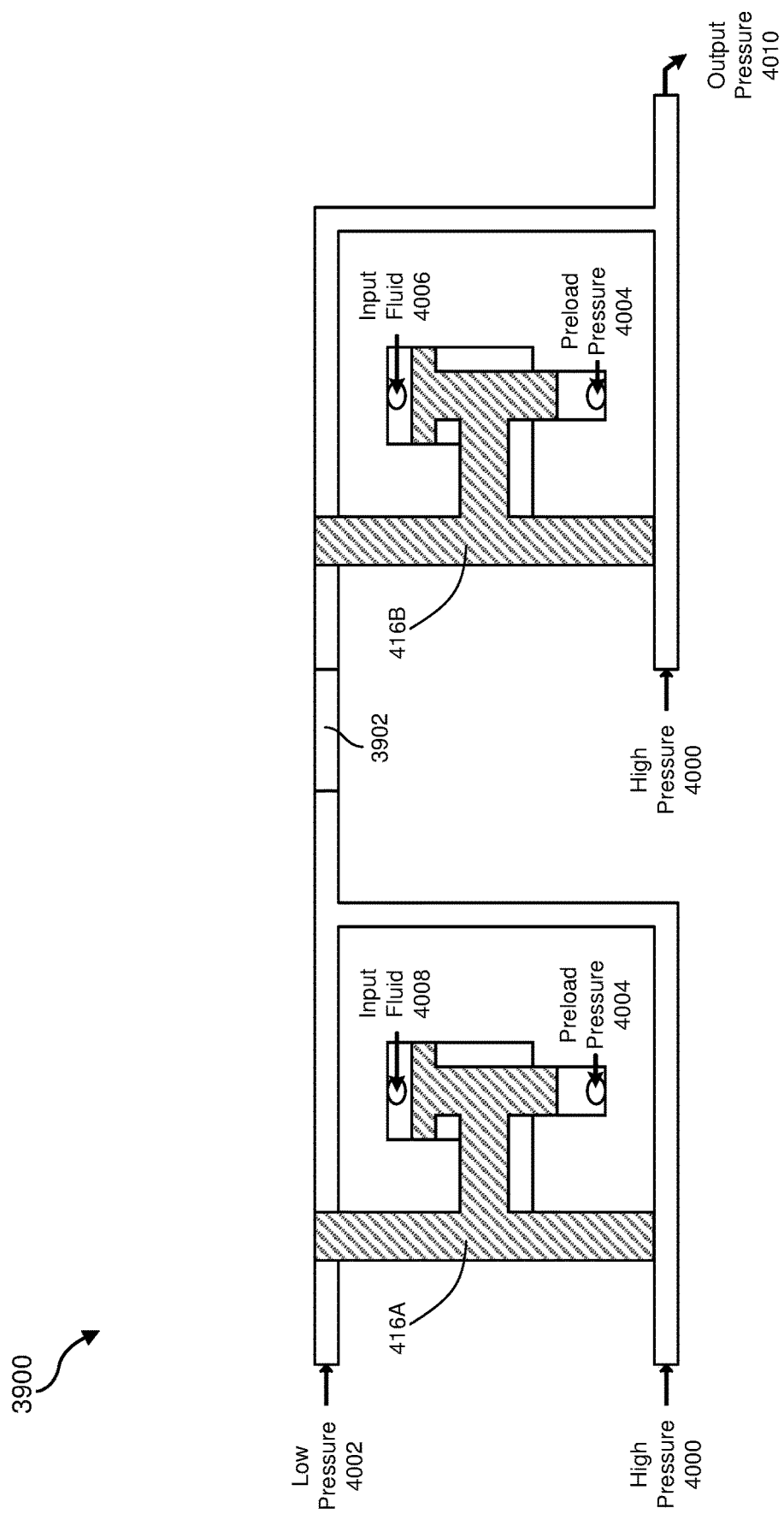
FIG. 40 is a schematic diagram of the exemplary fluidic logic gate of FIG. 39 configured to perform a NAND operation, according to at least one embodiment of the present disclosure.
Figure 41A:
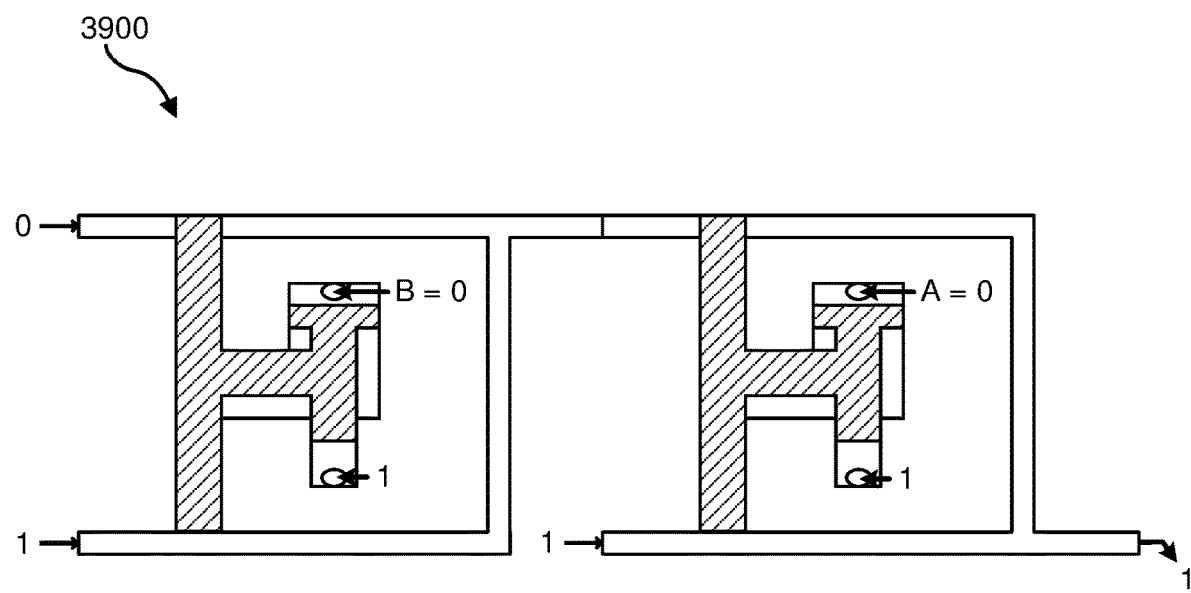
FIGS. 41A-42B are state diagrams of the exemplary fluidic logic gate of FIG. 40, according to at least one embodiment of the present disclosure.
Figure 41B:
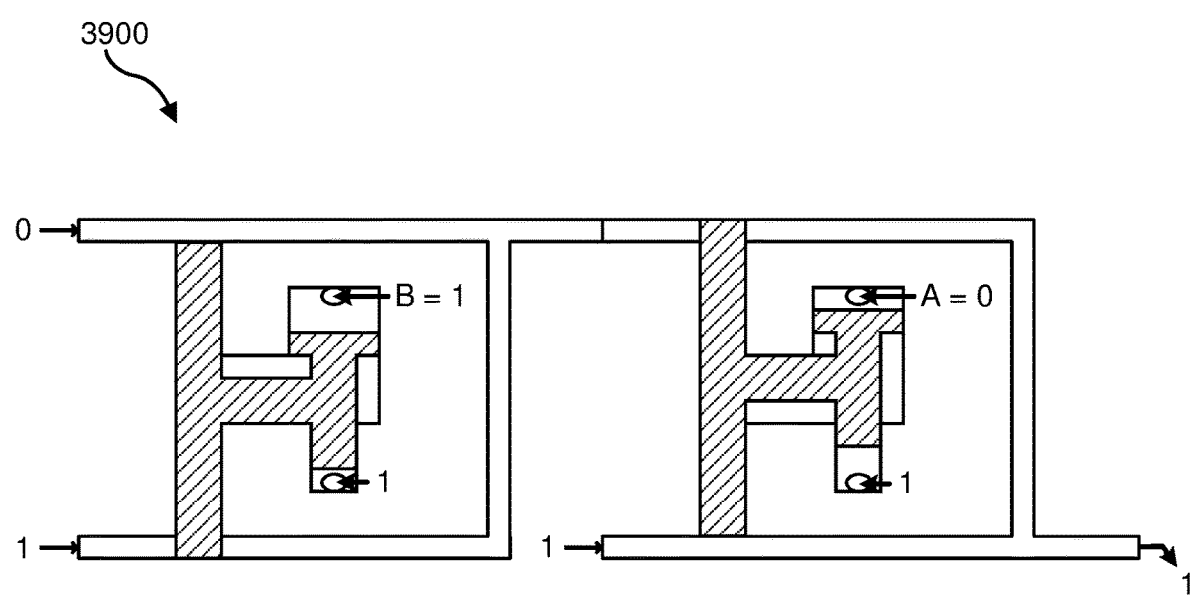
Figure 42A:
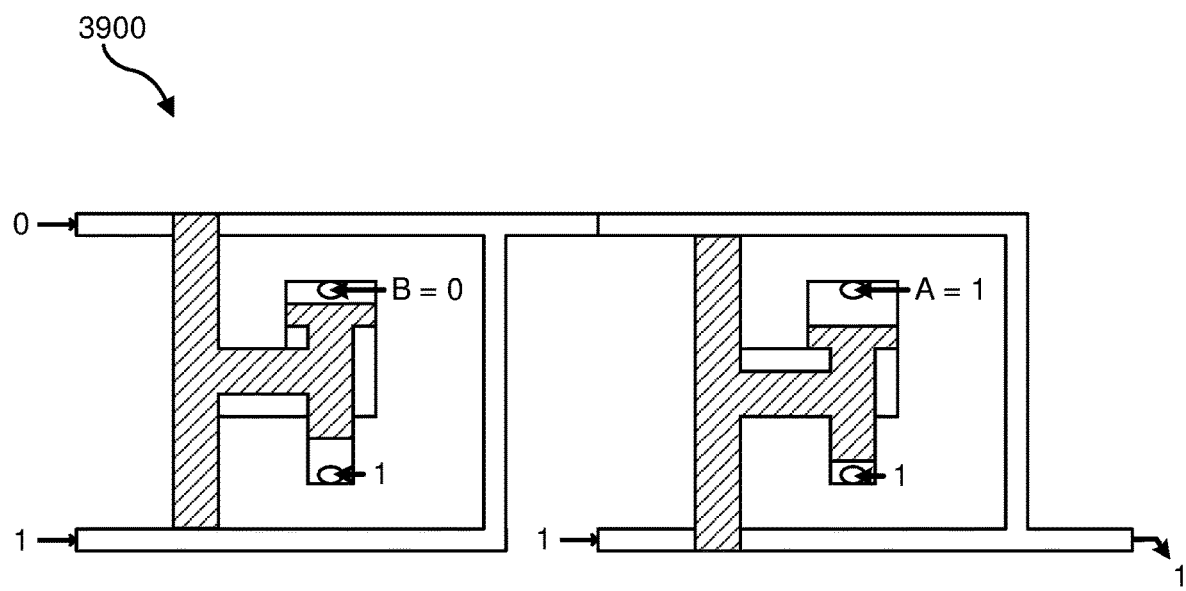
Figure 42B:
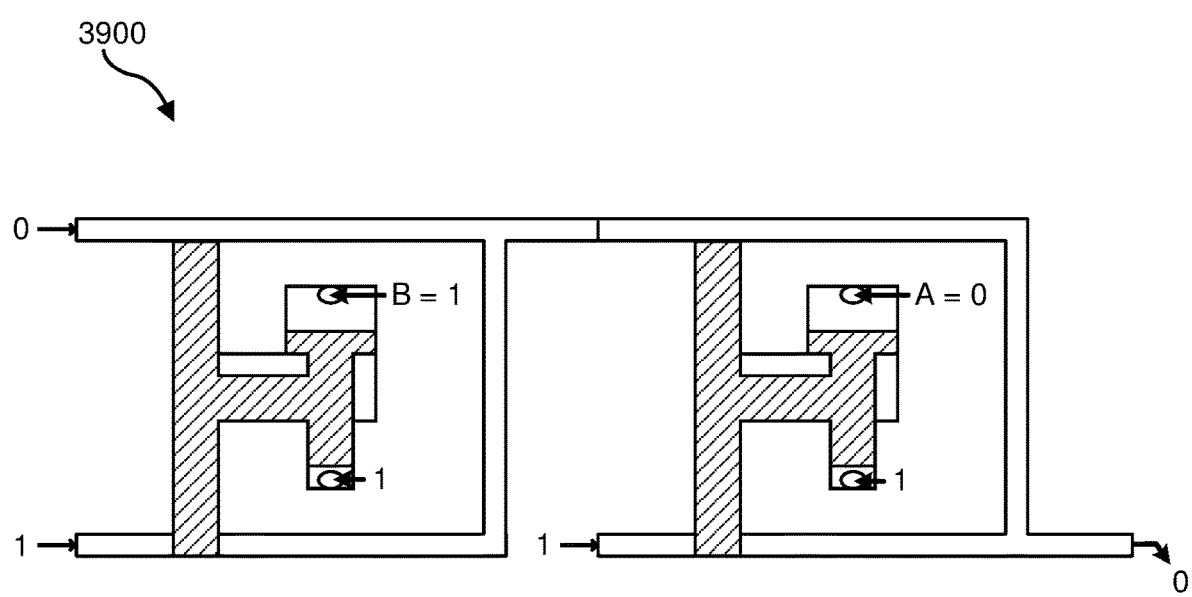

As shown in FIG. 40, in some examples, fluidic logic gate 3900 may be configured to perform a NAND operation by applying (1) a high pressure 4000 to inlet port 402A and inlet port 402B, (2) a low pressure 4002 to inlet port 404A, (3) a preload pressure 4004 (e.g., high pressure 4000) to control ports 406A and 406B, (4) an input fluid 4006 (e.g., an input A) to control port 408B, and (5) an input fluid 4008 (e.g., an input B) to control port 408A. In this example, a result of the NAND operation may be seen as output pressure 4010 at outlet port 410B. In this configuration, fluidic valve 400A may perform a NOT operation on input fluid 3608, which is then routed from outlet port 410A to inlet port 402B. As shown in FIG. 41A, if input fluid 4006 and input fluid 4008 both have a low pressure (e.g., a pressure lower than that of preload pressure 4004), then pistons 416A and 416B may be in the positions shown and high pressure 4000 may be routed from inlet port 402B through fluid channel 412B to outlet port 410B. As shown in FIG. 41B, if input fluid 4006 has a low pressure (e.g., a pressure lower than that of preload pressure 4004) and input fluid 4008 has a sufficiently high pressure (e.g., a pressure equal to preload pressure 4004), then pistons 416A and 416B may be in the positions shown and high pressure 4000 may be routed from inlet port 402B through fluid channel 412B to outlet port 410B. As shown in FIG. 42A, if input fluid 4006 has a sufficiently high pressure (e.g., a pressure equal to preload pressure 4004) and input fluid 4008 has a low pressure (e.g., a pressure lower than that of preload pressure 4004), then pistons 416A and 416B may be in the positions shown and high pressure 4000 may be routed from inlet port 402A through fluid channels 412A, 3902, and 414B to outlet port 410B. As shown in FIG. 42B, if input fluid 4006 and input fluid 4008 both have a sufficiently high pressure (e.g., a pressure equal to preload pressure 4004), then pistons 416A and 416B may be in the positions shown and low pressure 4002 may be routed from inlet port 404A through fluid channels 414A, 3902, and 414B to outlet port 410B. FIG. 15 illustrates a NAND truth table 1500 that may represent the functionality of fluidic logic gate 3900 when configured as shown in FIG. 40.

Embodiments of the present disclosure may include or be implemented in conjunction with various types of artificial reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 4300 in FIG. 43. Other artificial reality systems may include a NED that also provides visibility into the real world (e.g., augmented-reality system 4400 in FIG. 44) or that visually immerses a user in an artificial reality (e.g., virtual-reality system 4500 in FIG. 45). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 43:
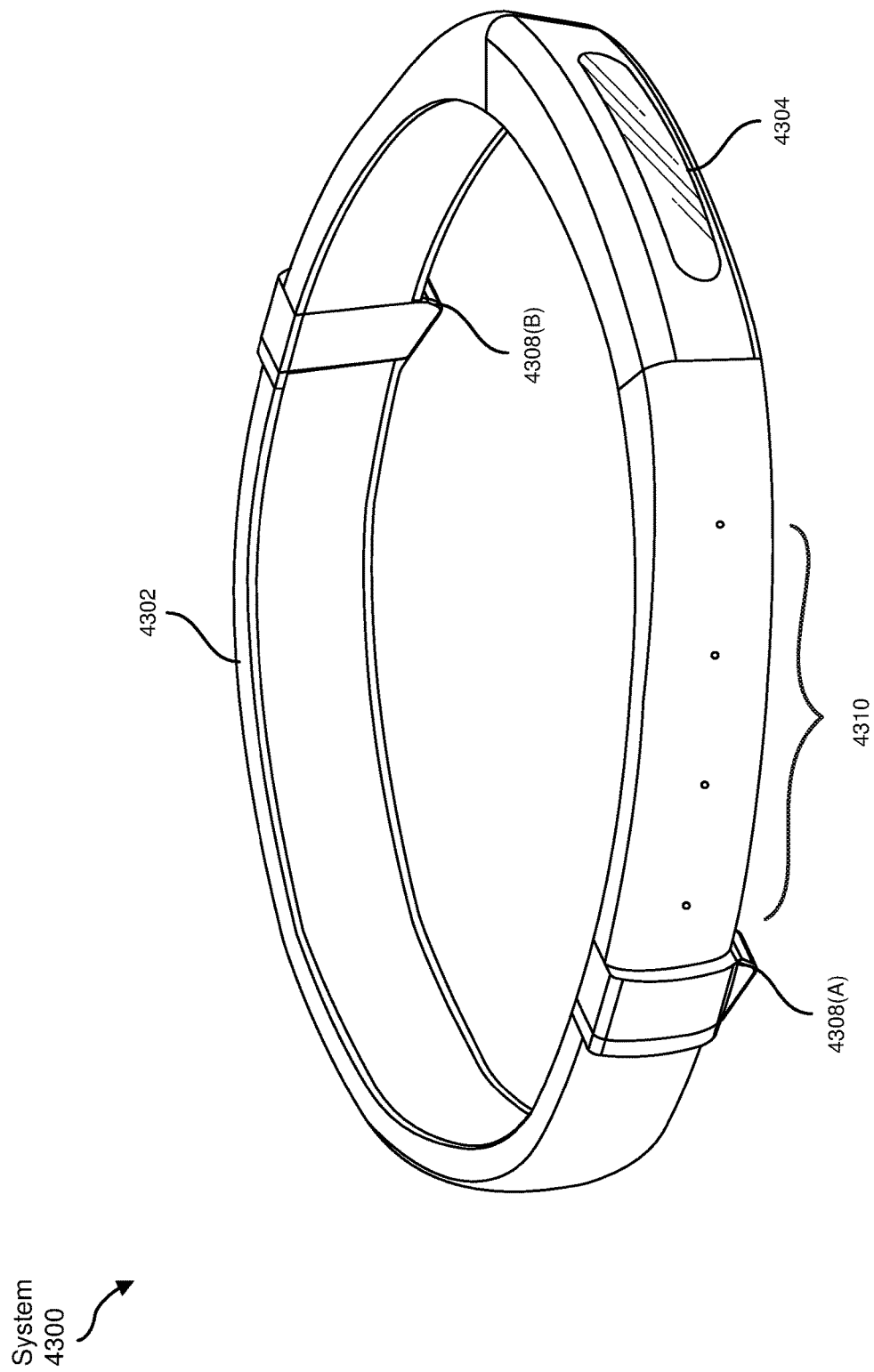
FIG. 43 is an illustration of an exemplary artificial-reality headband that may be used in connection with embodiments of this disclosure.

Turning to FIG. 43, augmented-reality system 4300 generally represents a wearable device dimensioned to fit about a body part (e.g., a head) of a user. As shown in FIG. 43, system 4300 may include a frame 4302 and a camera assembly 4304 that is coupled to frame 4302 and configured to gather information about a local environment by observing the local environment. Augmented-reality system 4300 may also include one or more audio devices, such as output audio transducers 4308(A) and 4308(B) and input audio transducers 4310. Output audio transducers 4308(A) and 4308(B) may provide audio feedback and/or content to a user, and input audio transducers 4310 may capture audio in a user's environment.

As shown, augmented-reality system 4300 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 4300 may not include a NED, augmented-reality system 4300 may include other types of screens or visual feedback devices (e.g., a display screen integrated into a side of frame 4302).

Figure 44:
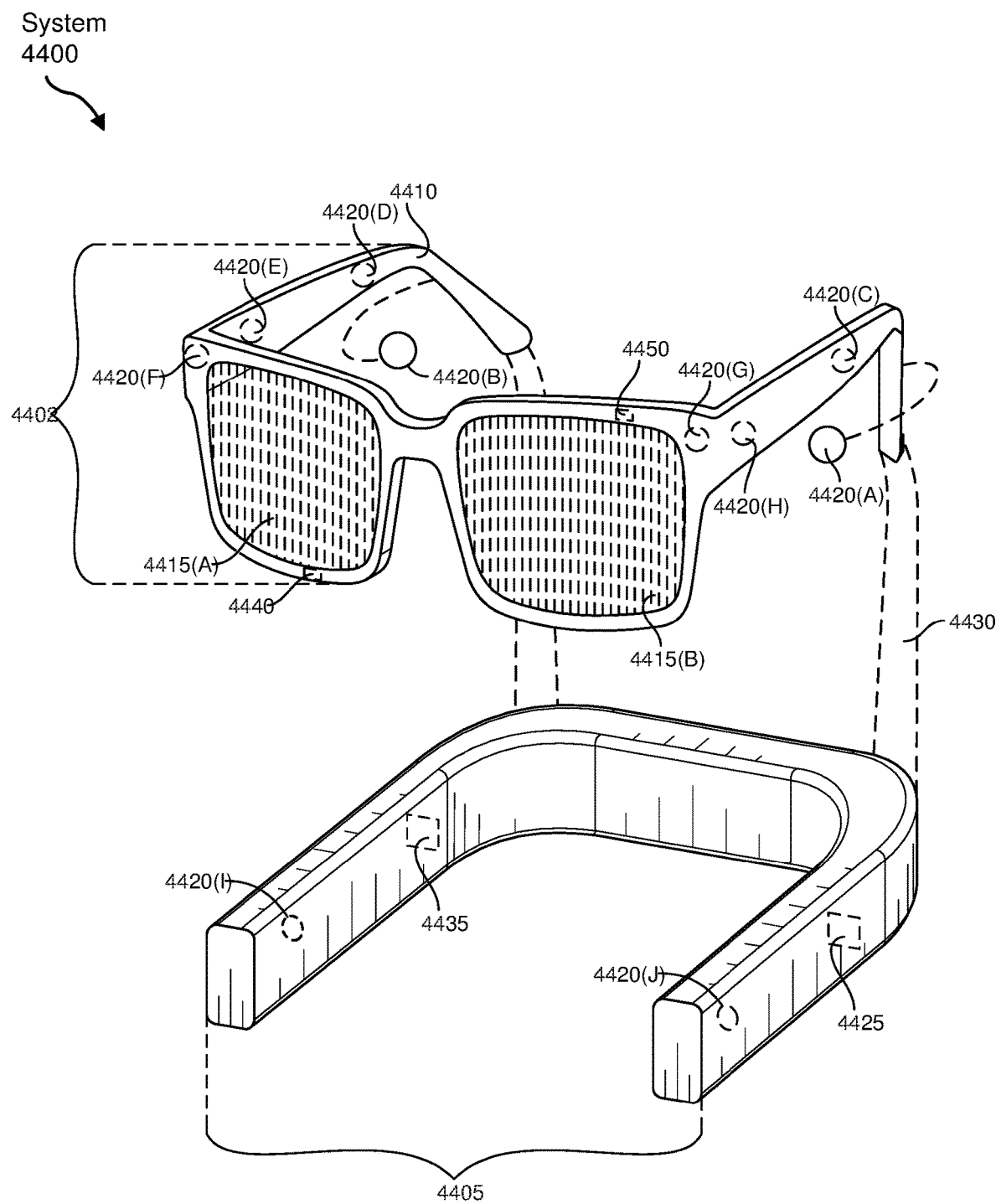
FIG. 44 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 44, augmented-reality system 4400 may include an eyewear device 4402 with a frame 4410 configured to hold a left display device 4415(A) and a right display device 4415(B) in front of a user's eyes. Display devices 4415(A) and 4415(B) may act together or independently to present an image or series of images to a user. While augmented-reality system 4400 includes two displays, embodiments of this disclosure may be implemented in augmented-reality systems with a single NED or more than two NEDs.

In some embodiments, augmented-reality system 4400 may include one or more sensors, such as sensor 4440. Sensor 4440 may generate measurement signals in response to motion of augmented-reality system 4400 and may be located on substantially any portion of frame 4410. Sensor 4440 may represent a position sensor, an inertial measurement unit (IMU), a depth camera assembly, or any combination thereof. In some embodiments, augmented-reality system 4400 may or may not include sensor 4440 or may include more than one sensor. In embodiments in which sensor 4440 includes an IMU, the IMU may generate calibration data based on measurement signals from sensor

4440. Examples of sensor 4440 may include, without limitation, accelerometers, gyroscopes, magnetometers, other suitable types of sensors that detect motion, sensors used for error correction of the IMU, or some combination thereof. Augmented-reality system 4400 may also include a microphone array with a plurality of acoustic transducers 4420(A)-4420(J), referred to collectively as acoustic transducers 4420. Acoustic transducers 4420 may be transducers that detect air pressure variations induced by sound waves. Each acoustic transducer 4420 may be configured to detect sound and convert the detected sound into an electronic format (e.g., an analog or digital format). The microphone array in FIG. 2 may include, for example, ten acoustic transducers: 4420(A) and 4420(B), which may be designed to be placed inside a corresponding ear of the user, acoustic transducers 4420(C), 4420(D), 4420(E), 4420(F), 4420(G), and 4420(H), which may be positioned at various locations on frame 4410, and/or acoustic transducers 4420(1) and 4420(J), which may be positioned on a corresponding neckband 4405.

In some embodiments, one or more of acoustic transducers 4420(A)-(F) may be used as output transducers (e.g., speakers). For example, acoustic transducers 4420(A) and/or 4420(B) may be earbuds or any other suitable type of headphone or speaker.

The configuration of acoustic transducers 4420 of the microphone array may vary. While augmented-reality system 4400 is shown in FIG. 44 as having ten acoustic transducers 4420, the number of acoustic transducers 4420 may be greater or less than ten. In some embodiments, using higher numbers of acoustic transducers 4420 may increase the amount of audio information collected and/or the sensitivity and accuracy of the audio information. In contrast, using a lower number of acoustic transducers 4420 may decrease the computing power required by the controller 4450 to process the collected audio information. In addition, the position of each acoustic transducer 4420 of the microphone array may vary. For example, the position of an acoustic transducer 4420 may include a defined position on the user, a defined coordinate on frame 4410, an orientation associated with each acoustic transducer, or some combination thereof.

Acoustic transducers 4420(A) and 4420(B) may be positioned on different parts of the user's ear, such as behind the pinna or within the auricle or fossa. Or, there may be additional acoustic transducers on or surrounding the ear in addition to acoustic transducers 4420 inside the ear canal. Having an acoustic transducer positioned next to an ear canal of a user may enable the microphone array to collect information on how sounds arrive at the ear canal. By positioning at least two of acoustic transducers 4420 on either side of a user's head (e.g., as binaural microphones), augmented-reality device 4400 may simulate binaural hearing and capture a 3D stereo sound field around about a user's head. In some embodiments, acoustic transducers 4420(A) and 4420(B) may be connected to augmented-reality system 4400 via a wired connection 4430, and in other embodiments, acoustic transducers 4420(A) and 4420(B) may be connected to augmented-reality system 4400 via a wireless connection (e.g., a Bluetooth connection). In still other embodiments, acoustic transducers 4420(A) and 4420(B) may not be used at all in conjunction with augmented-reality system 4400.

Acoustic transducers 4420 on frame 4410 may be positioned along the length of the temples, across the bridge, above or below display devices 4415(A) and 4415(B), or some combination thereof. Acoustic transducers 4420 may be oriented such that the microphone array is able to detect sounds in a wide range of directions surrounding the user wearing the augmented-reality system 4400. In some embodiments, an optimization process may be performed during manufacturing of augmented-reality system 4400 to determine relative positioning of each acoustic transducer 4420 in the microphone array.

In some examples, augmented-reality system 4400 may include or be connected to an external device (e.g., a paired device), such as neckband 4405. Neckband 4405 generally represents any type or form of paired device. Thus, the following discussion of neckband 4405 may also apply to various other paired devices, such as charging cases, smart watches, smart phones, wrist bands, other wearable devices, hand-held controllers, tablet computers, laptop computers and other external compute devices, etc.

As shown, neckband 4405 may be coupled to eyewear device 4402 via one or more connectors. The connectors may be wired or wireless and may include electrical and/or non-electrical (e.g., structural) components. In some cases, eyewear device 4402 and neckband 4405 may operate independently without any wired or wireless connection between them. While FIG. 44 illustrates the components of eyewear device 4402 and neckband 4405 in example locations on eyewear device 4402 and neckband 4405, the components may be located elsewhere and/or distributed differently on eyewear device 4402 and/or neckband 4405. In some embodiments, the components of eyewear device 4402 and neckband 4405 may be located on one or more additional peripheral devices paired with eyewear device 4402, neckband 4405, or some combination thereof. Furthermore, Pairing external devices, such as neckband 4405, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 4400 may be provided by a paired device or shared between a paired device and an eyewear device, thus reducing the weight, heat profile, and form factor of the eyewear device overall while still retaining desired functionality. For example, neckband 4405 may allow components that would otherwise be included on an eyewear device to be included in neckband 4405 since users may tolerate a heavier weight load on their shoulders than they would tolerate on their heads. Neckband 4405 may also have a larger surface area over which to diffuse and disperse heat to the ambient environment. Thus, neckband 4405 may allow for greater battery and computation capacity than might otherwise have been possible on a stand-alone eyewear device. Since weight carried in neckband 4405 may be less invasive to a user than weight carried in eyewear device 4402, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 4405 may be communicatively coupled with eyewear device 4402 and/or to other devices. These other devices may provide certain functions (e.g., tracking, localizing, depth mapping, processing, storage, etc.) to augmented-reality system 4400. In the embodiment of FIG. 44, neckband 4405 may include two acoustic transducers (e.g., 4420(1) and 4420(J)) that are part of the microphone array (or potentially form their own microphone subarray). Neckband 4405 may also include a controller 4425 and a power source 4435.

Acoustic transducers 4420(1) and 4420(J) of neckband 4405 may be configured to detect sound and convert the detected sound into an electronic format (analog or digital). In the embodiment of FIG. 44, acoustic transducers 4420(1) and 4420(J) may be positioned on neckband 4405, thereby increasing the distance between the neckband acoustic transducers 4420(1) and 4420(J) and other acoustic transducers 4420 positioned on eyewear device 4402. In some cases, increasing the distance between acoustic transducers 4420 of the microphone array may improve the accuracy of beamforming performed via the microphone array. For example, if a sound is detected by acoustic transducers 4420(C) and 4420(D) and the distance between acoustic transducers 4420(C) and 4420(D) is greater than, e.g., the distance between acoustic transducers 4420(D) and 4420(E), the determined source location of the detected sound may be more accurate than if the sound had been detected by acoustic transducers 4420(D) and 4420(E).

Controller 4425 of neckband 4405 may process information generated by the sensors on 4405 and/or augmented-reality system 4400. For example, controller 4425 may process information from the microphone array that describes sounds detected by the microphone array. For each detected sound, controller 4425 may perform a direction-of-arrival (DOA) estimation to estimate a direction from which the detected sound arrived at the microphone array. As the microphone array detects sounds, controller 4425 may populate an audio data set with the information. In embodiments in which augmented-reality system 4400 includes an inertial measurement unit, controller 4425 may compute all inertial and spatial calculations from the IMU located on eyewear device 4402. A connector may convey information between augmented-reality system 4400 and neckband 4405 and between augmented-reality system 4400 and controller 4425. The information may be in the form of optical data, electrical data, wireless data, or any other transmittable data form. Moving the processing of information generated by augmented-reality system 4400 to neckband 4405 may reduce weight and heat in eyewear device 4402, making it more comfortable to the user.

Power source 4435 in neckband 4405 may provide power to eyewear device 4402 and/or to neckband 4405. Power source 4435 may include, without limitation, lithium ion batteries, lithium-polymer batteries, primary lithium batteries, alkaline batteries, or any other form of power storage. In some cases, power source 4435 may be a wired power source. Including power source 4435 on neckband 4405 instead of on eyewear device 4402 may help better distribute the weight and heat generated by power source 4435.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 4500 in FIG. 45, that mostly or completely covers a user's field of view. Virtual-reality system 4500 may include a front rigid body 4502 and a band 4504 shaped to fit around a user's head. Virtual-reality system 4500 may also include output audio transducers 4506(A) and 4506(B). Furthermore, while not shown in FIG. 45, front rigid body 4502 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 4500 and/or virtual-reality system 4500 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 4400 and/or virtual-reality system 4500 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 4300, augmented-reality system 4400, and/or virtual-reality system 4500 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 43 and 45, output audio transducers 4308(A), 4308(B), 4506(A), and 4506(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 4310 may include condenser microphones, dynamic microphones, ribbon microphones, and/or any other type or form of input transducer. In some embodiments, a single transducer may be used for both audio input and audio output.

Figure 45:
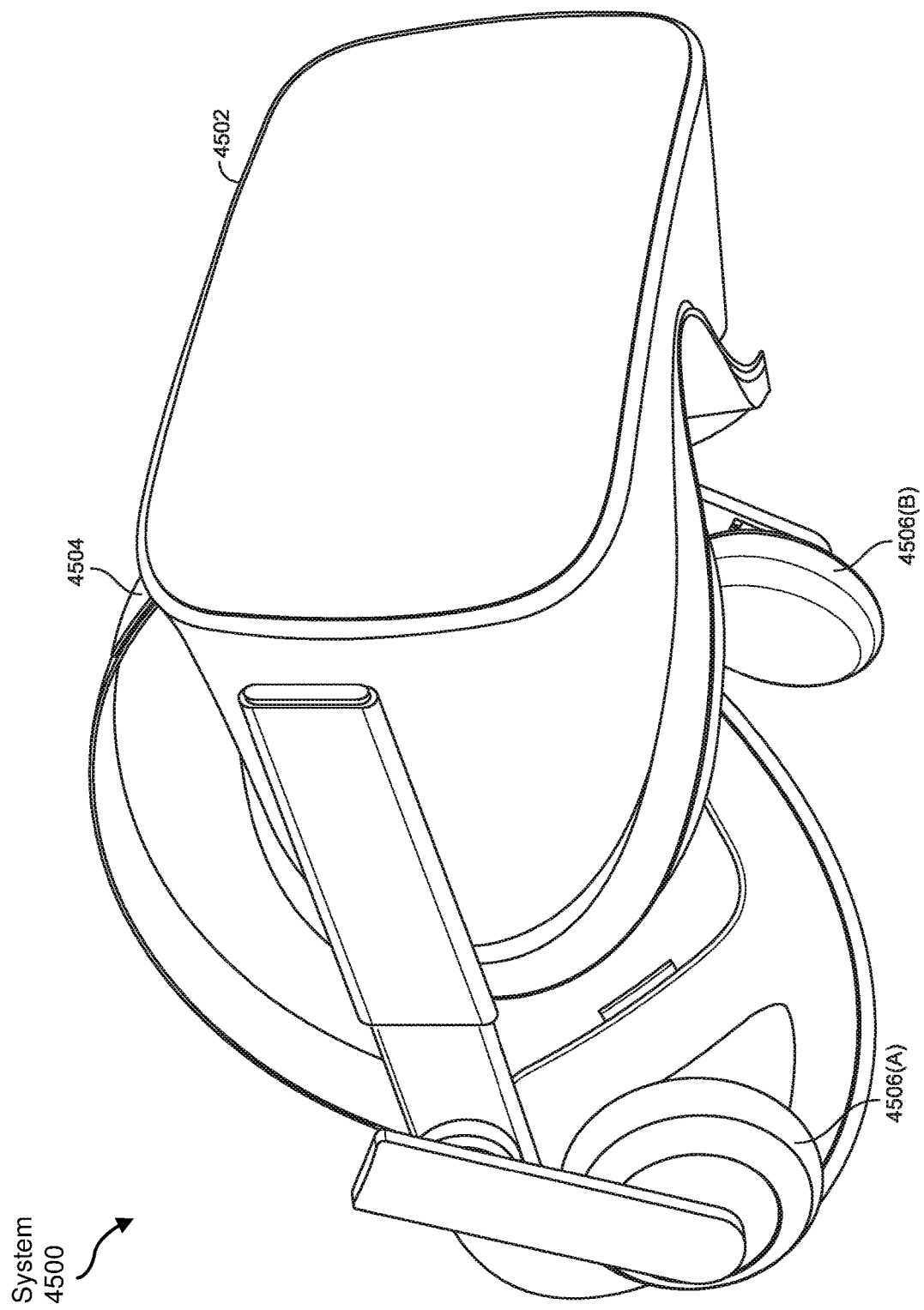
FIG. 45 is an illustration of an exemplary virtual-reality headset that may be used in connection with embodiments of this disclosure.

While not shown in FIGS. 43-45, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

As noted, artificial reality systems 4300, 4400, and 4500 may be used with a variety of other types of devices to provide a more compelling artificial reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 46:
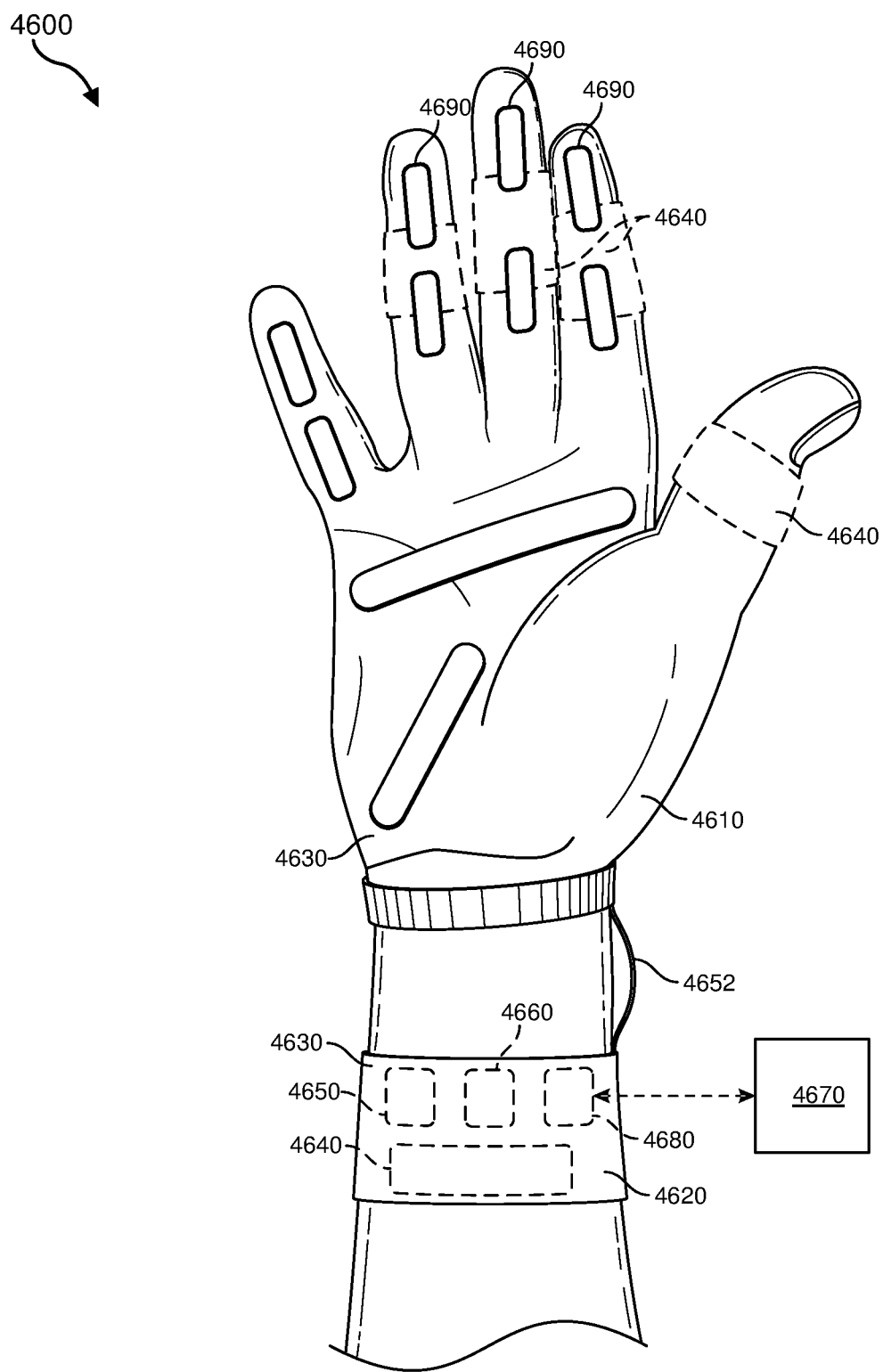
FIG. 46 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 46 illustrates a vibrotactile system 4600 in the form of a wearable glove (haptic device 4610) and wristband (haptic device 4620). Haptic device 4610 and haptic device 4620 are shown as examples of wearable devices that include a flexible, wearable textile material 4630 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 4640 may be positioned at least partially within one or more corresponding pockets formed in textile material 4630 of vibrotactile system 4600. Vibrotactile devices 4640 may be positioned in locations to provide a vibrating sensation (e.g., haptic feedback) to a user of vibrotactile system 4600. For example, vibrotactile devices 4640 may be positioned to be against the user's finger(s), thumb, or wrist, as shown in FIG. 46. Vibrotactile devices 4640 may, in some examples, be sufficiently flexible to conform to or bend with the user's corresponding body part(s).

A power source 4650 (e.g., a battery) for applying a voltage to the vibrotactile devices 4640 for activation thereof may be electrically coupled to vibrotactile devices 4640, such as via conductive wiring 4652. In some examples, each of vibrotactile devices 4640 may be independently electrically coupled to power source 4650 for individual activation. In some embodiments, a processor 4660 may be operatively coupled to power source 4650 and configured (e.g., programmed) to control activation of vibrotactile devices 4640.

Vibrotactile system 4600 may be implemented in a variety of ways. In some examples, vibrotactile system 4600 may be a standalone system with integral subsystems and components for operation independent of other devices and systems. As another example, vibrotactile system 4600 may be configured for interaction with another device or system 4670. For example, vibrotactile system 4600 may, in some examples, include a communications interface 4680 for receiving and/or sending signals to the other device or system 4670. The other device or system 4670 may be a mobile device, a gaming console, an artificial reality (e.g., virtual reality, augmented reality, mixed reality) device, a personal computer, a tablet computer, a network device (e.g., a modem, a router, etc.), a handheld controller, etc. Communications interface 4680 may enable communications between vibrotactile system 4600 and the other device or system 4670 via a wireless (e.g., Wi-Fi, Bluetooth, cellular, radio, etc.) link or a wired link. If present, communications interface 4680 may be in communication with processor 4660, such as to provide a signal to processor 4660 to activate or deactivate one or more of the vibrotactile devices 4640.

Vibrotactile system 4600 may optionally include other subsystems and components, such as touch-sensitive pads 4690, pressure sensors, motion sensors, position sensors, lighting elements, and/or user interface elements (e.g., an on/off button, a vibration control element, etc.). During use, vibrotactile devices 4640 may be configured to be activated for a variety of different reasons, such as in response to the user's interaction with user interface elements, a signal from the motion or position sensors, a signal from the touch-sensitive pads 4690, a signal from the pressure sensors, a signal from the other device or system 4670, etc.

Although power source 4650, processor 4660, and communications interface 4680 are illustrated in FIG. 46 as being positioned in haptic device 4620, the present disclosure is not so limited. For example, one or more of power source 4650, processor 4660, or communications interface 4680 may be positioned within haptic device 4610 or within another wearable textile.

Figure 47:
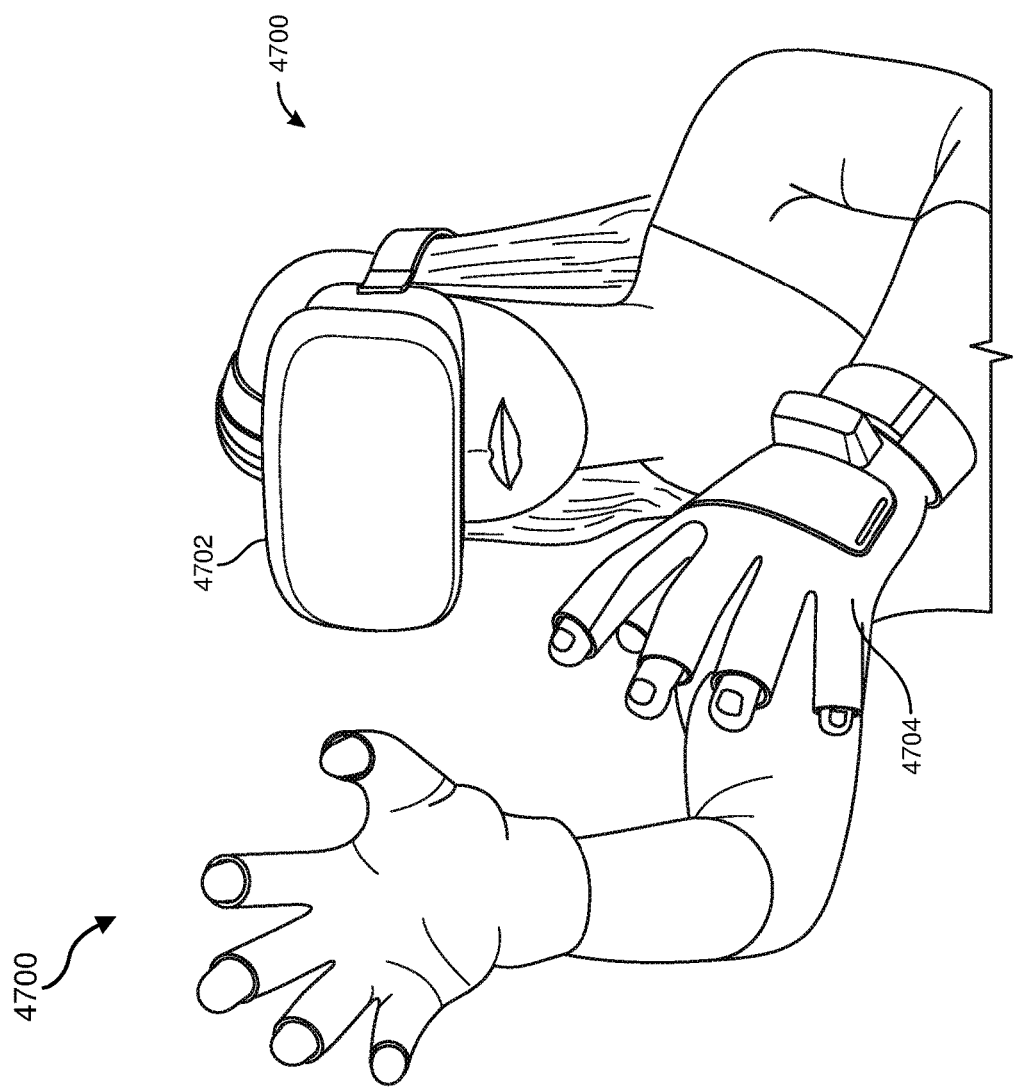
FIG. 47 is an illustration of an exemplary virtual-reality environment according to embodiments of this disclosure.

Haptic wearables, such as those shown in and described in connection with FIG. 46, may be implemented in a variety of types of artificial-reality systems and environments. FIG. 47 shows an example artificial reality environment 4700 including one head-mounted virtual-reality display and two haptic devices (i.e., gloves), and in other embodiments any number and/or combination of these components and other components may be included in an artificial reality system. For example, in some embodiments there may be multiple head-mounted displays each having an associated haptic device, with each head-mounted display and each haptic device communicating with the same console, portable computing device, or other computing system.

Head-mounted display 4702 generally represents any type or form of virtual-reality system, such as virtual-reality system 4500 in FIG. 45. Haptic device 4704 generally represents any type or form of wearable device, worn by a use of an artificial reality system, that provides haptic feedback to the user to give the user the perception that he or she is physically engaging with a virtual object. In some embodiments, haptic device 4704 may provide haptic feedback by applying vibration, motion, and/or force to the user. For example, haptic device 4704 may limit or augment a user's movement. To give a specific example, haptic device 4704 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 4704 to send action requests to a console. Examples of action requests include, without limitation, requests to start an application and/or end the application and/or requests to perform a particular action within the application.

Figure 48:
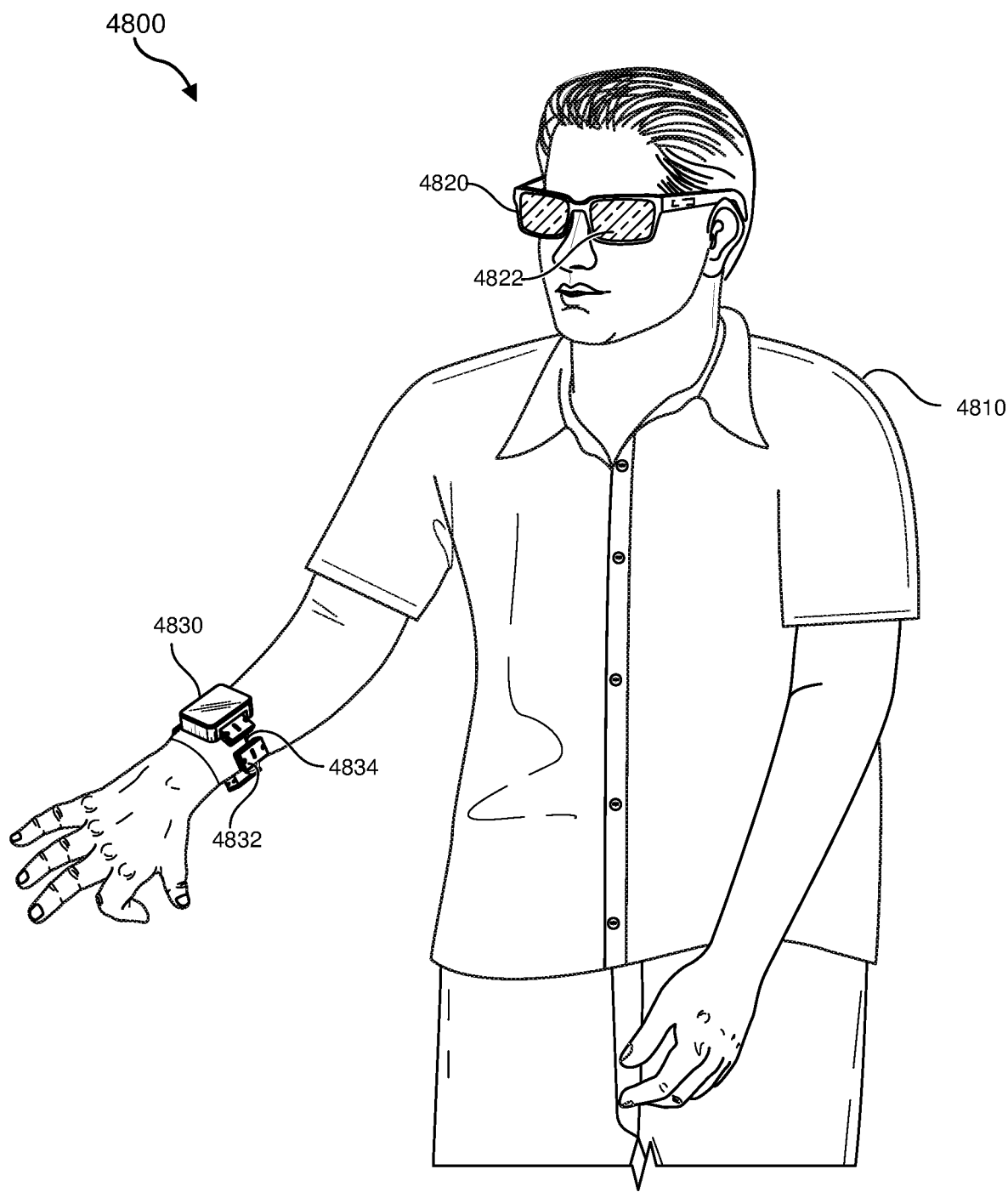
FIG. 48 is an illustration of an exemplary augmented-reality environment according to embodiments of this disclosure.

While haptic interfaces may be used with virtual-reality systems, as shown in FIG. 47, haptic interfaces may also be used with augmented-reality systems, as shown in FIG. 48. FIG. 48 is a perspective view a user 4810 interacting with an augmented-reality system 4800. In this example, user 4810 may wear a pair of augmented-reality glasses 4820 that have one or more displays 4822 and that are paired with a haptic device 4830. Haptic device 4830 may be a wristband that includes a plurality of band elements 4832 and a tensioning mechanism 4834 that connects band elements 4832 to one another.

One or more of band elements 4832 may include any type or form of actuator suitable for providing haptic feedback. For example, one or more of band elements 4832 may be configured to provide one or more of various types of cutaneous feedback, including vibration, force, traction, texture, and/or temperature. To provide such feedback, band elements 4832 may include one or more of various types of actuators. In one example, each of band elements 4832 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 4610, 4620, 4704, and 4830 may include any suitable number and/or type of haptic transducer, sensor, and/or feedback mechanism. For example, haptic devices 4610, 4620, 4704, and 4830 may include one or more mechanical transducers, piezoelectric transducers, and/or fluidic transducers. Haptic devices 4610, 4620, 4704, and 4830 may also include various combinations of different types and forms of transducers that work together or independently to enhance a user's artificial-reality experience. In one example, each of band elements 4832 of haptic device 4830 may include a vibrotactor (e.g., a vibrotactile actuator) configured to vibrate in unison or independently to provide one or more of various types of haptic sensations to a user.

Embodiments of the instant disclosure may include or be implemented in conjunction with an artificial reality system. Artificial reality is a form of reality that has been adjusted in some manner before presentation to a user, which may include, e.g., a virtual reality, an augmented reality, a mixed reality, a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A fluidic device comprising:
   a plurality of inlet ports, a plurality of input ports, and one or more output ports;
   a plurality of fluid channels each configured to route fluid from one of the plurality of inlet ports to one of the one or more output ports;
   a plurality of pistons each comprising:
      a restricting gate transmission element configured to block, when the piston is in a first position, and unblock, when the piston is in a second position, one of the plurality of fluid channels;
      a first controlling gate transmission element configured to interface with a first control pressure that, when applied to the first controlling gate transmission element, forces the piston towards the first position; and
      a second controlling gate transmission element configured to interface with a second control pressure that, when applied to the second controlling gate transmission element, forces the piston towards the second position.

2. The fluidic device of claim 1, wherein the fluidic device is a fluidic set-reset latch.

3. The fluidic device of claim 2, further comprising:
a first normally open valve; and
a second normally open valve, wherein:
the plurality of inlet ports comprises a first inlet port, a second inlet port, a third inlet port, and a fourth inlet port;
the plurality of input ports comprises a first input port and a second input port;
the one or more output ports comprise a first output port and a second output port;
the plurality of fluid channels comprises:
    a first fluid channel configured to route fluid from the first inlet port to the first output port;
    a second fluid channel configured to route fluid from the second inlet port to the first output port;
    a third fluid channel configured to route fluid from the third inlet port to the second output port; and
    a fourth fluid channel configured to route fluid from the fourth inlet port to the second output port;
the fluidic device further comprises:
    a fifth fluid channel configured to route fluid from the first output port to the second normally open valve; and
    a sixth fluid channel configured to route fluid from the second output port to the first normally open valve;
the plurality of pistons comprises:
    a first piston comprising:
        a first restricting gate transmission element configured to:
            block, when the first piston is in a first position, the first fluid channel; and
            unblock, when the piston is in a second position, the first fluid channel;
        a second restricting gate transmission element configured to:
            block, when the first piston is in the second position, the second fluid channel; and
            unblock, when the first piston is in the first position, the second fluid channel;
        a first controlling gate transmission element configured to interface with a first fluid pressure from the first input port, wherein the first fluid pressure, when applied to the first controlling gate transmission element, forces the first piston towards the first position; and
        a second controlling gate transmission element configured to interface with a first preload pressure, wherein the first preload pressure forces, when applied to the second controlling gate transmission element, the first piston towards the second position; and
    a second piston comprising:
        a third restricting gate transmission element configured to:
            block, when the second piston is in a third position, the third fluid channel; and
            unblock, when the second piston is in a fourth position, the third fluid channel;
        a fourth restricting gate transmission element configured to:
            block, when the second piston is in the fourth position, the fourth fluid channel; and
            unblock, when the second piston is in the third position, the fourth fluid channel;
        a third controlling gate transmission element configured to interface with a second preload pressure, wherein the second preload pressure forces, when applied to the third controlling gate transmission element, the second piston towards the third position; and
        a fourth controlling gate transmission element configured to interface with a second fluid pressure from the second input port, wherein the second fluid pressure forces, when applied to the fourth controlling gate transmission element, the second piston towards the fourth position;
the first normally open valve comprises:
    a fifth restricting gate transmission element configured to:
        unblock, when the first normally open valve is in a fifth position, the first fluid channel; and
        block, when the first normally open valve is in a sixth position, the first fluid channel; and
    a fifth controlling gate transmission element configured to interface with a third fluid pressure from the sixth fluid channel, wherein the third fluid pressure forces, when applied to the fifth controlling gate transmission element, the first normally open valve towards the sixth position; and
the second normally open valve comprises:
    a sixth restricting gate transmission element configured to:
        unblock, when the second normally open valve is in a seventh position, the fourth fluid channel; and
        block, when the second normally open valve is in an eighth position, the fourth fluid channel; and
    a sixth controlling gate transmission element configured to interface with a fourth fluid pressure from the fifth fluid channel, wherein the fourth fluid pressure forces, when applied to the sixth controlling gate transmission element, the second normally open valve towards the eighth position.

4. The fluidic device of claim 1, wherein:
the plurality of inlet ports comprises a first one or more inlet ports and a second one or more inlet ports;
the plurality of input ports comprises a first input port and a second input port;
the plurality of fluid channels comprises:
    a first fluid channel configured to route fluid from the first one or more inlet ports to the one or more output ports;
    a second fluid channel configured to route fluid from the second one or more inlet ports to the one or more output ports;
    a third fluid channel configured to route fluid from the second one or more inlet ports to the one or more output ports; and
the plurality of pistons comprises:
    a first piston comprising:
        a first restricting gate transmission element configured to block, when the first piston is in a first position, the first fluid channel;
        a second restricting gate transmission element configured to block, when the first piston is in a second position, the second fluid channel;
        a first controlling gate transmission element configured to interface with a first fluid pressure, wherein the first fluid pressure, when applied to the first controlling gate transmission element, forces the first piston towards the first position; and a second controlling gate transmission element configured to interface with a second fluid pressure, wherein the second fluid pressure forces, when applied to the second controlling gate transmission element, the first piston towards the second position; and a second piston comprising:
a third restricting gate transmission element configured to block, when the second piston is in a third position, the first fluid channel;
a fourth restricting gate transmission element configured to block, when the second piston is in a fourth position, the third fluid channel;
a third controlling gate transmission element configured to interface with a third fluid pressure, wherein the third fluid pressure forces, when applied to the third controlling gate transmission element, the second piston towards the third position; and
a fourth controlling gate transmission element configured to interface with a fourth fluid pressure, wherein the fourth fluid pressure forces, when applied to the fourth controlling gate transmission element, the second piston towards the fourth position.

5. The fluidic device of claim 4, wherein:
a surface area of the first controlling gate transmission element is greater than a surface area of the second controlling gate transmission element; and
a surface area of the third controlling gate transmission element is greater than a surface area of the fourth controlling gate transmission element.

6. The fluidic device of claim 5, wherein:
the fluidic device performs a NOR operation on a first input source connected to the first input port and a second input source connected to the second input port;
the first one or more inlet ports are one or more source ports configured to connect to a high-pressure source;
the second one or more inlet ports are one or more drain ports configured to connect to a low-pressure source;
the high-pressure source applies the second fluid pressure to the second controlling gate transmission element and the fourth fluid pressure to the fourth controlling gate transmission element;
the first input source applies the first fluid pressure to the first controlling gate transmission element; and
the second input source applies the third fluid pressure to the third controlling gate transmission element.

7. The fluidic device of claim 5, wherein:
the fluidic device performs an OR operation on a first input source connected to the first input port and a second input source connected to the second input port;
the first one or more inlet ports are one or more drain ports configured to connect to a low-pressure source;
the second one or more inlet ports are one or more source ports configured to connect to a high-pressure source;
the high-pressure source applies the second fluid pressure to the second controlling gate transmission element and the fourth fluid pressure to the fourth controlling gate transmission element;
the first input source applies the first fluid pressure to the first controlling gate transmission element; and
the second input source applies the third fluid pressure to the third controlling gate transmission element.

8. The fluidic device of claim 4, wherein:
a surface area of the first controlling gate transmission element is less than a surface area of the second controlling gate transmission element; and
a surface area of the third controlling gate transmission element is less than a surface area of the fourth controlling gate transmission element.

9. The fluidic device of claim 8, wherein:
the fluidic device performs a NAND operation on a first input source connected to the first input port and a second input source connected to the second input port;
the first one or more inlet ports are one or more drain ports configured to connect to a low-pressure source;
the second one or more inlet ports are one or more source ports configured to connect to a high-pressure source;
the high-pressure source applies the first fluid pressure to the first controlling gate transmission element and the third fluid pressure to the third controlling gate transmission element;
the first input source applies the second fluid pressure to the second controlling gate transmission element; and
the second input source applies the fourth fluid pressure to the fourth controlling gate transmission element.

10. The fluidic device of claim 8, wherein:
the fluidic device performs an AND operation on a first input source connected to the first input port and a second input source connected to the second input port;
the first one or more inlet ports are one or more source ports configured to connect to a high-pressure source;
the second one or more inlet ports are one or more drain ports configured to connect to a low-pressure source;
the high-pressure source applies the first fluid pressure to the first controlling gate transmission element and the third fluid pressure to the third controlling gate transmission element;
the first input source applies the second fluid pressure to the second controlling gate transmission element; and
the second input source applies the fourth fluid pressure to the fourth controlling gate transmission element.

11. The fluidic device of claim 4, wherein:
a surface area of the first controlling gate transmission element is less than a surface area of the second controlling gate transmission element;
a surface area of the fourth controlling gate transmission element is less than a surface area of the third controlling gate transmission element;
the fluidic device performs a material-implication operation on a first input source connected to the first input port and a second input source connected to the second input port;
the first one or more inlet ports are one or more drain ports configured to connect to a low-pressure source;
the second one or more inlet ports are one or more source ports configured to connect to a high-pressure source;
the high-pressure source applies the first fluid pressure to the first controlling gate transmission element and the fourth fluid pressure to the fourth controlling gate transmission element;
the first input source applies the second fluid pressure to the second controlling gate transmission element; and
the second input source applies the third fluid pressure to the third controlling gate transmission element.

12. The fluidic device of claim 1, wherein:
the plurality of input ports comprises a first input port and a second input port;

the fluidic device performs a NAND operation on a first input source connected to the first input port and a second input source connected to the second input port;

the plurality of inlet ports comprises:
  a first inlet port configured to connect to a low-pressure source; and
  a second inlet port configured to connect to a high-pressure source;

the plurality of fluid channels comprises:
  a first fluid channel configured to route fluid from the first inlet port to the one or more output ports;
  a second fluid channel configured to route fluid from the second inlet port to the one or more output ports; and
  a third fluid channel configured to route fluid from the high-pressure source to the one or more output ports;

the plurality of pistons comprises a first piston and a second piston;

the first piston comprises:
  a first restricting gate transmission element configured to:
    block, when the first piston is in a first blocking position, the first fluid channel; and
    unblock, when the first piston is in a second blocking position, the first fluid channel;
  a second restricting gate transmission element configured to:
    block, when the first piston is in the second blocking position, the second fluid channel; and
    unblock, when the first piston is in the first blocking position, the second fluid channel;
  a first controlling gate transmission element configured to interface with a first preload pressure, wherein the first preload pressure forces, when applied to the first controlling gate transmission element, the first piston towards the first blocking position; and
  a second controlling gate transmission element configured to interface with a pressure from the second input port, wherein the pressure from the second input port, when applied to the second controlling gate transmission element, forces the first piston towards the second blocking position; and the second piston comprises:
  a third restricting gate transmission element configured to:
    block, when the second piston is in a third blocking position, the first and second fluid channels; and
    unblock, when the second piston is in a fourth blocking position, the first and second fluid channels;
  a fourth restricting gate transmission element configured to:
    block, when the second piston is in the fourth blocking position, the third fluid channel; and
    unblock, when the second piston is in the third blocking position, the third fluid channel;
  a third controlling gate transmission element configured to interface with a second preload pressure, wherein the second preload pressure, when applied to the third controlling gate transmission element, forces the second piston towards the third blocking position; and
  a fourth controlling gate transmission element configured to interface with a pressure from the first input port, wherein the pressure from the first input port, when applied to the fourth controlling gate transmission element, forces the second piston towards the fourth blocking position.

13. The fluidic device of claim 1, wherein:

the plurality of input ports comprises a first input port and a second input port;

the fluidic device performs a NOR operation on a first input source connected to the first input port and a second input source connected to the second input port;

the plurality of inlet ports comprises:
  a first inlet port configured to connect to a low-pressure source; and
  a second inlet port configured to connect to a high-pressure source;

the plurality of fluid channels comprises:
  a first fluid channel configured to route fluid from the first inlet port to the one or more output ports;
  a second fluid channel configured to route fluid from the second inlet port to the one or more output ports; and
  a third fluid channel configured to route fluid from the low-pressure source to the one or more output ports;

the plurality of pistons comprises a first piston and a second piston;

the first piston comprises:
  a first restricting gate transmission element configured to:
    block, when the first piston is in a first blocking position, the first fluid channel; and
    unblock, when the first piston is in a second blocking position, the first fluid channel;
  a second restricting gate transmission element configured to:
    block, when the first piston is in the second blocking position, the second fluid channel; and
    unblock, when the first piston is in the first blocking position, the second fluid channel;
  a first controlling gate transmission element configured to interface with a first preload pressure, wherein the first preload pressure forces, when applied to the first controlling gate transmission element, the first piston towards the first blocking position; and
  a second controlling gate transmission element configured to interface with a pressure from the second input port, wherein the pressure from the second input port, when applied to the second controlling gate transmission element, forces the first piston towards the second blocking position; and the second piston comprises:
  a third restricting gate transmission element configured to:
    block, when the second piston is in a third blocking position, the third fluid channel; and
    unblock, when the second piston is in a fourth blocking position, the third fluid channel;
  a fourth restricting gate transmission element configured to:
    block, when the second piston is in the fourth blocking position, the first and second fluid channels; and
    unblock, when the second piston is in the third blocking position, the first and second fluid channels;
  a third controlling gate transmission element configured to interface with a second preload pressure, wherein the second preload pressure, when applied to the third controlling gate transmission element, forces the second piston towards the third blocking position; and
a fourth controlling gate transmission element configured to interface with a pressure from the first input port, wherein the pressure from the first input port, when applied to the fourth controlling gate transmission element, forces the second piston towards the fourth blocking position.

14. A fluidic logic-gate system comprising:
a plurality of inlet ports, a first input port and a second input port, and an output port;
a high-pressure source;
a low-pressure source;
a first input source connected to the first input port;
a second input source connected to the second input port;
a plurality of fluid channels each configured to route fluid from one of the plurality of inlet ports to the output port;
two pistons each comprising:
    opposing restricting gate transmission elements each configured to block a different one of the plurality of fluid channels;
    a first controlling gate transmission element configured to interface with a first control pressure that, when applied to the first controlling gate transmission element, forces the piston towards a first position; and
    a second controlling gate transmission element configured to interface with a second control pressure that, when applied to the second controlling gate transmission element, forces the piston towards a second position.

15. The fluidic logic-gate system of claim 14, wherein the two pistons, the high-pressure source, and the low-pressure source are configured to perform a NOR operation or an OR operation.

16. The fluidic logic-gate system of claim 14, wherein the two pistons, the high-pressure source, and the low-pressure source are configured to perform a NAND operation or an AND operation.

17. The fluidic logic-gate system of claim 14, wherein the two pistons, the high-pressure source, and the low-pressure source are configured to perform a material-implication operation.

18. The fluidic logic-gate system of claim 14, wherein the two pistons, the high-pressure source, and the low-pressure source are configured to perform a converse-implication operation.

19. A fluidic latch system comprising:
four inlet ports, a first input port and a second input port, and two output ports;
a high-pressure source;
a low-pressure source;
a first input source connected to the first input port;
a second input source connected to the second input port;
four fluid channels each configured to route fluid from one of the four inlet ports to one of the two output ports;
two normally open valves; and
two pistons each comprising:
    opposing restricting gate transmission elements each configured to block a different one of the four fluid channels;
    a first controlling gate transmission element configured to interface with a first control pressure that, when applied to the first controlling gate transmission element, forces the piston towards a first position; and
    a second controlling gate transmission element configured to interface with a second control pressure that, when applied to the second controlling gate transmission element, forces the piston towards a second position.

20. The fluidic latch system of claim 19, wherein:
the four inlet ports comprise a first inlet port, a second inlet port, a third inlet port, and a fourth inlet port;
the two output ports comprise a first output port and a second output port;
the four fluid channels comprise:
    a first fluid channel configured to route fluid from the first inlet port to the first output port;
    a second fluid channel configured to route fluid from the second inlet port to the first output port;
    a third fluid channel configured to route fluid from the third inlet port to the second output port; and
    a fourth fluid channel configured to route fluid from the fourth inlet port to the second output port;
the two normally open valves comprise a first normally open valve and a second normally open valve;
the fluidic latch system further comprises:
    a fifth fluid channel configured to route fluid from the first output port to the second normally open valve; and
    a sixth fluid channel configured to route fluid from the second output port to the first normally open valve;
the two pistons comprise:
    a first piston comprising:
        a first restricting gate transmission element configured to:
            block, when the first piston is in a first position, the first fluid channel; and
            unblock, when the piston is in a second position, the first fluid channel;
        a second restricting gate transmission element configured to:
            block, when the first piston is in the second position, the second fluid channel; and
            unblock, when the first piston is in the first position, the second fluid channel;
        a first controlling gate transmission element configured to interface with a first fluid pressure from the first input port, wherein the first fluid pressure, when applied to the first controlling gate transmission element, forces the first piston towards the first position; and
        a second controlling gate transmission element configured to interface with a preload pressure from the high-pressure source, wherein the preload pressure forces, when applied to the second controlling gate transmission element, the first piston towards the second position; and
    a second piston comprising:
        a third restricting gate transmission element configured to:
            block, when the second piston is in a third position, the third fluid channel; and
            unblock, when the second piston is in a fourth position, the third fluid channel;
        a fourth restricting gate transmission element configured to:
            block, when the second piston is in the fourth position, the fourth fluid channel; and unblock, when the second piston is in the third position, the fourth fluid channel;

a third controlling gate transmission element configured to interface with the preload pressure, wherein the preload pressure forces, when applied to the third controlling gate transmission element, the second piston towards the third position; and a fourth controlling gate transmission element configured to interface with a second fluid pressure from the second input port, wherein the second fluid pressure forces, when applied to the fourth controlling gate transmission element, the second piston towards the fourth position;

the first normally open valve comprises:

a fifth restricting gate transmission element configured to:

unblock, when the first normally open valve is in a fifth position, the first fluid channel; and block, when the first normally open valve is in a sixth position, the first fluid channel; and a fifth controlling gate transmission element configured to interface with a third fluid pressure from the sixth fluid channel, wherein the third fluid pressure forces, when applied to the fifth controlling gate transmission element, the first normally open valve towards the sixth position; and the second normally open valve comprises:

a sixth restricting gate transmission element configured to:

unblock, when the second normally open valve is in a seventh position, the fourth fluid channel; and block, when the second normally open valve is in an eighth position, the fourth fluid channel; and a sixth controlling gate transmission element configured to interface with a fourth fluid pressure from the fifth fluid channel, wherein the fourth fluid pressure forces, when applied to the sixth controlling gate transmission element, the second normally open valve towards the eighth position.

* * * * *